(12) United States Patent
Wang et al.

(10) Patent No.: US 12,640,093 B2
(45) Date of Patent: May 26, 2026

(54) DISPLAY PANEL AND DISPLAY DEVICE

(71) Applicant: BOE TECHNOLOGY GROUP CO., LTD., Beijing (CN)

(72) Inventors: Zhichong Wang, Beijing (CN); Jing Feng, Beijing (CN); Peng Liu, Beijing (CN); Chuanchuan Chang, Beijing (CN); Guangcai Yuan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 41 days.

(21) Appl. No.: 18/704,488

(22) PCT Filed: Nov. 22, 2022

(86) PCT No.: PCT/CN2022/133535
§ 371 (c)(1),
(2) Date: Apr. 25, 2024

(87) PCT Pub. No.: WO2024/108389
PCT Pub. Date: May 30, 2024

(65) Prior Publication Data
US 2025/0239220 A1 Jul. 24, 2025

(51) Int. Cl.
*G09G 3/3233* (2016.01)
*H10D 86/40* (2025.01)

(52) U.S. Cl.
CPC ......... *G09G 3/3233* (2013.01); *H10D 86/441* (2025.01); *G09G 2300/0426* (2013.01);
(Continued)

(58) Field of Classification Search
CPC ............................................ G09G 2300/0819
See application file for complete search history.

(56) References Cited

U.S. PATENT DOCUMENTS

10,879,330 B1 * 12/2020 Cui ...................... H10K 59/128
12,266,297 B1 * 4/2025 Zhong .................. G09G 3/3233
(Continued)

FOREIGN PATENT DOCUMENTS

CN 104036726 A 9/2014
CN 105405402 A 3/2016
(Continued)

OTHER PUBLICATIONS

International Search Report of PCT application No. PCT/CN2022/133535 dated Aug. 18, 2023.
(Continued)

*Primary Examiner* — Bipin Gyawali
(74) *Attorney, Agent, or Firm* — Calfee, Halter & Griswold LLP

(57) ABSTRACT

A display panel and a display device are disclosed. The display panel includes: a substrate and a plurality of driving units. The driving unit is located on one side of the substrate. The orthographic projections of multiple driving units on the substrate are distributed in an array along the row and column directions. The driving unit includes: n rows and m columns of pixel driving circuits and a compensation circuit, n and m are both positive integers greater than or equal to 1, and n+m is greater than or equal to 3; the compensation circuit is connected to the multiple pixel driving circuits in the same driving unit and configured to provide threshold compensation signals to the pixel driving circuits connected thereto.

19 Claims, 60 Drawing Sheets

(52) U.S. Cl.
CPC ............... *G09G 2300/0819* (2013.01); *G09G 2300/0842* (2013.01); *G09G 2300/0861* (2013.01); *G09G 2310/08* (2013.01); *H10D 86/481* (2025.01)

(56) References Cited

U.S. PATENT DOCUMENTS

| | | | | |
|---|---|---|---|---|
| 12,300,176 | B2* | 5/2025 | Kubota | ................. G09G 3/3233 |
| 2010/0103156 | A1 | 4/2010 | Yamashita et al. | |
| 2016/0253953 | A1* | 9/2016 | Yang | .................... G09G 3/2074 |
| | | | | 345/214 |
| 2019/0325823 | A1* | 10/2019 | Yang | .................... G09G 3/3233 |
| 2020/0410926 | A1* | 12/2020 | Li | ........................... G09G 3/325 |
| 2023/0186845 | A1* | 6/2023 | Liu | .................... H10K 59/1213 |
| | | | | 345/76 |
| 2023/0267885 | A1* | 8/2023 | Cho | ...................... H10H 20/821 |
| | | | | 345/214 |
| 2024/0161685 | A1* | 5/2024 | Park | ...................... H10K 59/131 |
| 2025/0069550 | A1* | 2/2025 | Xiong | ................ H10K 59/1213 |
| 2025/0118261 | A1* | 4/2025 | Kawachi | .............. G09G 3/3233 |

FOREIGN PATENT DOCUMENTS

| | | |
|---|---|---|
| CN | 113516947 A | 10/2021 |
| JP | 2008508547 A | 3/2008 |
| KR | 20150002195 A | 1/2015 |

OTHER PUBLICATIONS

Written Opinion of PCT application No. PCT/CN2022/133535 dated Aug. 18, 2023.

* cited by examiner

DISPLAY PANEL AND DISPLAY DEVICE

CROSS REFERENCE TO RELATED APPLICATION

The present application is a U.S. National Stage of International Application No. PCT/CN2022/133535, filed on Nov. 22, 2022, the content of which is incorporated by reference herein in its entirety.

TECHNICAL FIELD

The present disclosure relates to the field of display technology, and in particular, to a display panel and a display device.

BACKGROUND

In the related art, in an externally compensated pixel driving circuit, since the pixel driving circuit includes a compensation circuit, the structure of the pixel driving circuit is relatively complex, making it difficult to achieve a high pixel density setting for the display panel.

It should be noted that the information disclosed in the above background section is only used to enhance understanding of the background of the present disclosure, and therefore may include information that does not constitute prior art known to those of ordinary skill in the art.

SUMMARY

According to an aspect of the present disclosure, there is provided a display panel, including: a substrate; and a plurality of driving units. The plurality of driving units are located on one side of the substrate. Orthographic projections of the plurality of driving units on the substrate are arrayed along row and column directions. The driving unit includes: n rows and m columns of pixel driving circuits and a compensation circuit, n and m are both positive integers greater than or equal to 1, and n+m is greater than or equal to 3. The compensation circuit is connected to a plurality of pixel driving circuits located in a same driving unit, and the compensation circuit is configured to provide threshold compensation signals to the pixel driving circuits connected to the compensation circuit.

In an exemplary embodiment of the present disclosure, the driving unit includes a first driving sub-unit and a second driving sub-unit, and an orthographic projection of the first driving sub-unit on the substrate and an orthographic projection of the second driving sub-unit on the substrate are spaced apart in the column direction; the first driving sub-unit includes n1 rows and m columns of pixel driving circuits, and the second driving sub-unit includes n2 rows and m columns of pixel driving circuits, wherein n1 and n2 are positive integers greater than or equal to 1, and n1+n2=n; and an orthographic projection of at least part of a structure of the compensation circuit on the substrate is located between the orthographic projection of the first driving sub-unit on the substrate and the orthographic projection of the second driving sub-unit on the substrate.

In an exemplary embodiment of the present disclosure, n1 is equal to n2.

In an exemplary embodiment of the present disclosure, the pixel driving circuit includes: a driving circuit, a data writing circuit and a first storage circuit. The driving circuit includes a first input terminal, a first output terminal, and a first control terminal, and configured to use the first input terminal to provide a driving current to the first output terminal according to a voltage of the first control terminal. The data writing circuit is connected to the first control terminal, a data line, and a gate line, and configured to transmit a signal on the data line to the first control terminal in response to a signal of the gate line. The first storage circuit is connected between the first control terminal and a first node, and configured to store a voltage difference between the first control terminal and the first node. The compensation circuit includes: an analog circuit, a compensation control circuit and a first reset circuit. The analog circuit has a same or substantially same threshold voltage as the driving circuit. The analog circuit includes a second input terminal, a second output terminal, and a second control terminal, and the analog circuit is configured to use the second input terminal to provide a driving current to the second output terminal according to a voltage of the second control terminal. The second input terminal is connected to a power line, and the second output terminal is connected to the second control terminal. The compensation control circuit is connected to the first node, the second output terminal, and an enable signal line, and configured to connect the first node and the second output terminal in response to a signal of the enable signal line. The first reset circuit is connected to the first node, a reference signal line, and a reset signal line, and configured to transmit a signal of the reference signal line to the first node in response to a signal of the reset signal line.

In an exemplary embodiment of the present disclosure, when the driving unit includes a first driving sub-unit and a second driving sub-unit; orthographic projections of the analog circuit, the compensation control circuit, and the first reset circuit on the substrate are located between an orthographic projection of the first driving sub-unit on the substrate and an orthographic projection of the second driving sub-unit on the substrate.

In an exemplary embodiment of the present disclosure, an orthographic projection of the enable signal line on the substrate, an orthographic projection of the reference signal line on the substrate, an orthographic projection of the reset signal line on the substrate and an orthographic projection of the power line on the substrate all extend along the row direction and are located between the orthographic projection of the first driving sub-unit on the substrate and the orthographic projection of the second driving sub-unit on the substrate.

In an exemplary embodiment of the present disclosure, the compensation circuit further includes: a second storage circuit connected between the power line and the first node, and configured to store a voltage difference between the power line and the first node.

In an exemplary embodiment of the present disclosure, the display panel further includes: a light-emitting control circuit, and a second reset circuit. The light-emitting control circuit is connected to the power line, the first input terminal, and the enable signal line, and configured to transmit a signal of the power line to the first input terminal in response to a signal of the enable signal line. The second reset circuit is connected to the first input terminal, an initial signal line, and the reset signal line, and configured to transmit a signal of the initial signal line to the first input terminal in response to the signal of the reset signal line.

In an exemplary embodiment of the present disclosure, the light-emitting control circuit and the second reset circuit form an auxiliary driving circuit, and pixel driving circuits located in a same row share one or more sets of the auxiliary driving circuits.

In an exemplary embodiment of the present disclosure, the pixel driving circuits located in the same row share two sets of the auxiliary driving circuits, and the pixel driving circuits located in the same row form a row of pixel driving circuits, and orthographic projections of the two sets of the auxiliary driving circuits on the substrate are respectively located on both sides of an orthographic projection of the row of the pixel driving circuits on the substrate in the row direction, wherein the row of the pixel driving circuits are connected to the two sets of the auxiliary driving circuits.

In an exemplary embodiment of the present disclosure, the driving circuit includes: a driving transistor including a first electrode forming the first input terminal, a second electrode forming the first output terminal, and a gate electrode forming the first control terminal. The data writing circuit includes: a first transistor including a first electrode connected to the data line, a second electrode connected to the first control terminal, and a gate electrode connected to the gate line. The first storage circuit includes: a first capacitor including a first electrode connected to the first control terminal, and a second electrode connected to the first node. The analog circuit includes: an analog transistor, where the analog transistor and the driving transistor have a same or substantially same threshold voltage, a first electrode of the analog transistor forms the second input terminal, a second electrode forms the second output terminal, and a gate electrode forms the second control terminal. The compensation control circuit includes: a second transistor including a first electrode connected to the second output terminal, a second electrode connected to the first node, and a gate electrode connected to the enable signal line. The first reset circuit includes: a third transistor including a first electrode connected to the reference signal line, a second electrode connected to the first node, and a gate electrode connected to the reset signal line. The light-emitting control circuit includes: a fourth transistor including a first electrode connected to the power line, a second electrode connected to the first input terminal, and a gate electrode connected to the enable signal line. The second reset circuit includes: a fifth transistor including a first electrode connected to the initial signal line, a second electrode connected to the first input terminal, and a gate electrode connected to the reset signal line.

In an exemplary embodiment of the present disclosure, the second storage capacitor includes: a second capacitor including a first electrode connected to the power line, and a second electrode connected to the first node.

In an exemplary embodiment of the present disclosure, the driving circuit includes: a driving transistor including a first electrode forming the first input terminal, a second electrode forming the first output terminal, and a gate electrode forming the first control terminal. The light-emitting control circuit includes: a fourth transistor including a first electrode connected to the power line, a second electrode connected to the first input terminal, and a gate electrode connected to the enable signal line. The second reset circuit includes: a fifth transistor including a first electrode connected to the initial signal line, a second electrode connected to the first input terminal, and a gate electrode connected to the reset signal line. The display panel further includes: an active layer located on one side of the substrate, where the active layer includes a fourth active part, a fifth active part, a sixth active part, and an active line. The fourth active part is configured to form a channel region of the fourth transistor, the fifth active part is configured to form a channel region of the fifth transistor, and the sixth active part is configured to form a channel region of the driving transistor. An orthographic projection of the active line on the substrate extends along the row direction, the active line is connected to the first electrode of the driving transistor, sixth active parts located in a same row of the pixel driving circuits are connected to a same active line, and the fifth active part and the sixth active part are connected to a same terminal of the active line in the row direction.

In an exemplary embodiment of the present disclosure, the driving unit includes a first driving sub-unit, and an orthographic projection of the first driving sub-unit on the substrate is located on one side of an orthographic projection of the auxiliary driving circuit on the substrate in the column direction, the first driving sub-unit includes adjacent two rows and m columns of pixel driving circuits; and in a same row of the first driving sub-units, the sixth active parts in the driving circuit are connected to the same active line.

In an exemplary embodiment of the present disclosure, the driving circuit includes: a driving transistor including a first electrode forming the first input terminal, a second electrode forming the first output terminal, and a gate electrode forming the first control terminal. The first storage circuit includes: a first capacitor including a first electrode connected to the first control terminal, and a second electrode connected to the first node. The display panel further includes: a first conductive layer and a second conductive layer. The first conductive layer is located on one side of the substrate, the first conductive layer includes a sixth gate part, and at least part of a structure of the sixth gate part is configured to form the gate electrode of the driving transistor and the first electrode of the first capacitor. The second conductive layer is located on one side of the first conductive layer facing away from the substrate, the second conductive layer includes a first conductive part, an orthographic projection of the first conductive part on the substrate at least partially overlaps with an orthographic projection of the sixth gate part on the substrate, and the first conductive part is configured to form the second electrode of the first capacitor, where m is a positive integer greater than or equal to 2, and in the same driving unit, the first conductive parts in a same row of the pixel driving circuits are connected.

In an exemplary embodiment of the present disclosure, the compensation control circuit includes: a second transistor including a first electrode connected to the second output terminal, a second electrode connected to the first node, and a gate electrode connected to the enable signal line. The first reset circuit includes: a third transistor including a first electrode connected to the reference signal line, a second electrode connected to the first node, and a gate electrode connected to the reset signal line. The driving unit includes a first driving sub-unit and a second driving sub-unit, an orthographic projection of the first driving sub-unit on the substrate and an orthographic projection of the second driving sub-unit on the substrate are distributed in the column direction. The first driving sub-unit includes n1 rows and m columns of pixel driving circuits, and the second driving sub-unit includes n2 rows and m columns of pixel driving circuits, where n1 and n2 are positive integers greater than or equal to 1, and n1+n2=n; and orthographic projections of the analog circuit, the compensation control circuit, and the first reset circuit on the substrate are located between the orthographic projection of the first driving sub-unit on the substrate and the orthographic projection of the second driving sub-unit on the substrate. The display panel further includes: a first bridge part and a second bridge part. An orthographic projection of the first bridge part on the substrate extends along the column direction, the first bridge part is connected to the second electrode of the second transistor, and the connection is respectively located on the first conductive part in the second driving sub-unit and the first driving sub-unit. An orthographic projection of the second bridge part on the substrate extends along the column direction, the second bridge part is connected to the second electrode of the third transistor, and the connection is respectively located on the first conductive part in the second driving sub-unit and the first driving sub-unit. The first bridge part and the second bridge part are connected to different first conductive parts.

In an exemplary embodiment of the present disclosure, orthographic projections of the analog circuit, the compensation control circuit, and the first reset circuit on the substrate are located between an orthographic projection of the first bridge part on the substrate and an orthographic projection of the second bridge part on the substrate.

In an exemplary embodiment of the present disclosure, the display panel further includes: a fourth conductive layer and a fifth conductive layer. The fourth conductive layer is located on one side of the second conductive layer facing away from the substrate, the fourth conductive layer includes a second shielding line, the second shielding line is connected to a stable power terminal, an orthographic projection of the second shielding line on the substrate extends along the column direction, and the second shielding line includes a first extending part. The fifth conductive layer is located on one side of the fourth conductive layer facing away from the substrate, and includes the data line; where an overlapping part of an orthographic projection of the sixth gate part on the substrate and an orthographic projection of the data line on the substrate at least partially overlaps with an orthographic projection of the first extending part on the substrate, and/or an overlapping part of the orthographic projection of the first conductive part on the substrate and the orthographic projection of the data line on the substrate at least partially overlaps with the orthographic projection of the first extending part on the substrate.

In an exemplary embodiment of the present disclosure, the second shielding line further includes a second extending part, and an orthographic projection of the second extending part on the substrate is located between orthographic projections of adjacent two data lines on the substrate.

In an exemplary embodiment of the present disclosure, the compensation circuit further includes a second capacitor, a first electrode of the second capacitor is connected to the power line, and a second electrode of the second capacitor is connected to the first node. The display panel further includes: a third conductive layer and a fourth conductive layer. The third conductive layer is located on one side of the second conductive layer facing away from the substrate, and includes the first bridge part and the second bridge part. The fourth conductive layer is located on one side of the third conductive layer facing away from the substrate, and includes a plurality of second shielding lines, where the second shielding line is connected to the power line, and the second shielding line includes a second extending part. An orthographic projection of the first bridge part on the substrate overlaps with an orthographic projection of one second extending part on the substrate, and an orthographic projection of the second bridge part on the substrate overlaps with an orthographic projection of another second extending part on the substrate. The first bridge part and the second bridge part are configured to form the second electrode of the second capacitor, and the second extending part is configured to form the first electrode of the second capacitor.

In an exemplary embodiment of the present disclosure, the display panel further includes: a third conductive layer and a fifth conductive layer. The third conductive layer is located on one side of the second conductive layer facing away from the substrate, the third conductive layer includes a power connection line segment, the power connection line segment is connected to the power line, and an orthographic projection of the power connection line segment on the substrate extends along the column direction. The fifth conductive layer is located on one side of the third conductive layer facing away from the substrate, and includes the data line. An overlapping part of an orthographic projection of the sixth gate part on the substrate and an orthographic projection of the data line on the substrate at least partially overlaps with an orthographic projection of the power connection line segment on the substrate, and/or an overlapping part of the orthographic projection of the first conductive part on the substrate and the orthographic projection of the data line on the substrate at least partially overlaps with the orthographic projection of the power connection line segment on the substrate.

In an exemplary embodiment of the present disclosure, the orthographic projection of the power connection line segment on the substrate is located between an orthographic projection of an adjacent reset signal line in an adjacent driving unit in the column direction and an orthographic projection of the enable signal line on the substrate.

In an exemplary embodiment of the present disclosure, the power connection line segments adjacent in the column direction are connected to form a power connection line.

In an exemplary embodiment of the present disclosure, the display panel further includes a light-emitting unit, the pixel driving circuit is configured to drive the light-emitting unit to emit light, and the display panel further includes: a fifth conductive layer, an electrode layer, and a pixel definition layer. The fifth conductive layer is located on one side of the substrate, and includes the data line. The electrode layer is located on one side of the fifth conductive layer facing away from the substrate, and includes a plurality of electrode parts, where the electrode part is configured to form a first electrode of the light-emitting unit. A plurality of pixel openings are formed on the pixel definition layer, where the pixel openings are configured to form the light-emitting unit, an orthographic projection of the pixel opening on the substrate coincides with an orthographic projection of a corresponding electrode part on the substrate. The orthographic projection of the electrode part on the substrate is located between orthographic projections of adjacent data lines on the substrate.

In an exemplary embodiment of the present disclosure, the display panel further includes: a first conductive line, where an orthographic projection of the first conductive line on the substrate extends along the row direction, and the first conductive line connects to the active line through a plurality of via holes distributed in the row direction.

In an exemplary embodiment of the present disclosure, the compensation circuit further includes: a second capacitor including a first electrode connected to the power line, and a second electrode connected to the first node. The display panel further includes: a third conductive layer and a fourth conductive layer. The third conductive layer is located on one side of the second conductive layer facing away from the substrate, and includes a seventh conductive part, the seventh conductive part is connected to the first conductive part, and the seventh conductive part is configured to form the second electrode of the second capacitor. The fourth conductive layer is located on one side of the third conductive layer facing away from the substrate, and includes a second shielding line, the second shielding line is connected to the power line, an orthographic projection of the second shielding line on the substrate at least partially overlaps with an orthographic projection of the seventh conductive part on the substrate, and part of a structure of the second shielding line is configured to form the first electrode of the second capacitor.

According to an aspect of the present disclosure, there is provided a display device, including the display panel described above.

It should be understood that the above general description and the detailed descriptions that follow are merely exemplary and explanatory and do not limit the present disclosure.

BRIEF DESCRIPTION OF THE DRAWINGS

The accompanying drawings, which are incorporated in and constitute a part of this specification, illustrate embodiments consistent with the disclosure and together with the description, serve to explain the principles of the disclosure. Obviously, the drawings in the following description are only some embodiments of the present disclosure. For those of ordinary skill in the art, other drawings can be obtained based on these drawings without exerting creative efforts.

DETAILED DESCRIPTION

Figure 1:
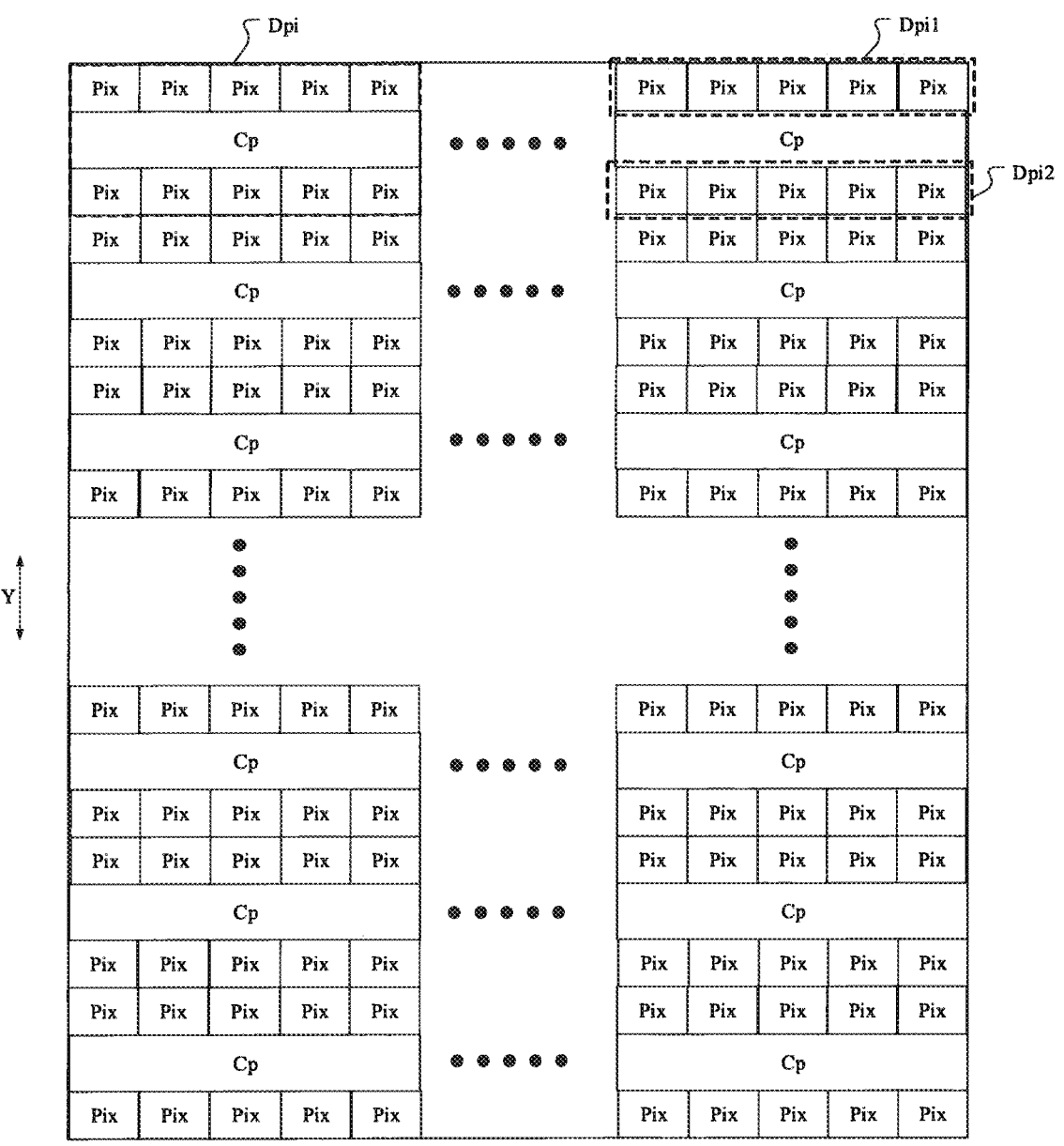
FIG. 1 is a schematic structural diagram of an exemplary embodiment of a display panel of the present disclosure.

Example embodiments will now be described more fully with reference to the accompanying drawings. Example embodiments may, however, be embodied in various forms and should not be construed as limited to the examples set forth herein; rather, these embodiments are provided so that this disclosure will be thorough and complete and will fully convey the concepts of the example embodiments to those skilled in the art. The same reference numerals in the drawings indicate the same or similar structures, and thus their detailed descriptions will be omitted.

The terms "a", "an" and "the" are used to indicate the existence of one or more elements/components/etc.; the terms "include" and "have" are used to indicate an open-ended inclusive meaning and refer to that there may be additional elements/components/etc. in addition to those listed.

In the related art, a display panel includes a pixel driving circuit and a light-emitting unit. The pixel driving circuit includes a driving transistor. The driving transistor outputs, according to its gate voltage, a driving current to the light-emitting unit. The driving current output by the driving transistor is $I=(\mu WCox/2\ L)(Vgs-Vth)^2$, where $\mu$ is the carrier mobility; Cox is the gate capacitance per unit area, W is the width of the driving transistor channel, L is the length of the driving transistor channel, and Vgs is the gate-source voltage difference of the driving transistor, Vth is the threshold voltage of the driving transistor. The magnitude of the driving current output by the driving transistor is related to the threshold voltage of the driving transistor. However, in the related art, due to process errors and other reasons, the threshold voltages of different driving transistors on the display panel are different, resulting in uneven display of the display panel. In the related art, the threshold voltage of the driving transistor can be compensated through external compensation, so that the magnitude of the driving current output by the driving transistor is not related to the threshold voltage of the driving transistor. In the related art, a display panel usually has a compensation circuit in a pixel driving circuit, and a threshold compensation signal is input to the gate of the driving transistor through the compensation circuit, so that the driving current output by the driving transistor is not related to its threshold voltage. However, since the pixel driving circuit includes a compensation circuit, the layout space of the pixel driving circuit is large, making it difficult to achieve high-density pixel arrangement on the display panel.

In view of this, the exemplary embodiment provides a display panel, as shown in FIG. 1, which is a schematic structural diagram according to an exemplary embodiment of the display panel of the present disclosure. The display panel may include a substrate and a plurality of driving units Dpi. The orthographic projections of the plurality of driving units Dpi on the substrate are distributed in an array along the row direction X and the column direction Y. The driving unit Dpi may include: 2 rows and 5 Columns of pixel driving circuits Pix and a compensation circuit Cp. The compensation circuit Cp can be connected to each pixel driving circuit Pix located in the same driving unit, and the compensation circuit Cp is configured to provide a threshold compensation signal to the pixel driving circuit Pix connected thereto.

The display panel provided by the exemplary embodiment can provide threshold compensation signals to a plurality of pixel driving circuits Pix through the compensation circuit Cp, so that the driving current output by the driving transistor in the pixel driving circuit is not related to its threshold voltage. This setup can improve the integration of pixel driving circuits, allowing the design of high-pixel-density display panel to be utilized.

As shown in FIG. 1, the driving unit Dpi may include a first driving sub-unit Dpi1 and a second driving sub-unit Dpi2. The orthographic projection of the first driving sub-unit Dpi1 on the substrate and the orthographic projection of the driving sub-units Dpi2 on the substrate are spaced apart in the column direction Y. The first driving sub-unit Dpi1 may include 1 row and 5 columns of pixel driving circuits, and the second driving sub-unit Dpi2 may include 1 row and 5 columns of pixel driving circuits. The orthographic projection of at least part of the structure of the compensation circuit Cp on the substrate may be located between the orthographic projection of the first driving sub-unit Dpi1 on the substrate and the orthographic projection of the second driving sub-unit Dpi2 on the substrate. This arrangement can facilitate the connection of the compensation circuit Cp with a pixel driving circuit, where the compensation circuit Cp and the pixel driving circuit are located in the same driving unit.

It should be understood that in other exemplary embodiments, the driving unit Dpi may also include pixel driving circuits with other numbers of rows and columns. For example, the driving unit Dpi may include: n rows and m columns of pixel driving circuits Pix, where n and m are both positive integers greater than or equal to 1, and n+m is greater than or equal to 3. That is, the driving unit Dpi may include multiple rows and multiple columns of pixel driving circuits, or the driving unit Dpi may include one row and multiple columns of pixel driving circuits, or the driving unit Dpi may include multiple rows and one column of pixel driving circuits. In other exemplary embodiments, the first driving sub-unit and the second driving sub-unit may also include pixel driving circuits with other numbers of rows and columns. The first driving sub-unit may include n1 rows and m columns of pixel driving circuits, and the second driving sub-unit may include n2 rows and m columns of pixel driving circuits, where n1 and n2 are positive integers greater than or equal to 1, and n1+n2=n, and n1 may be equal to n2, or n1 may not be equal to n2.

Figure 2:
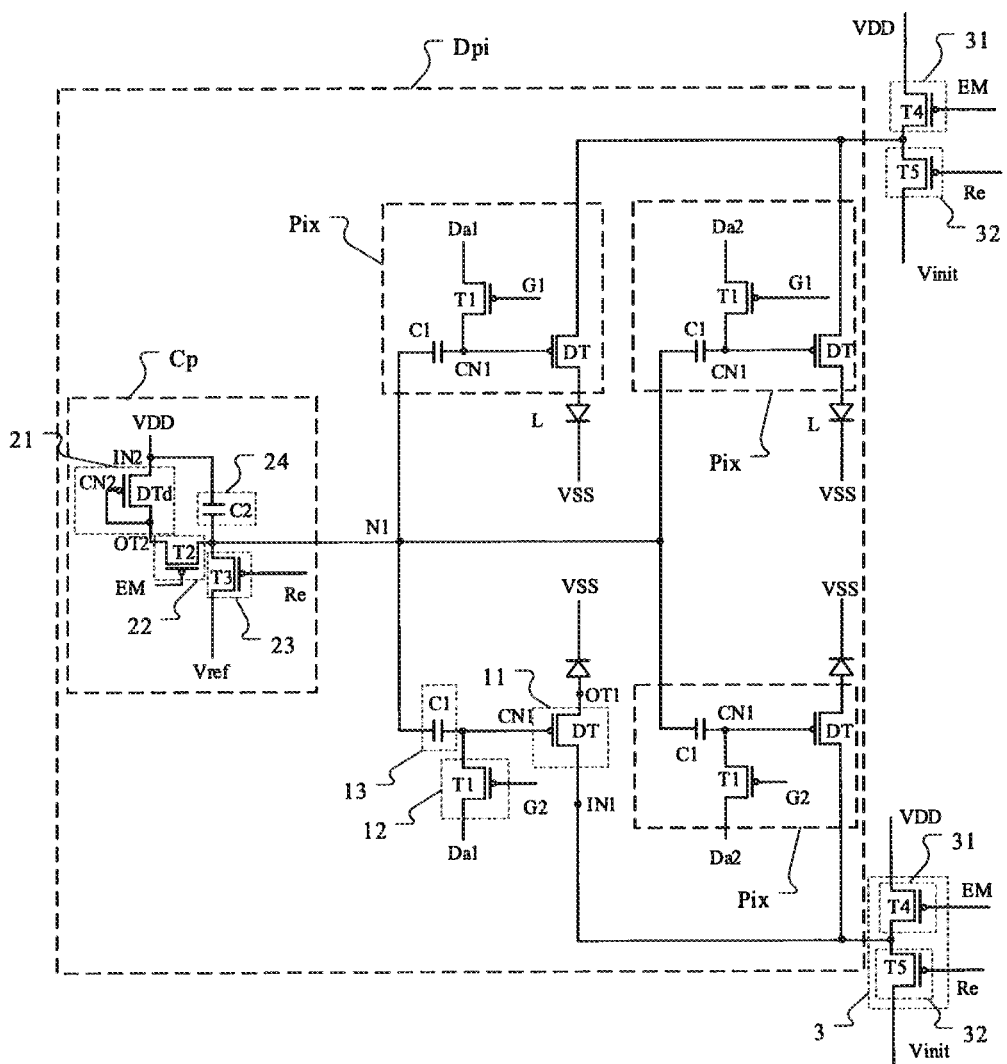
FIG. 2 is an equivalent circuit diagram of a driving unit in an exemplary embodiment of the display panel of the present disclosure.

As shown in FIG. 2, it is an equivalent circuit diagram of a driving unit in an exemplary embodiment of the display panel of the present disclosure. As shown in FIG. 2, the exemplary embodiment is explained by taking the driving unit Dpi including two rows and two columns of pixel driving circuits Pix as an example.

In the exemplary embodiment, the pixel driving circuit Pix may include: a driving circuit 11, a data writing circuit 12, and a first storage circuit 13. The driving circuit 11 includes a first control terminal CN1, a first input terminal IN1, and a first output terminal OT1. The driving circuit 11 is configured to provide a driving current to the first output terminal OT1 by the first input terminal IN1 according to the voltage of the first control terminal CN1. The data writing circuit 12 is connected to the first control terminal CN1, the data signal terminal Da1/Da2, and the gate driving signal terminal G1/G2 for transmitting a signal on the data signal terminal Da1/Da2 to the first control terminal CN1 in response to a signal of the gate driving signal terminal G1/G2. The first storage circuit 13 is connected between the first control terminal CN1 and the first node N1, and is configured to store the voltage difference between the first control terminal CN1 and the first node N1. The compensation circuit Cp may include: an analog circuit 21, a compensation control circuit 22, a first reset circuit 23, and a second storage circuit 24. The analog circuit 21 has the same or substantially same threshold voltage as the driving circuit 11. The analog circuit 21 includes a second control terminal CN2, a second input terminal IN2, and a second output terminal OT2. The analog circuit 21 is configured to input the driving current to the second output terminal OT2 by the second input terminal IN2 according to a signal of the second control terminal CN2. The second input terminal IN2 is connected to the first power terminal VDD. The second output terminal OT2 is connected to the second control terminal CN2. The compensation control circuit 22 is connected to the first node N1, the second output terminal OT2, and the enable signal terminal EM for connecting the first node N1 and the second output terminal OT2 in response to a signal of the enable signal terminal EM. The first reset circuit 23 is connected to the first node N1, the reference signal line Vref, and the reset signal terminal Re, for transmitting the signal of the reference signal line Vref to the first node N1 in response to the signal of the reset signal terminal Re. The second storage circuit 24 is connected between the first power terminal VDD and the first node N1, and is configured to store the voltage between the first power terminal VDD and the first node N1.

In the exemplary embodiment, the orthographic projections of the analog circuit 21, the compensation control circuit 22, and the first reset circuit 23 on the substrate may be located between the orthographic projection of the first driving sub-unit on the substrate and the orthographic projection of the second driving sub-unit on the substrate.

As shown in FIG. 2, the display panel may further include a light-emitting control circuit 31 and a second reset circuit 32. The light-emitting control circuit 31 is connected to the first power terminal VDD, the first input terminal IN1 and the enable signal terminal EM, and is configured to transmit the signal of the first power terminal VDD to the first input terminal IN1 in response to the signal of the enable signal terminal EM. The second reset circuit 32 is connected to the first input terminal IN1, the initial signal terminal Vinit, and the reset signal terminal Re, and is configured to transmit the signal of the initial signal terminal Vinit to the first input terminal IN1 in response to the signal of the reset signal terminal Re. As shown in FIG. 2, the light-emitting control circuit 31 and the second reset circuit 32 may form an auxiliary driving circuit 3, and the pixel driving circuits Pix located in the same row may share a set of auxiliary driving circuit 3.

As shown in FIG. 2, the driving circuit includes a driving transistor DT. A first electrode of the driving transistor DT forms the first input terminal IN1, a second electrode forms the first output terminal OT1, and a gate electrode forms the first control terminal CN1. The data writing circuit 12 may include a first transistor T1. A first electrode of the first transistor T1 is connected to the data signal terminal Da1/Da2, a second electrode is connected to the first control terminal CN1, and a gate electrode is connected to the gate driving signal terminal G1/G2. The first storage circuit 13 may include a first capacitor C1. A first electrode of the first capacitor C1 is connected to the first control terminal CN1, and a second electrode of the first capacitor C1 is connected to the first node N1. The analog circuit 21 may include an analog transistor DTd. The analog transistor DTd and the driving transistor DT have the same or substantially the same threshold voltage. A first electrode of the analog transistor DTd forms the first power terminal VDD, a second electrode forms the second output terminal OT2, and the gate electrode forms the second output terminal OT2. The compensation control circuit 22 may include a second transistor T2. A first electrode of the second transistor T2 is connected to the second output terminal OT2, a second electrode is connected to the first node N1, and a gate electrode is connected to the enable signal terminal EM. The first reset circuit 23 may include a third transistor T3. A first electrode of the third transistor T3 is connected to the reference signal line Vref, a second electrode is connected to the first node N1, and a gate electrode is connected to the reset signal terminal Re. The light-emitting control circuit 31 may include a fourth transistor T4. A first electrode of the fourth transistor T4 is connected to the first power terminal VDD, a second electrode is connected to the first input terminal IN1, and a gate electrode is connected to the enable signal terminal EM. The second reset circuit 32 may include a fifth transistor T5. A first electrode of the fifth transistor T5 is connected to the initial signal terminal Vinit, a second electrode is connected to the first input terminal IN1, and a gate electrode is connected to the reset signal terminal Re.

In the exemplary embodiment, the threshold voltage of the analog transistor DTd may be Vth. The difference between the threshold voltage of the analog transistor DTd and the threshold voltage of the driving transistor DT may be Vth1. The analog transistor DTd and the driving transistor DT having substantially same threshold voltage can be understood as the absolute value of Vth1/Vth is less than or equal to 20%. For example, the absolute value of Vth1/Vth can be 1%, 2%, 3%, 5%, 10%, 20%, etc.

In the exemplary embodiment, the way to achieve the same threshold voltage of the analog transistor DTd and the driving transistor DT may be: the analog transistor DTd and the driving transistor DT have the same channel size, the same channel aspect ratio, and the same channel material. In the exemplary embodiment, the channel shapes of the analog transistor DTd and the driving transistor DT may also be the same. A way to achieve the substantially same threshold voltages of the analog transistor DTd and the driving transistor DT may be: the analog transistor DTd and the driving transistor DT have substantially the same channel size and channel material with substantially the same carrier mobility.

In the exemplary embodiment, the display panel may further include a light-emitting unit L. The first output terminal OT1 may be connected to the first electrode of the light-emitting unit L, and the second electrode of the light-emitting unit L may be connected to the second power terminal VSS. The first power terminal VDD can be configured to output a high-level power signal, and the power terminal VSS can be configured to output a low-level power signal.

It should be noted that the pixel driving circuits in the same row are provided with a corresponding gate line, and the gate driving signal terminals in the pixel driving circuits located in the same row are provided by the same gate line; the pixel driving circuits in the same column are provided with a corresponding data line, the data signal terminals in the pixel driving circuits located in the same column are provided by the same data line. For example, in FIG. 2, the gate driving signal terminals G1 in the first row of the pixel driving circuits are connected to the same gate line, the gate driving signal terminals G2 in the second row of the pixel driving circuits are connected to the same gate line, the data signal terminals Da1 in the first column of the pixel driving circuits are connected to the same data line, and the data signal terminals Da2 in the second column of the pixel driving circuits are connected to the same data line.

In the exemplary embodiment, the first transistor T1, the second transistor T2, the third transistor T3, the fourth transistor T4, the fifth transistor T5, the driving transistor DT, and the analog transistor DTd may all be P-type transistors. It should be understood that in other exemplary embodiments, the first transistor T1, the second transistor T2, the third transistor T3, the fourth transistor T4, and the fifth transistor T5 may also be N-type transistors.

Figure 3:
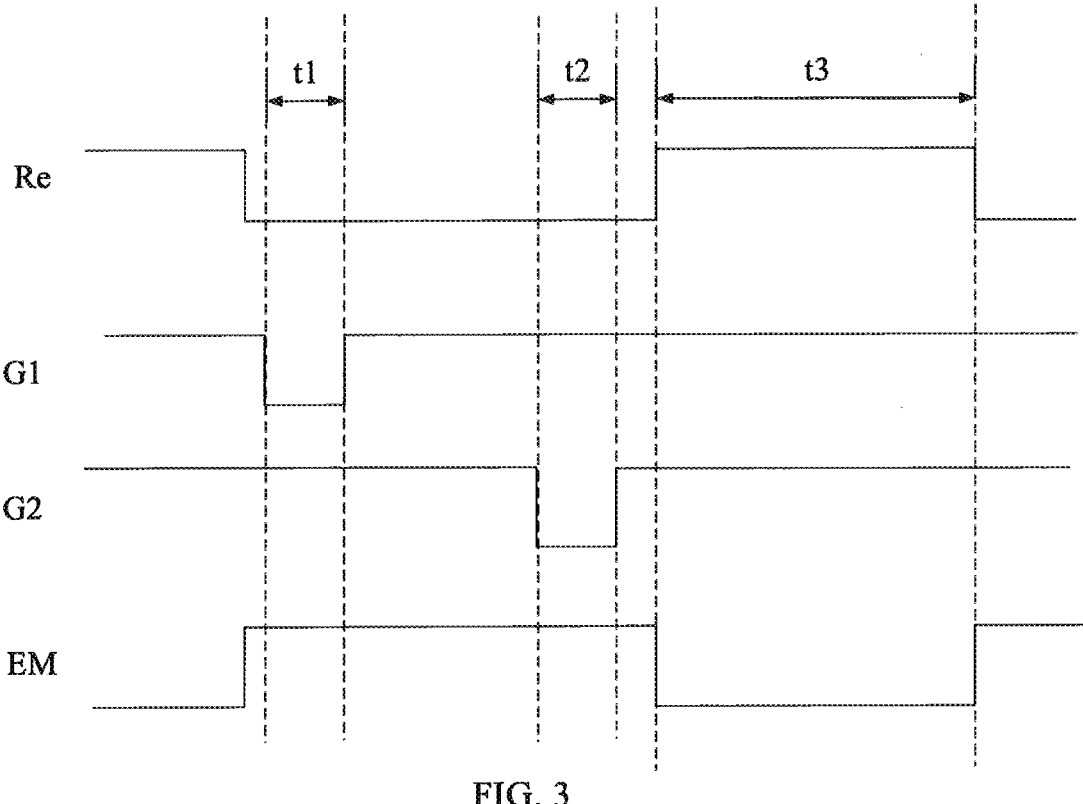
FIG. 3 is a timing diagram of each signal line in a driving method of the display panel shown in FIG. 2.

As shown in FIG. 3, it is a timing diagram of each signal line in a driving method of the display panel shown in FIG. 2. G1 represents the timing diagram of the gate driving signal terminal G1, G2 represents the timing diagram of the gate driving signal terminal G2, EM represents the timing diagram of the enable signal terminal, and Re represents the timing diagram of the reset signal terminal.

The driving method of the driving unit in the display panel may include: a first data writing stage t1, a second data writing stage t2, and a light emitting stage t3. In the first data writing stage t1: the reset signal terminal Re outputs a low level; the fifth transistor T5 and the third transistor T3 are turned on; the initial signal terminal Vinit inputs an initial signal to the first input terminals IN1 of the respective driving transistors DT in the same driving unit; the reference signal terminal Vref inputs a reference signal to the first node N1, and meanwhile, the gate driving signal terminal G1 outputs a low level; the first transistors T1 in the first row of pixel driving circuits are turned on; the data signal line inputs a data signal to the first control terminals CN1 in the first row of pixel driving circuits, and meanwhile, the first power terminal VDD inputs the voltage Vdd+Vth to the second output terminal OT2, where Vdd is the voltage of the first power terminal VDD and Vth is the threshold voltage of the analog transistor DTd. In the second data writing stage t2: the reset signal terminal Re outputs a low level, the fifth transistor T5 and the third transistor T3 are turned on; the initial signal terminal Vinit inputs an initial signal to the first input terminal IN1 of the respective driving transistors DT in the same driving unit; the reference signal terminal Vref inputs a reference signal to the first node N1, and meanwhile, the gate driving signal terminal G2 outputs a low level; the first transistors T1 in the second row of pixel driving circuits are turned on; the data signal line inputs a data signal to the first control terminal CN1 in the second row of pixel driving circuit; further, the first power terminal VDD continuously inputs the voltage Vdd+Vth to the second output terminal OT2. In the light-emitting stage t3: the enable signal terminal EM outputs a low-level enable signal; the second transistor T2 and the fourth transistor T4 are turned on; the voltage of the first node N1 changes from Vref to Vdd+Vth; under the coupling effect of the first capacitor C1, the voltage of the first control terminal CN1 changes from Vdata to Vdd+Vth−Vref+Vdata. Vref is the voltage of the reference signal, and Vdata is the voltage of the data signal. Therefore, the driving current output by the driving transistor DT $I=(\mu WCox/2\ L)(Vgs-Vth)^2=I=(\mu WCox/2\ L)(Vdata-Vref)^2$. According to the driving current formula, it can be seen that: the driving current output by the pixel driving circuit in the display panel is not related to the threshold voltage of the driving transistor. In addition, the driving current output by the pixel driving circuit in the display panel is not related to the voltage of the first power terminal. That is, the display panel can solve the uneven display caused by the voltage drop of the signal on the first power terminal.

In the exemplary embodiment, the second storage circuit 24 may be configured to stabilize the voltage of the first node N1. It should be understood that in other exemplary embodiments, the second storage circuit 24 may not be provided in the compensation circuit Cp. In addition, in other exemplary embodiments, the light-emitting control circuit 31 and the second reset circuit 32 can also be integrated with the pixel driving circuit. That is, each pixel driving circuit can include a set of the light-emitting control circuit 31 and the second reset circuit 32.

In the exemplary embodiment, the display panel may include a substrate, an active layer, a first conductive layer, a second conductive layer, a third conductive layer, a fourth conductive layer, a fifth conductive layer, and an electrode layer that are stacked in sequence. An insulating layer may be provided between the adjacent layers. As shown in FIGS. 4 to 16, FIG. 4 is a structural layout in an exemplary embodiment of the display panel of the present disclosure.

Figure 4:
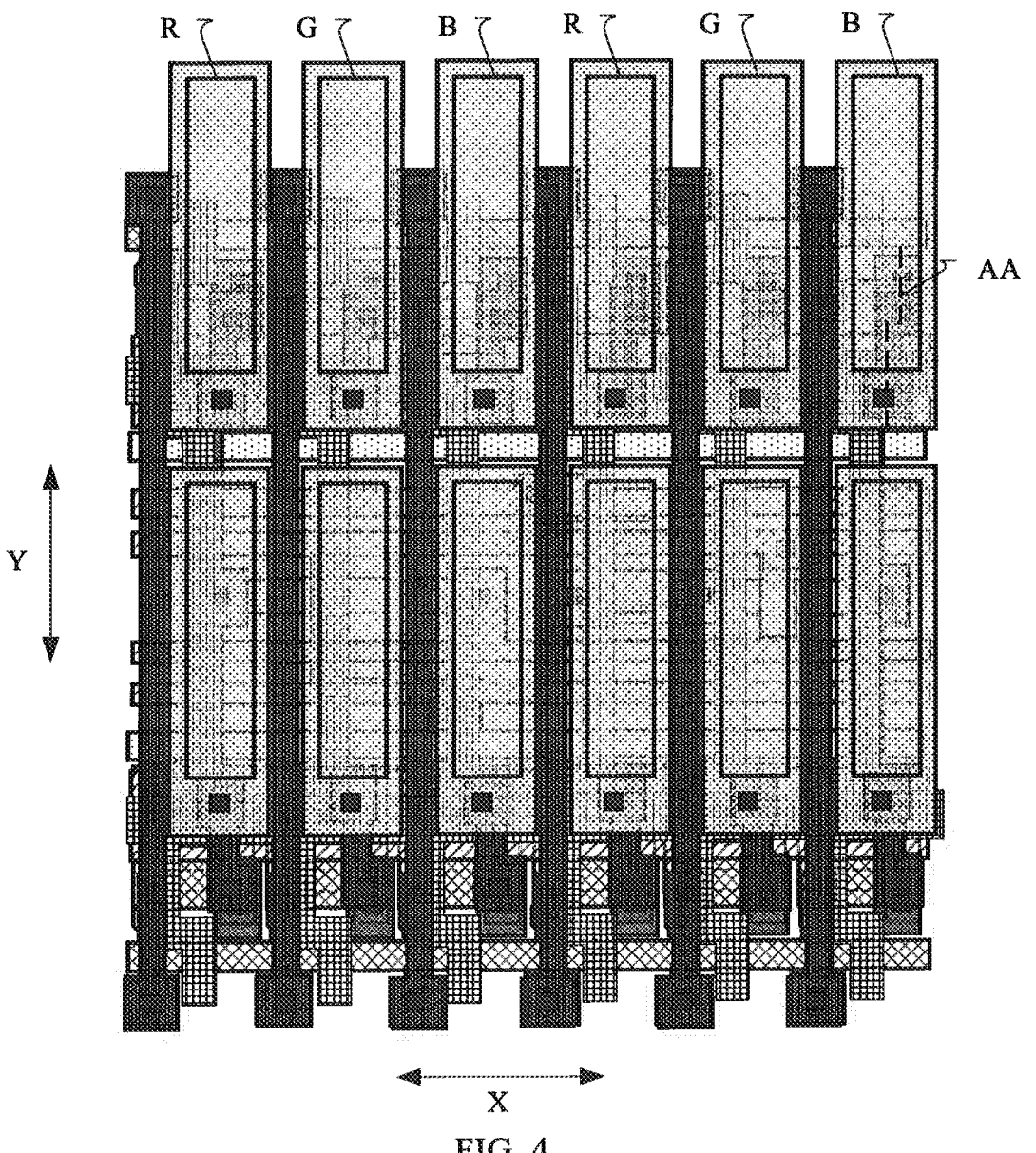
FIG. 4 is a structural layout of in an exemplary embodiment of the display panel of the present disclosure.
Figure 5:
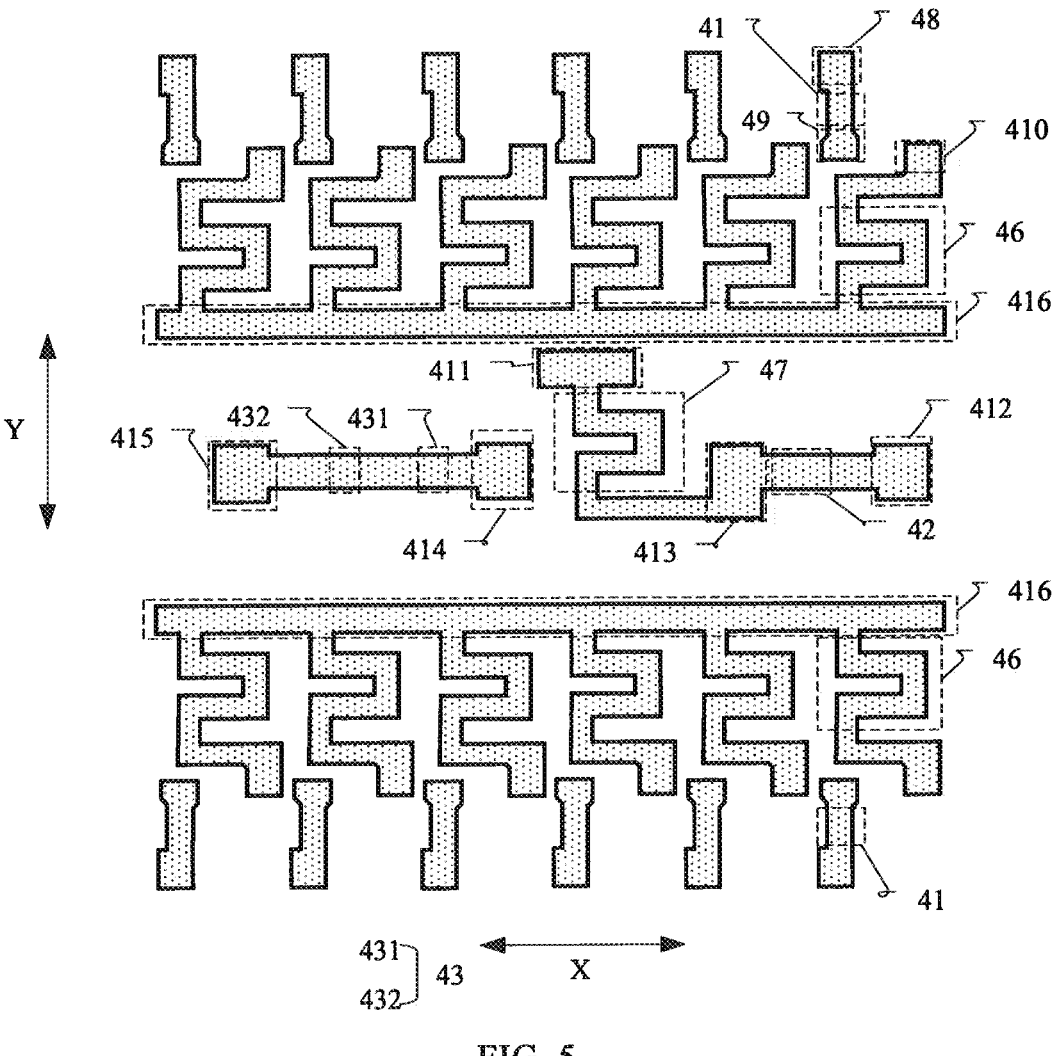
FIG. 5 is a structural layout of the active layer in FIG. 4.
Figure 6:
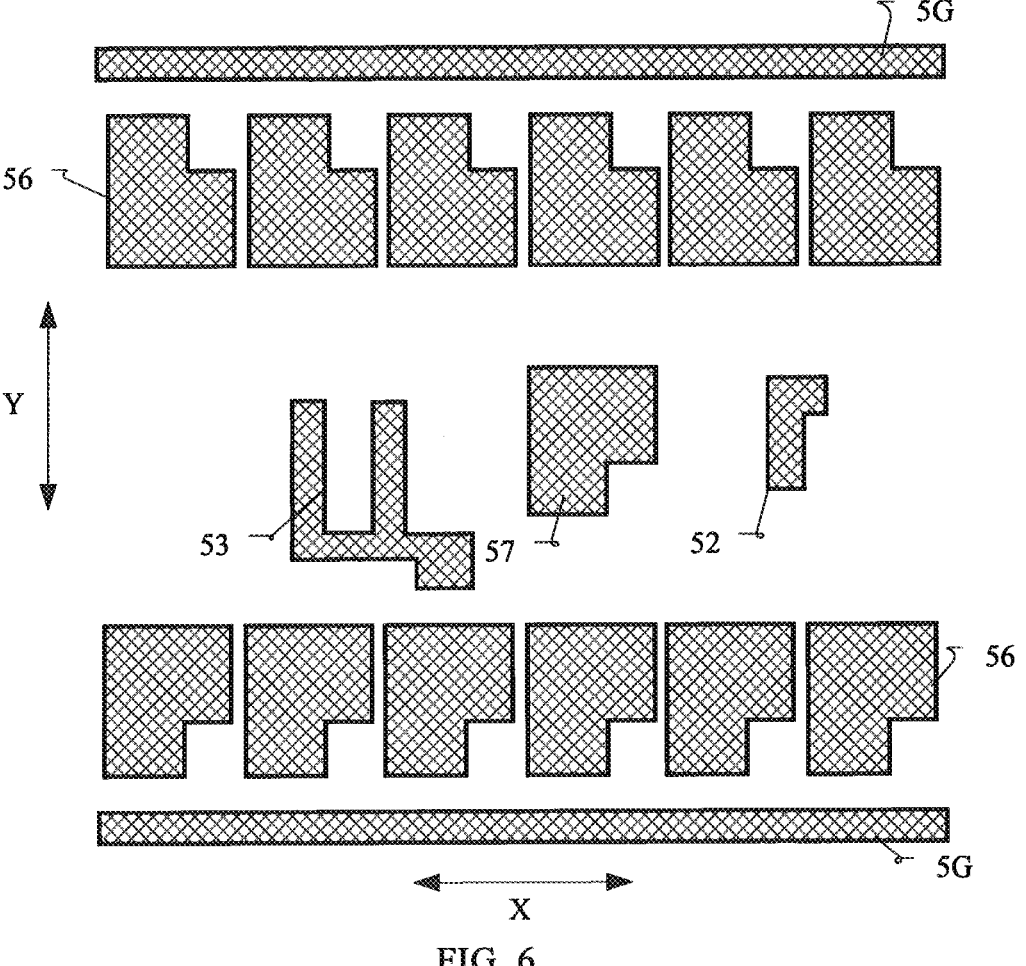
FIG. 6 is a structural layout of the first conductive layer in FIG. 4.
Figure 7:
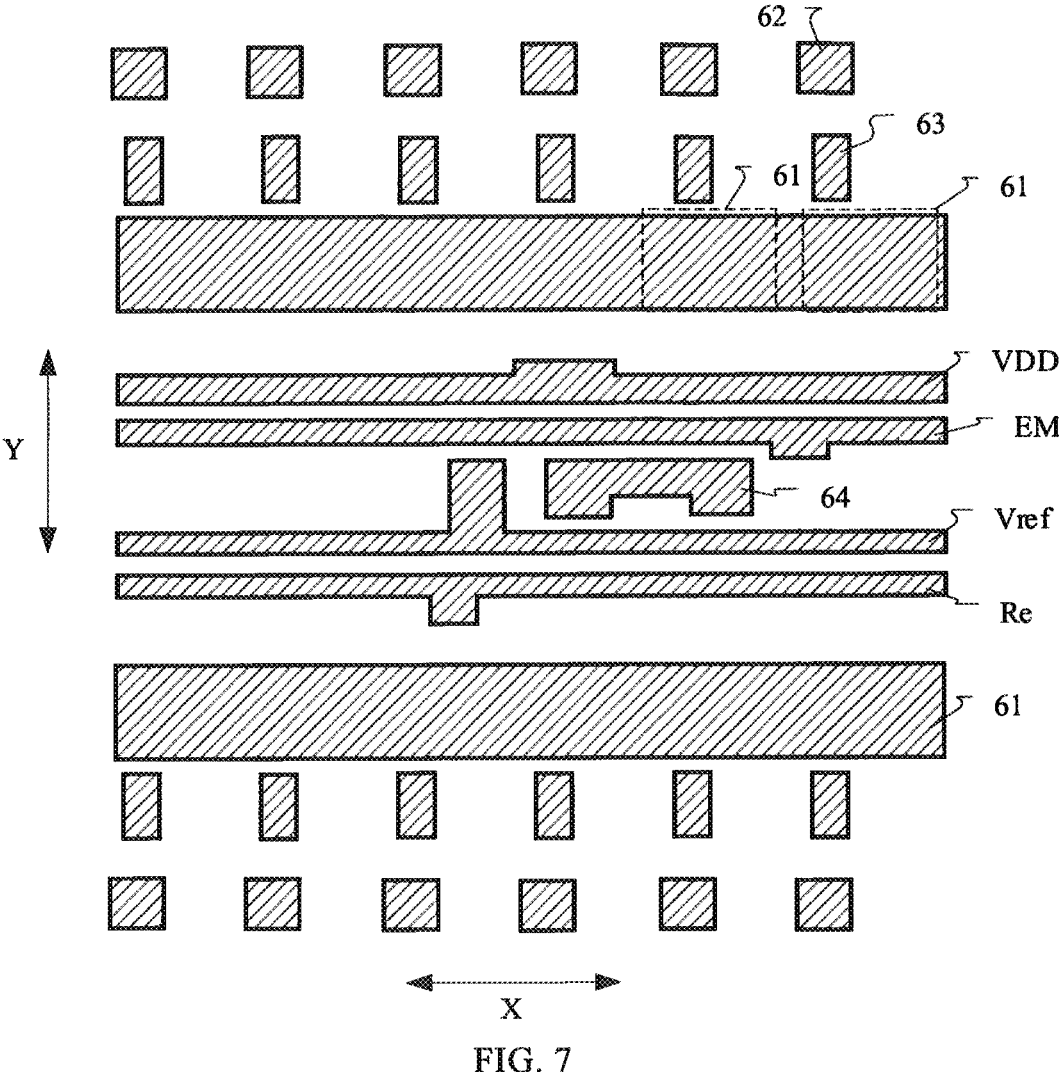
FIG. 7 is a structural layout of the second conductive layer in FIG. 4.
Figure 8:
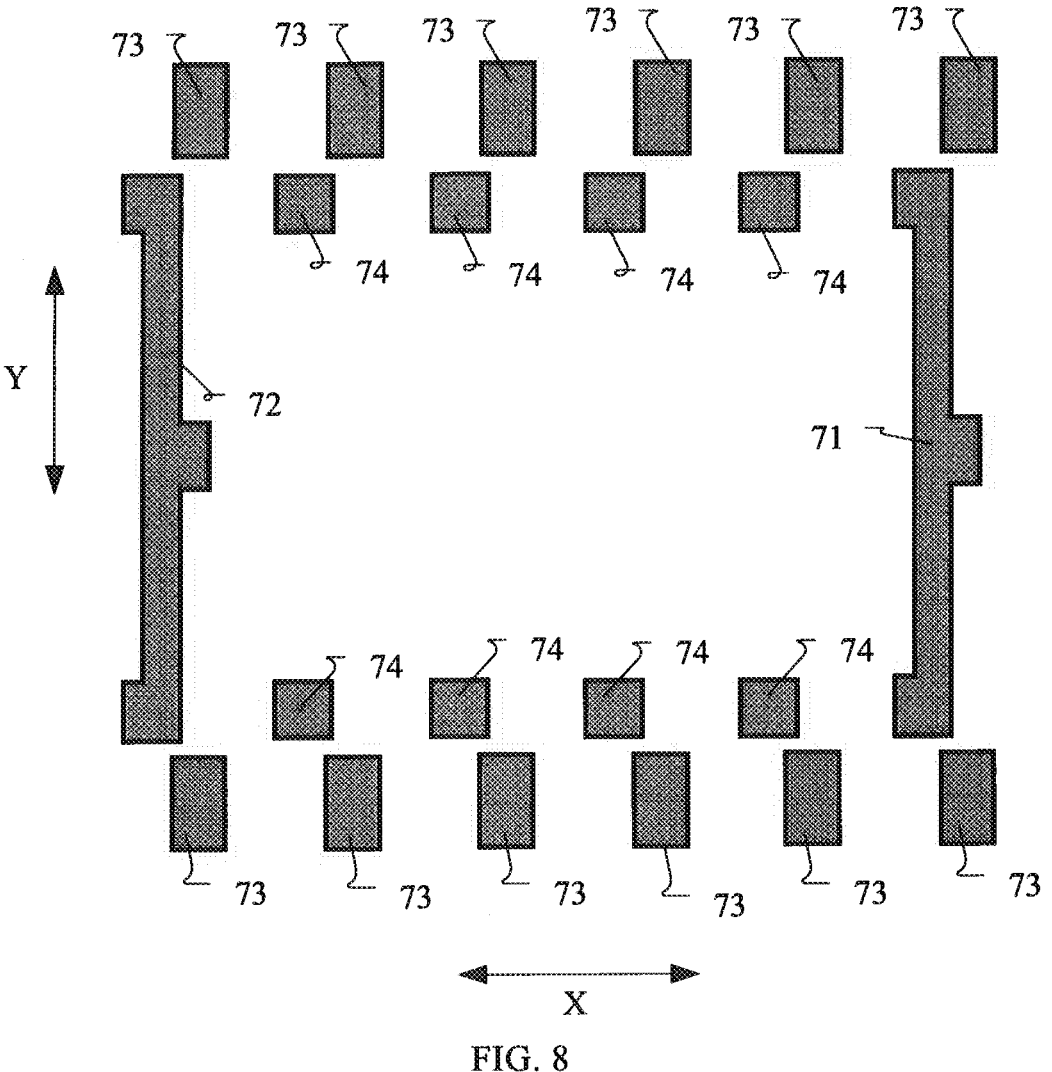
FIG. 8 is a structural layout of the third conductive layer in FIG. 4.
Figure 9:
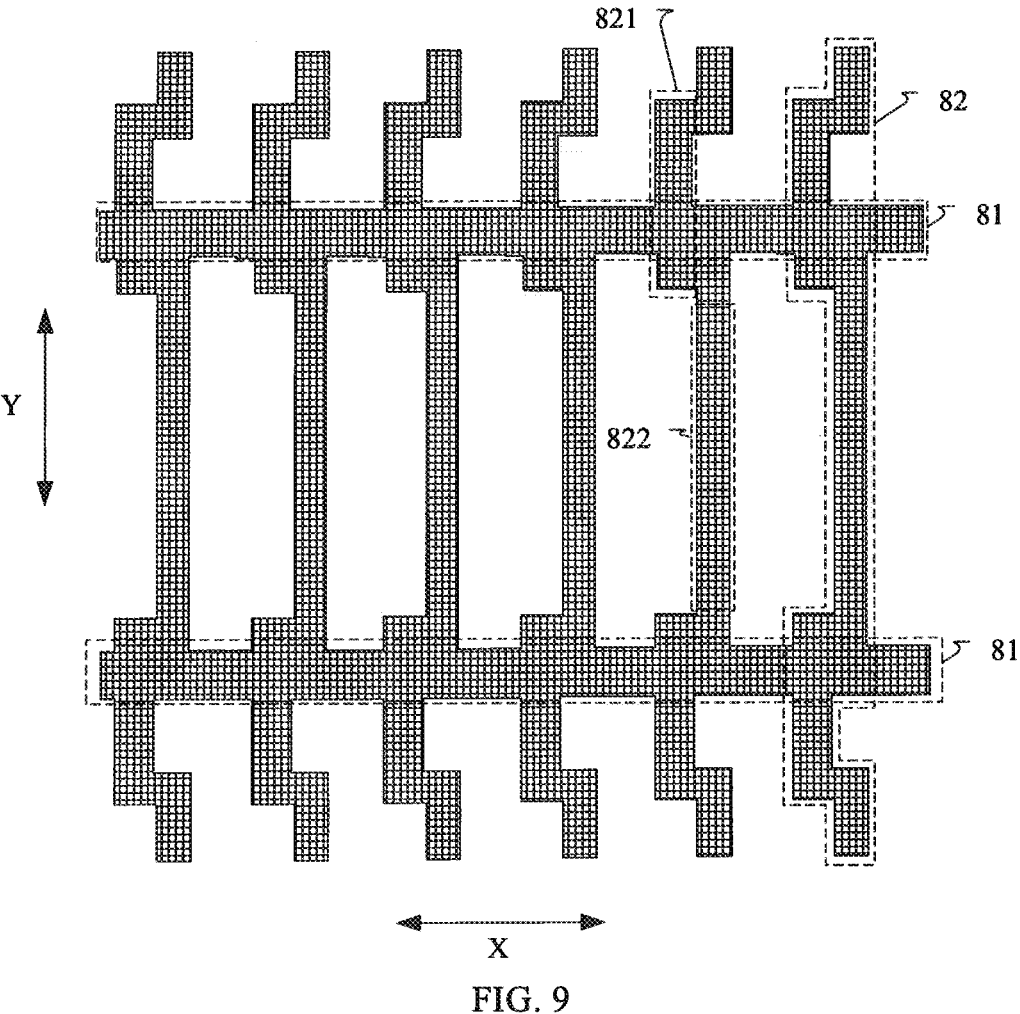
FIG. 9 is a structural layout of the fourth conductive layer in FIG. 4.
Figure 10:
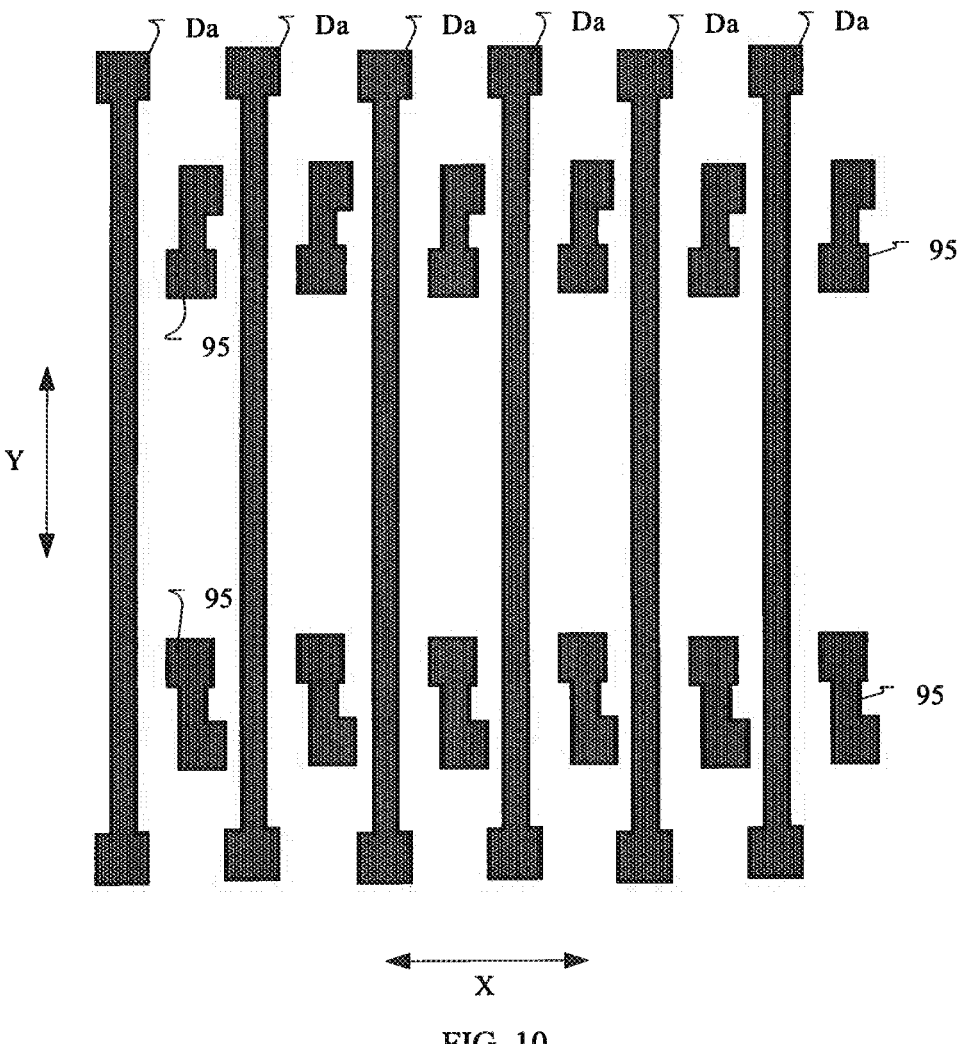
FIG. 10 is a structural layout of the fifth conductive layer in FIG. 4.
Figure 11:
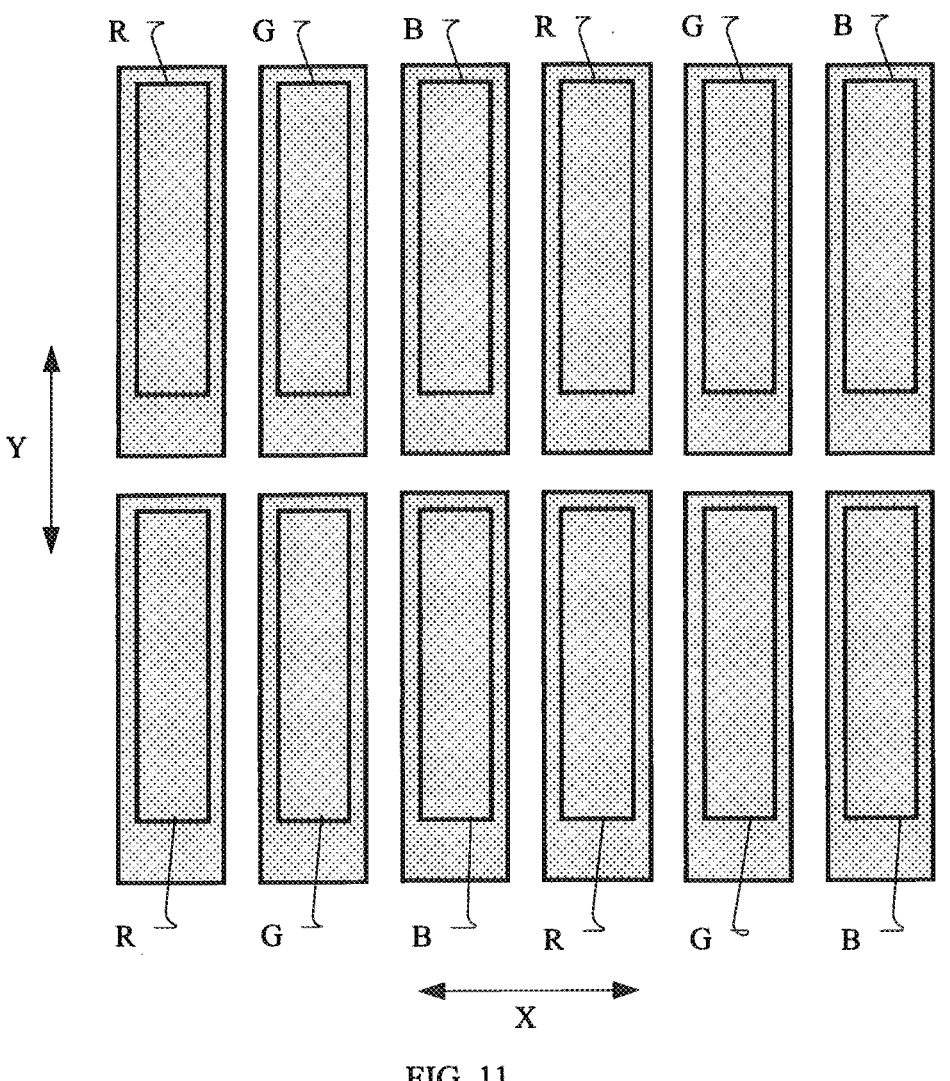
FIG. 11 is a structural layout of the electrode layer in FIG. 4.
Figure 12:
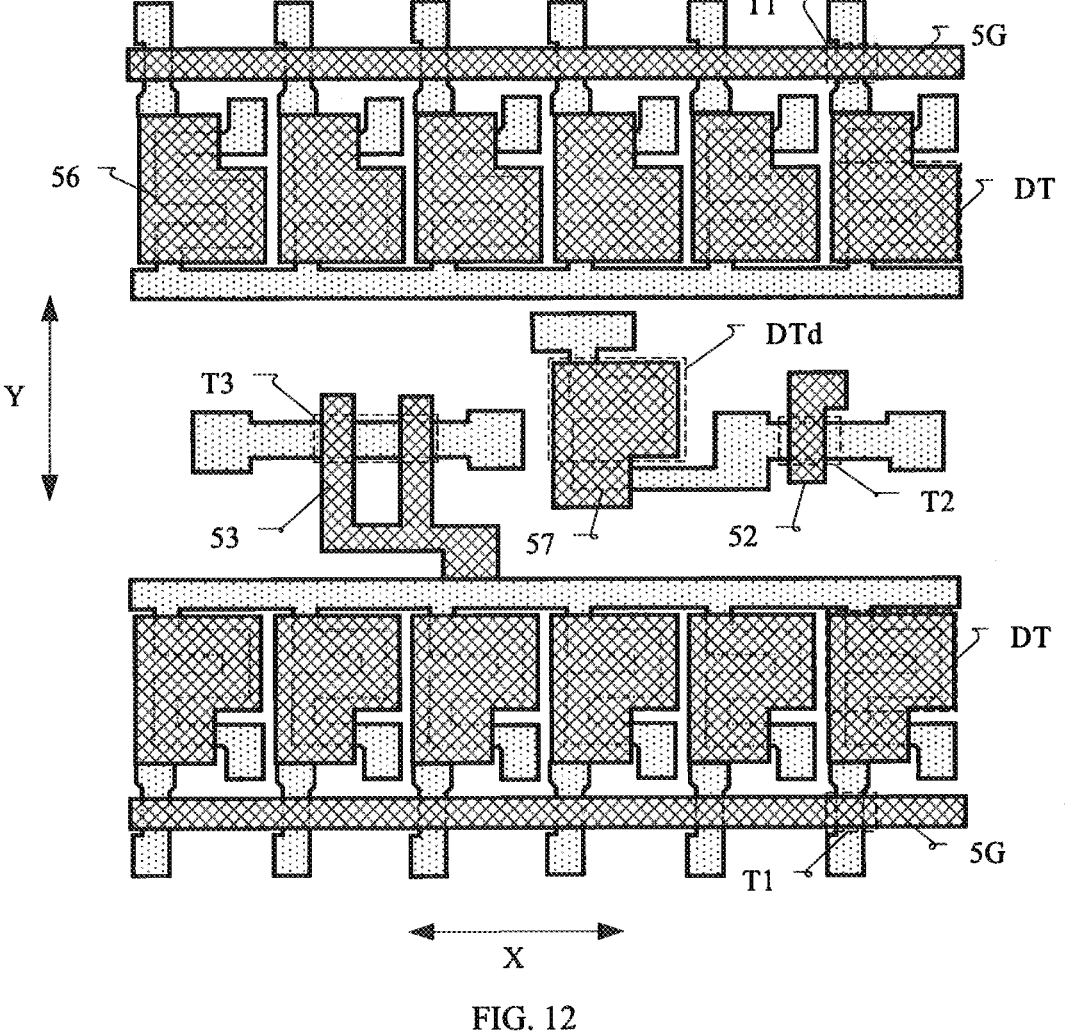
FIG. 12 is a structural layout of the active layer and the first conductive layer in FIG. 4.
Figure 13:
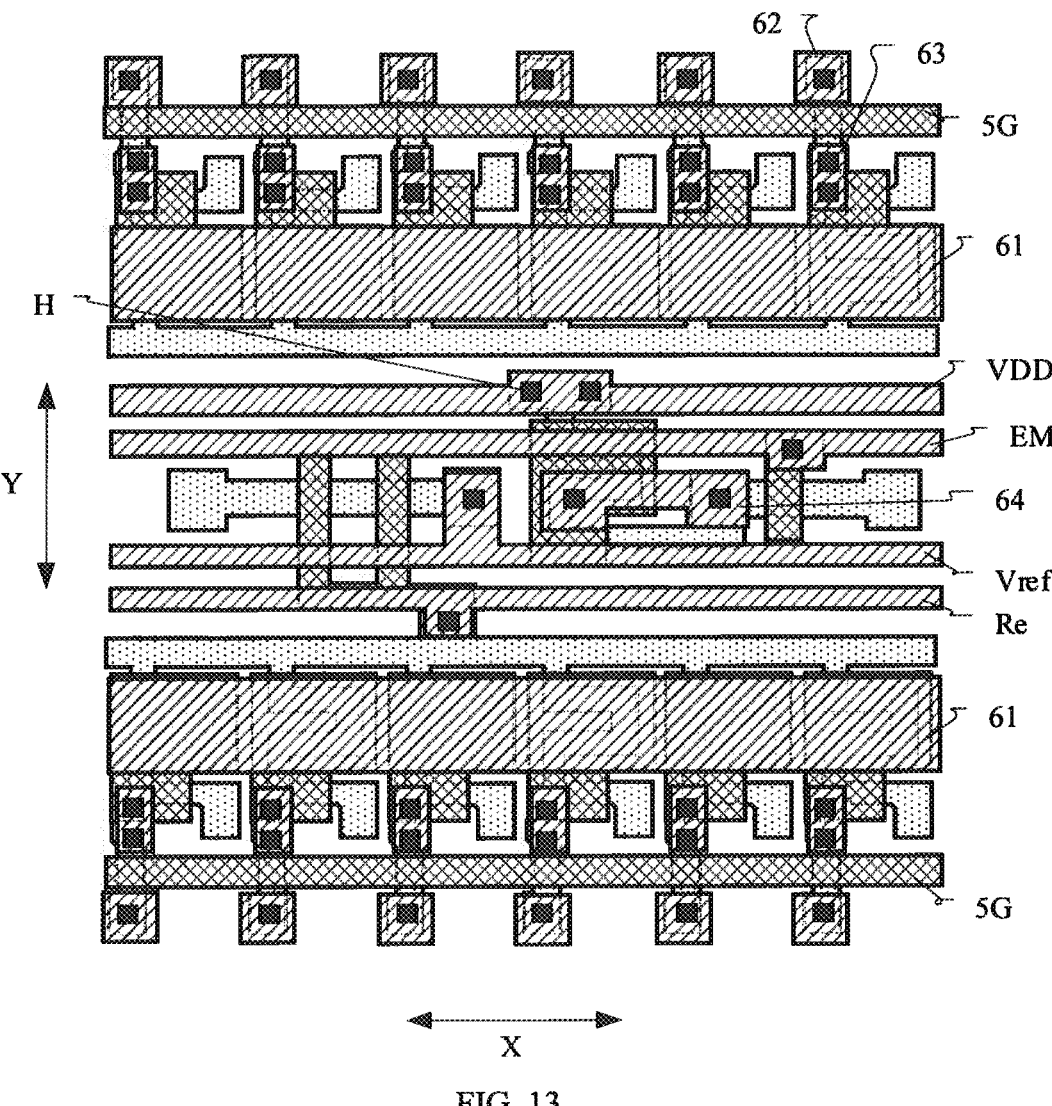
FIG. 13 is a structural layout of the active layer, the first conductive layer, and the second conductive layer in FIG. 4.
Figure 14:
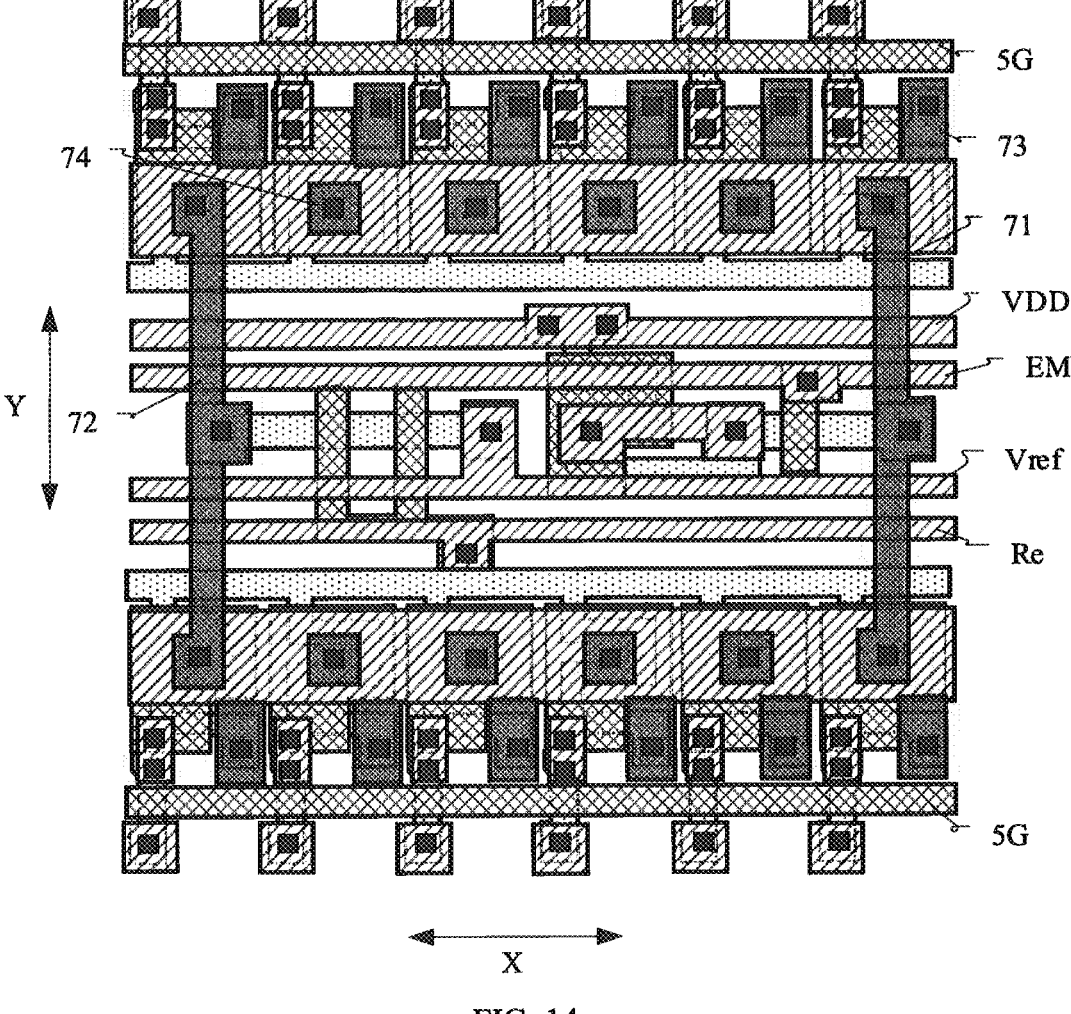
FIG. 14 is a structural layout of the active layer, the first conductive layer, the second conductive layer, and the third conductive layer in FIG. 4.
Figure 15:
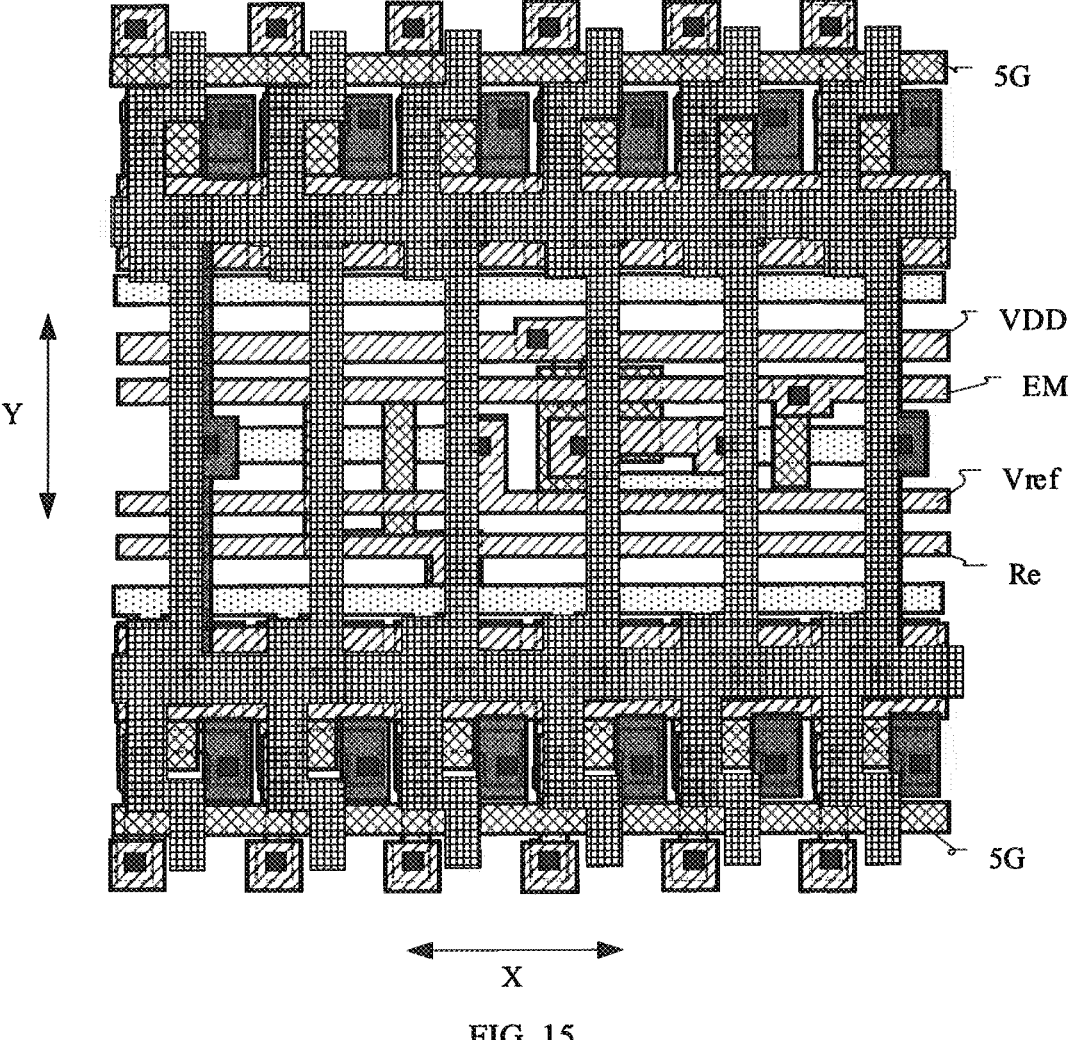
FIG. 15 is a structural layout of the active layer, the first conductive layer, the second conductive layer, the third conductive layer and the fourth conductive layer in FIG. 4.
Figure 16:
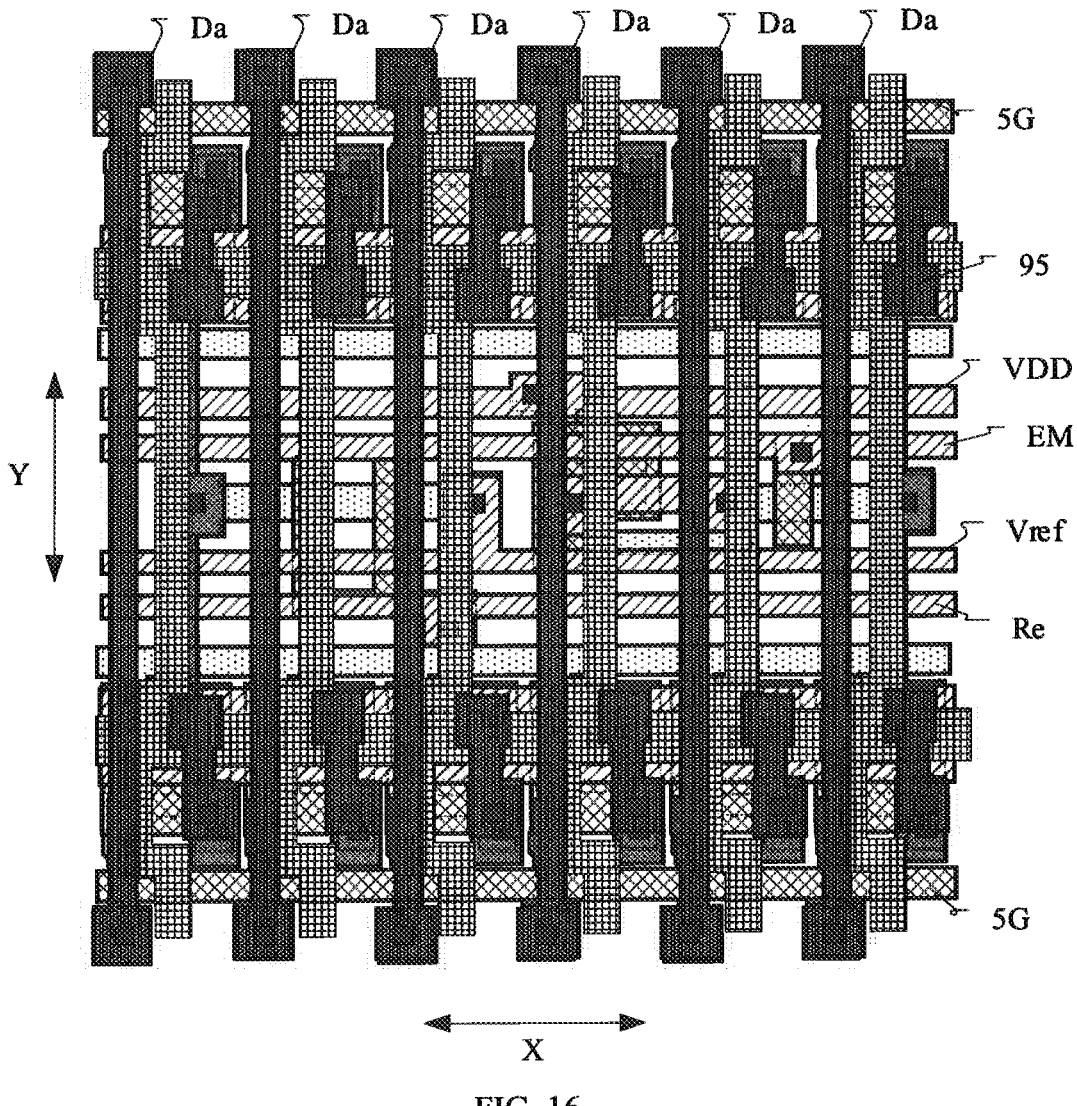
FIG. 16 is a structural layout of the active layer, the first conductive layer, the second conductive layer, the third conductive layer, the fourth conductive layer and the fifth conductive layer in FIG. 4.

FIG. 5 is a structural layout of the active layer in FIG. 4. FIG. 6 is a structural layout of the first conductive layer in FIG. 4. FIG. 7 is a structural layout of the second conductive layer in FIG. 4. FIG. 8 is a structural layout of the third conductive layer in FIG. 4. FIG. 9 is a structural layout of the fourth conductive layer in FIG. 4. FIG. 10 is a structural layout of the fifth conductive layer in FIG. 4. FIG. 11 is a structural layout of the electrode layer in FIG. 4. FIG. 12 is a structural layout of the active layer and the first conductive layer in FIG. 4. FIG. 13 is a structural layout of the active layer, the first conductive layer and the second conductive layer in FIG. 4. FIG. 14 is a structural layout of the active layer, the first conductive layer, the second conductive layer and the third conductive layer in FIG. 4. FIG. 15 is a structural layout of the active layer, the first conductive layer, the second conductive layer, the third conductive layer and the fourth conductive layer in FIG. 4. FIG. 16 is a structural layout of the active layer, the first conductive layer, the second conductive layer, the third conductive layer, the fourth conductive layer and the fifth conductive layer in FIG. 4. The display panel may include a plurality of driving units Dpi distributed along the row and column directions. The difference between the driving unit in the display panel and the driving unit shown in FIG. 2 is that the driving unit in the exemplary embodiment includes 2 rows and 6 columns of pixel driving circuits.

As shown in FIGS. 4, 5, and 12, the active layer may include a first active part 41, a second active part 42, a third active part 43, a sixth active part 46, a seventh active part 47, an eighth active part 48, a ninth active part 49, a tenth active part 410, an eleventh active part 411, a twelfth active part 412, a thirteenth active part 413, a fourteenth active part 414, a fifteenth active part 415, and an active line 416. The first active part 41 is configured to form a channel region of the first transistor T1. The second active part 42 is configured to form a channel region of the second transistor T2. The third active part 43 is configured to form a channel region of the third transistor. The third active part 43 includes a first active sub-part 431 and a second active sub-part 432 which are connected with each other. The sixth active part 46 is configured to form a channel region of the driving transistor DT. The seventh active part 47 is configured to form a channel region of the analog transistor DTd. The eighth active part 48 and the ninth active part 49 are connected to both ends of the first active part 41. The tenth active part 410 and the source line 416 are connected to both ends of the sixth active part 46. The orthographic projection of the active line 416 on the substrate can extend along the row direction X. The sixth active part 46 located in the same row is connected to the same active line 416. The thirteenth active part 413 is connected between the seventh active part 47 and the second active part 42. The eleventh active part 411 is connected to an end of the seventh active part 47 away from the second active part 42. The twelfth active part 412 is connected to an end of the second active part 42 away from the seventh active part 47. The fourteenth active part 414 and the fifteenth active part 415 are connected to the both ends of the third active part 43. The active layer may be formed of polysilicon material. Correspondingly, the first transistor T1, the second transistor T2, the third transistor T3, the driving transistor DT, and the analog transistor DTd may be P-type low-temperature polysilicon thin film transistors.

As shown in FIGS. 4, 6, and 12, the first conductive layer may include a gate line 5G, a second gate part 52, a third gate part 53, a sixth gate part 56, and a seventh gate part 57. The orthographic projection of the gate line 5G on the substrate extends along the row direction, and covers the orthographic projection of the first active part 41 on the substrate. A part of structure of the gate line 5G is configured to form the gate electrode of the first transistor T1. The gate line 5G can be configured to provide the gate driving terminal. The orthographic projection of the sixth gate part 56 on the substrate covers the orthographic projection of the sixth active part 46 on the substrate. A part of the structure of the sixth gate part 56 is configured to form the gate electrode of the driving transistor DT and a first electrode of the first capacitor C1. The orthographic projection of the second gate part 52 on the substrate covers the orthographic projection of the second active part 42 on the substrate. A part of the structure of the second gate part 52 is configured to form the gate electrode of the second transistor T2. The orthographic projection of the third gate part 53 on the substrate can cover the orthographic projection of the third active part 43 on the substrate. A part of the structure of the third gate part 53 can be configured to form the gate electrode of the third transistor T3. The third transistor T3 has a double-gate structure, and the third transistor T3 of the double-gate structure has a small off-leakage current. The orthographic projection of the seventh gate part 57 on the substrate can cover the orthographic projection of the seventh active part 47 on the substrate. A part of the structure of the seventh gate part 57 can be configured to form the gate electrode of the analog transistor DTd. In addition, the display panel can use the first conductive layer as a mask to perform conductive treatment on the active layer. That is, the area in the active layer covered by the first conductive layer can form the channel area of the transistor, and the area in the active layer not covered by the first conductive layer forms a conductor structure.

As shown in FIGS. 4, 7, and 13, the second conductive layer may include: a first conductive part 61, a second conductive part 62, a third conductive part 63, a fourth conductive part 64, a power line VDD, and an enable signal line EM, a reference signal line Vref, and a reset signal line Re. The orthographic projection of the power line VDD on the substrate, the orthographic projection of the enable signal line EM on the substrate, the orthographic projection of the reference signal line Vref on the substrate, and the orthographic projection of the reset signal line Re on the substrate may all extend along the row direction X. The power line VDD is configured to provide the first power terminal. The power line VDD can be connected to the eleventh active part 411 through the via hole H to connect to the first electrode of the analog transistor DTd. In this exemplary embodiment, the black block represents the location of the via hole. The enable signal line EM is configured to provide an enable signal terminal. The enable signal line EM can be connected to the second gate part 52 through a via hole to connect to the gate of the second transistor T2. The reference signal line Vref is configured to provide the reference signal terminal. The reference signal line Vref can be connected to the fourteenth active part 414 through a via hole to connect to the first electrode of the third transistor T3. The reset signal line Re is configured to provide the reset signal terminal. The reset signal line Re can be connected to the third gate part 53 through a via hole to connect to the gate of the third transistor T3. The orthographic projection of the first conductive part 61 on the substrate intersects the orthographic projection of the sixth gate part 56 on the substrate. The first conductive part 61 can be configured to form a second electrode of the first capacitor C1. The first conductive parts 61 in the same row of the pixel driving circuits in the same driving unit may be connected to each other, and adjacent first conductive parts 61 in adjacent driving units in the row direction X are arranged at intervals. The second conductive part 62 may be connected to the eighth active part through a via hole to connect to the first electrode of the first transistor. The third conductive part 63 may be respectively connected to the ninth active part 49 and the sixth gate part 56 through via holes to connect to the second electrode of the first transistor T1 and the gate electrode of the driving transistor. The fourth conductive part 64 is respectively connected to the seventh gate part 57 and the thirteenth active part 413 through via holes to connect to the second electrode of the analog transistor DTd and its gate electrode.

As shown in FIGS. 4, 8, and 14, the third conductive layer may include a first bridge part 71, a second bridge part 72, a third bridge part 73, and a fourth bridge part 74. The first bridge part 71 can be connected to the twelfth active part 412 and the first conductive part 61 located in two rows of pixel driving circuits through via holes respectively to connect to the second electrode of the second transistor T2 and the second electrode of the first capacitor C1. The second bridge part 72 can be respectively connected to the fifteenth active part 415 and the first conductive part 61 located in two rows of pixel driving circuits through via holes to connect to the second electrode of the third transistor T3 and the second electrode of the first capacitor C1. The third bridge part 73 may be connected to the tenth active part 410 through a via hole to connect to the second electrode of the driving transistor DT. The fourth bridge part 74 can be connected to the first conductive part 61 through via hole, where the first conductive part 61 is not connected to the first bridge part 71 and the second bridge part 72 through via hole. The fourth bridge part 74 can enable the first conductive parts 61 at different positions to have the same or similar parasitic capacitance. It should be understood that in other exemplary embodiments, the third conductive layer may not be provided with the fourth bridge part 74. The orthographic projections of the analog transistor DTd, the second transistor T2, and the third transistor T3 on the substrate may be located between the orthographic projection of the first bridge part 71 on the substrate and the orthographic projection of the second bridge part 72 on the substrate.

As shown in FIGS. 4, 9, and 15, the fourth conductive layer may include a first shielding line 81 and a second shielding line 82, wherein the orthographic projection of the first shielding line 81 on the substrate extends along the row direction X, and the orthographic projection of the second shielding line 82 on the substrate extends along the column direction Y. The orthographic projection of the first shielding line 81 on the substrate intersects with the orthographic projection of the second shielding line 82 on the substrate. Each column of pixel driving circuits can be provided with a corresponding second shielding line 82, and each row of pixel driving circuits can be provided with a corresponding first shielding line 81. The plurality of first shielding lines 81 and the plurality of second shielding lines 82 can form a grid structure. The first shielding line 81 and the second shielding line 82 can be connected to the power line VDD. The first shielding line 81 and the second shielding line 82 in a grid structure can reduce the resistance of the power wire itself. The first shielding line 81 and the second shielding line 82 may be connected to the power line VDD through a via hole located in the frame area outside the display area or at the edge of the display area. The orthographic projection of the first shielding line 81 and the second shielding line 82 on the substrate may at least partially overlap with the orthographic projection of the equipotential structure of the second electrode of the first capacitor C1 on the substrate. A part of structure of the first shielding line 81 and the second shielding line 82 can be configured to form the first electrode of the second capacitor C2. The second electrode of the first capacitor C1 can be multiplexed as the second electrode of the second capacitor C2. For example, the orthographic projection of the second shielding line 82 on the substrate may overlap with the orthographic projection of the first bridge part 71 on the substrate and the orthographic projection of the second bridge part 72 on the substrate. The orthographic projection of the first shielding line 81 on the substrate may overlap with the orthographic projection of the first conductive part 61 on the substrate.

As shown in FIGS. 4, 10, and 16, the fifth conductive layer may include: a data line Da and a fifth bridge part 95. The orthographic projection of the data line Da on the substrate may extend along the column direction Y. The data line Da may be configured to provide a data signal terminal. The data line Da may be connected to the second conductive part 62 through a via hole to connect the first electrode of the first transistor T1. The fifth bridge part 95 may be connected to the third bridge part 73 through a via hole to connect the second electrode of the driving transistor.

As shown in FIGS. 4, 9, 10, and 16, the second shielding line 82 may include a first extending part 821 and a second extending part 822. The overlapping part of the orthographic projection of the sixth gate part 56 on the substrate and the orthographic projection of the data line Da on the substrate may overlap with the orthographic projection of the first extending part 821 on the substrate, that is, the first extending part 821 is shielded between the sixth gate part 56 and the data line Da; and/or the overlapping part of the orthographic projection of the first conductive part 61 on the substrate and the orthographic projection of the data line Da on the substrate may overlap with the orthographic projection of the first extending part 821 on the substrate, that is, the first extending part 821 is shielded between the first conductive part 61 and the data line Da. The first extending part 821 can shield the noise influence of the data line Da on the sixth gate part 56 and the first conductive part 61, thereby improving the stability of the gate voltage of the driving transistor. The orthographic projection of the second extending part 822 on the substrate may be located between the orthographic projections of the adjacent data lines Da on the substrate, that is, the orthographic projection of the second extending part 822 on the substrate does not overlap with the orthographic projection of the data line Da on the substrate. This setting can reduce the parasitic capacitance of the data line Da, thereby improving the efficiency of writing data signal to the data line. In addition, the orthographic projection of the first bridge part 71 on the substrate can overlap with the orthographic projection of a second extending part 822 on the substrate, and the orthographic projection of the second bridge part 72 on the substrate can overlap with the orthographic projection of another second extending part 822 on the substrate. The second extending part 822 may be configured to form the first electrode of the second capacitor C.

As shown in FIGS. 4 and 11, the electrode layer may include a plurality of electrode parts: a first electrode part R, a second electrode part B, and a third electrode part G. Each electrode part may be connected to the fifth bridge part 95 through a via hole to connect the second electrode of the driving transistor DT. The first electrode part R may be configured to form the first electrode of the red light-emitting unit, the second electrode part B may be configured to form the first electrode of the blue light-emitting unit, and the third electrode part G may be configured to form the first electrode of the green light-emitting unit. In this exemplary embodiment, the light-emitting unit L may be a Real RGB distribution. For example, the first electrode part R, the third electrode part G, and the second electrode part B are distributed alternately in the row direction, and the electrode parts of the same color are located in the same column. As shown in FIG. 4, the orthographic projection of the electrode part on the substrate is located between the orthographic projections of two adjacent data lines Da on the substrate. On the one hand, this arrangement can avoid the influence of the data line Da on the flatness of the electrode part. On the other hand, this arrangement can reduce the noise influence of the data line Da on the electrode part. The display panel may further include a pixel definition layer located on the side of the electrode layer facing away from the substrate. A pixel opening for forming the light-emitting unit is formed on the pixel definition layer. The orthographic projection of the first electrode part R on the substrate coincides with the orthographic projection of the corresponding pixel opening on the pixel definition layer on the substrate. The orthographic projection of the second electrode part B on the substrate coincides with the orthographic projection of the corresponding pixel opening on the pixel definition layer on the substrate. The orthographic projection of the third electrode part G on the substrate coincides with the orthographic projection of the corresponding pixel opening on the pixel definition layer on the substrate.

Figure 17:
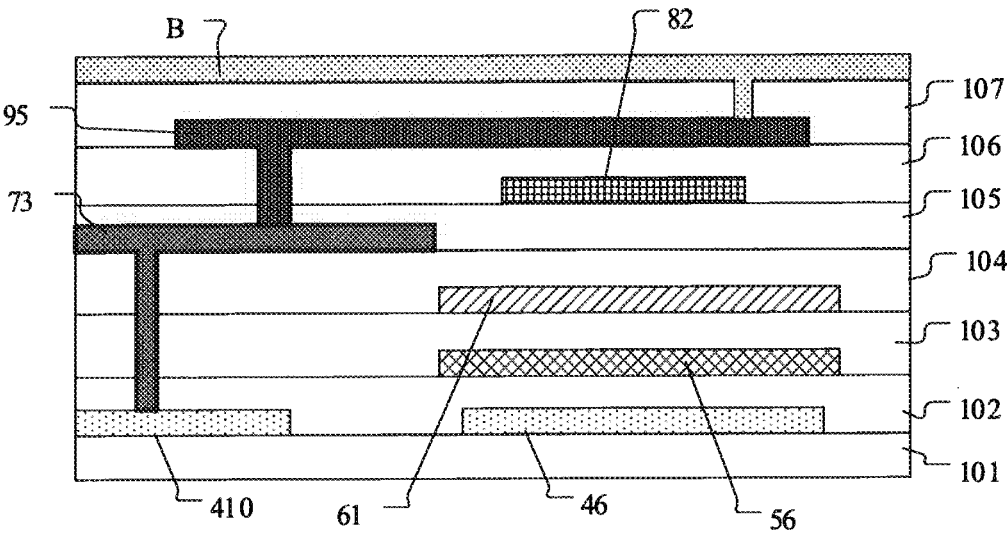
FIG. 17 is a partial cross-sectional view of the display panel shown in FIG. 4 taken along the dotted line AA.

As shown in FIG. 17, it is a partial cross-sectional view of the display panel shown in FIG. 4 taken along the dotted line AA. The display panel may further include a first insulating layer 102, a second insulating layer 103, a first dielectric layer 104, a passivation layer 105, a second dielectric layer 106, and a planarization layer 107. The substrate 101, the active layer, the first insulating layer 102, the first conductive layer, the second insulating layer 103, the second conductive layer, the first dielectric layer 104, the third conductive layer, the passivation layer 105, the fourth conductive layer, the second dielectric layer 106, the fifth conductive layer, the planarization layer 107, and the electrode layer are stacked in sequence. The first insulating layer 102 and the second insulating layer 103 may have a single-layer structure or a multi-layer structure, and the material of the first insulating layer 102 and the second insulating layer 103 may be at least one of silicon nitride, silicon oxide, and silicon oxynitride. The first dielectric layer 104 and the second dielectric layer 106 can be silicon nitride layers. The material of the planarization layer 107 can be an organic material, such as polyimide (PI), polyethylene terephthalate ester (PET), polyethylene naphthalate (PEN), silicon on glass (SOG) and other materials. The material of the passivation layer 105 may be silicon oxide. The substrate 101 may include a glass substrate, a barrier layer, and a polyimide layer that are stacked in sequence. The barrier layer may be an inorganic material. The material of the first conductive layer and the second conductive layer may be an alloy or one of molybdenum, aluminum, copper, titanium and niobium, or a molybdenum/titanium alloy or laminate, etc. The material of the third conductive layer and the fifth conductive layer may include a metal material. For example, it may be an alloy or one of molybdenum, aluminum, copper, titanium, niobium, or a molybdenum/titanium alloy or laminate, or it may be titanium/aluminum/titanium laminate. The electrode layer may include an indium tin oxide layer and a silver layer. The sheet resistance of any one of the first conductive layer and the second conductive layer may be greater than the sheet resistance of any one of the fourth conductive layer and the third conductive layer.

Figure 20:
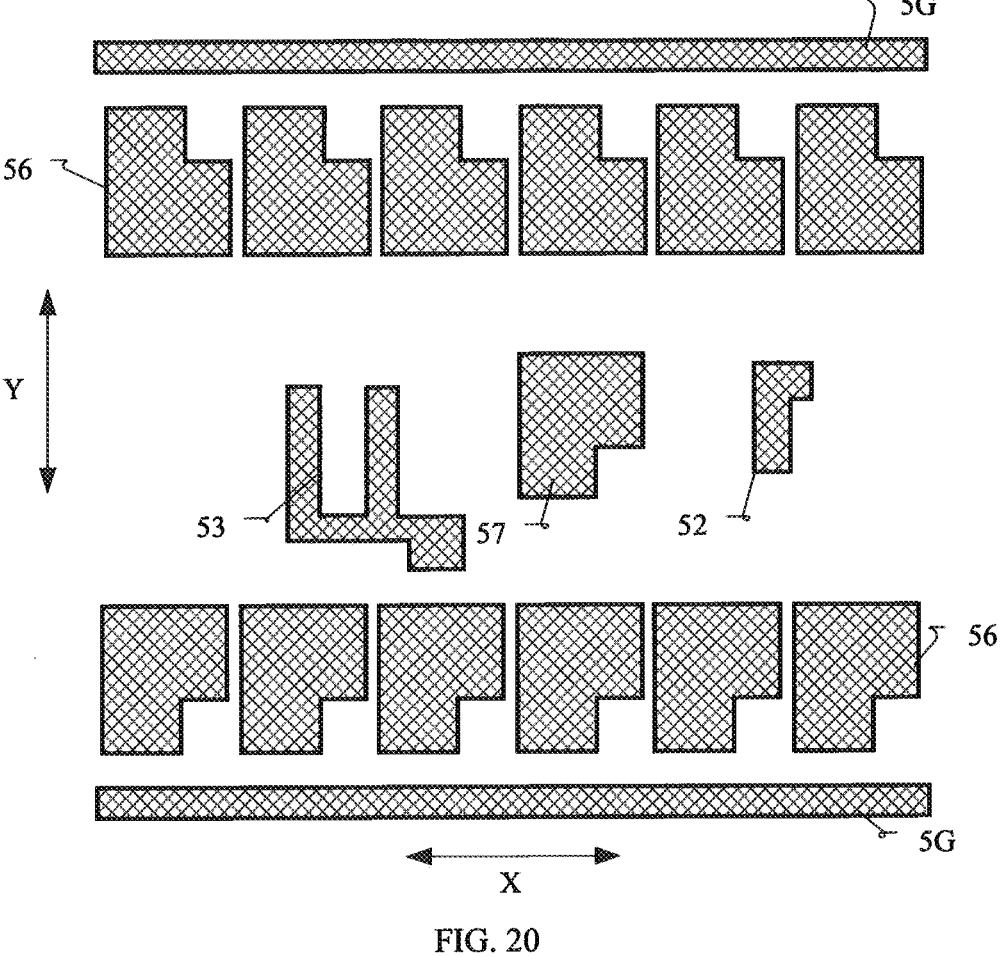
FIG. 20 is a structural layout of the first conductive layer in FIG. 18.
Figure 21:
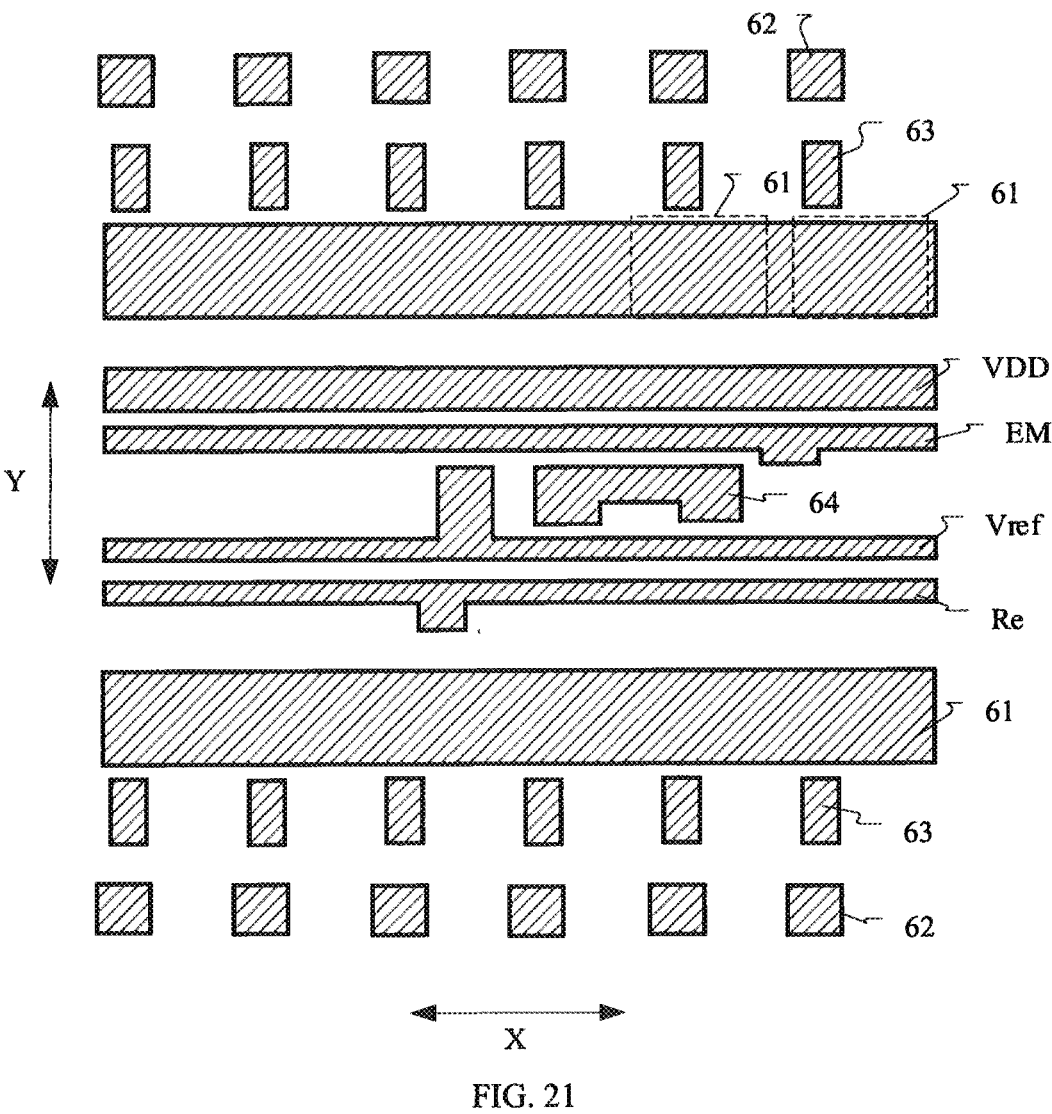
FIG. 21 is a structural layout of the second conductive layer in FIG. 18.
Figure 22:
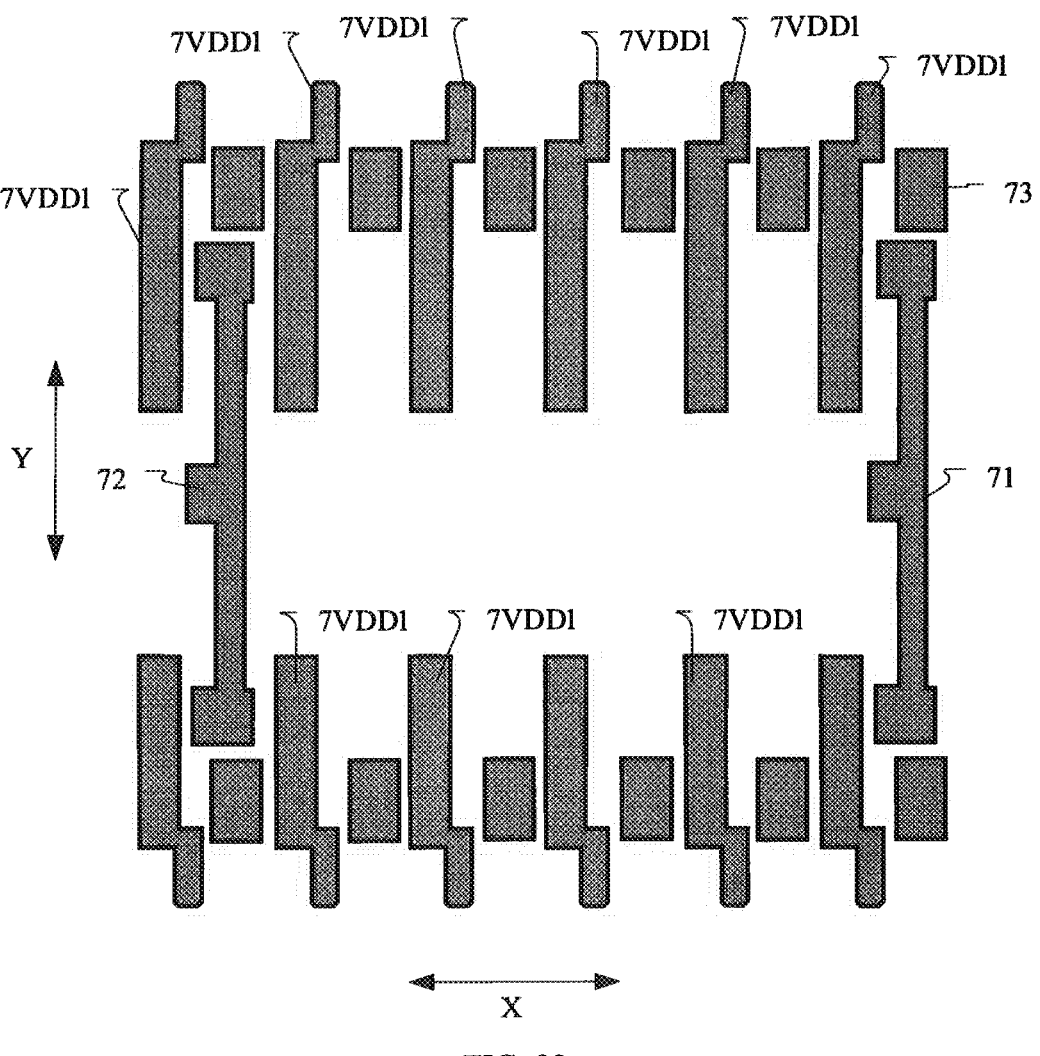
FIG. 22 is a structural layout of the third conductive layer in FIG. 18.
Figure 23:
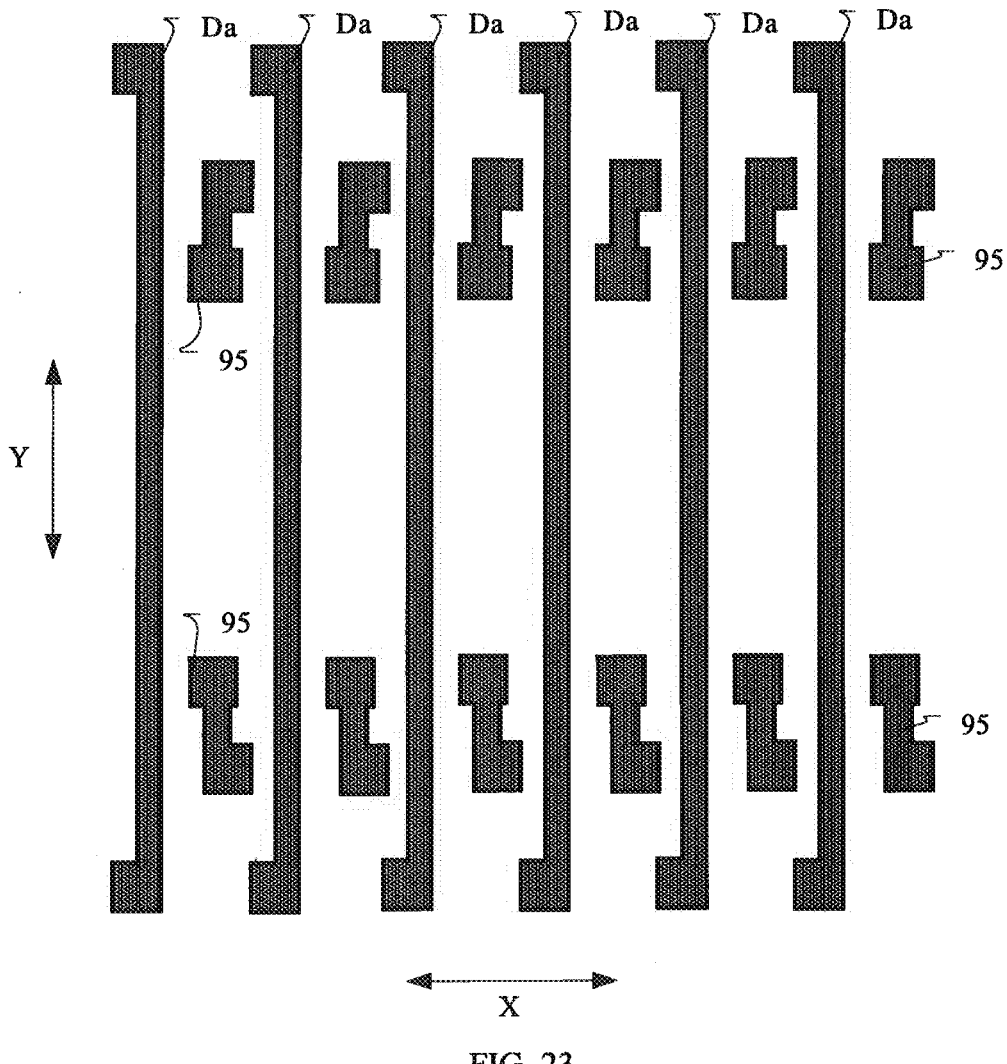
FIG. 23 is a structural layout of the fifth conductive layer in FIG. 18.
Figure 24:
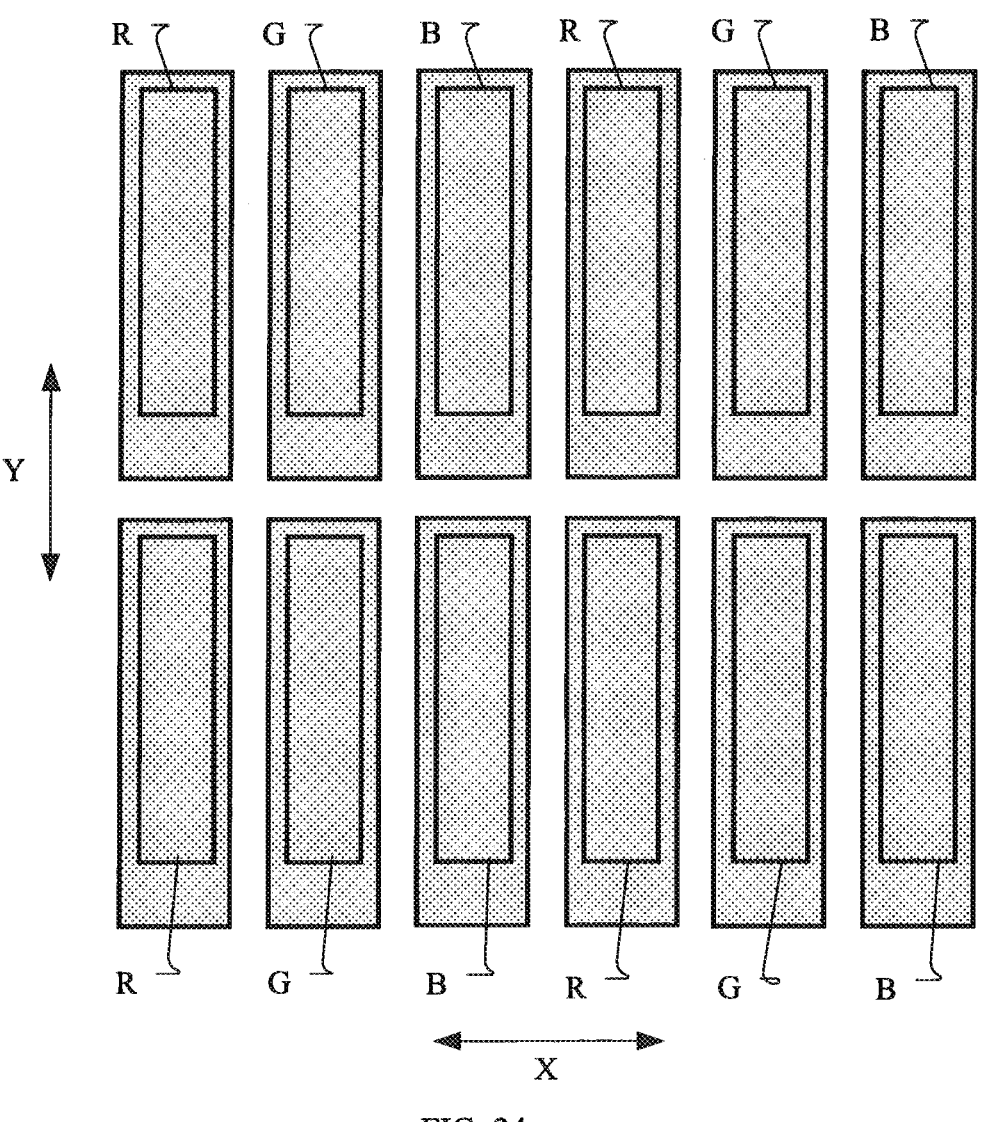
FIG. 24 is a structural layout of the electrode layer in FIG. 18.
Figure 25:
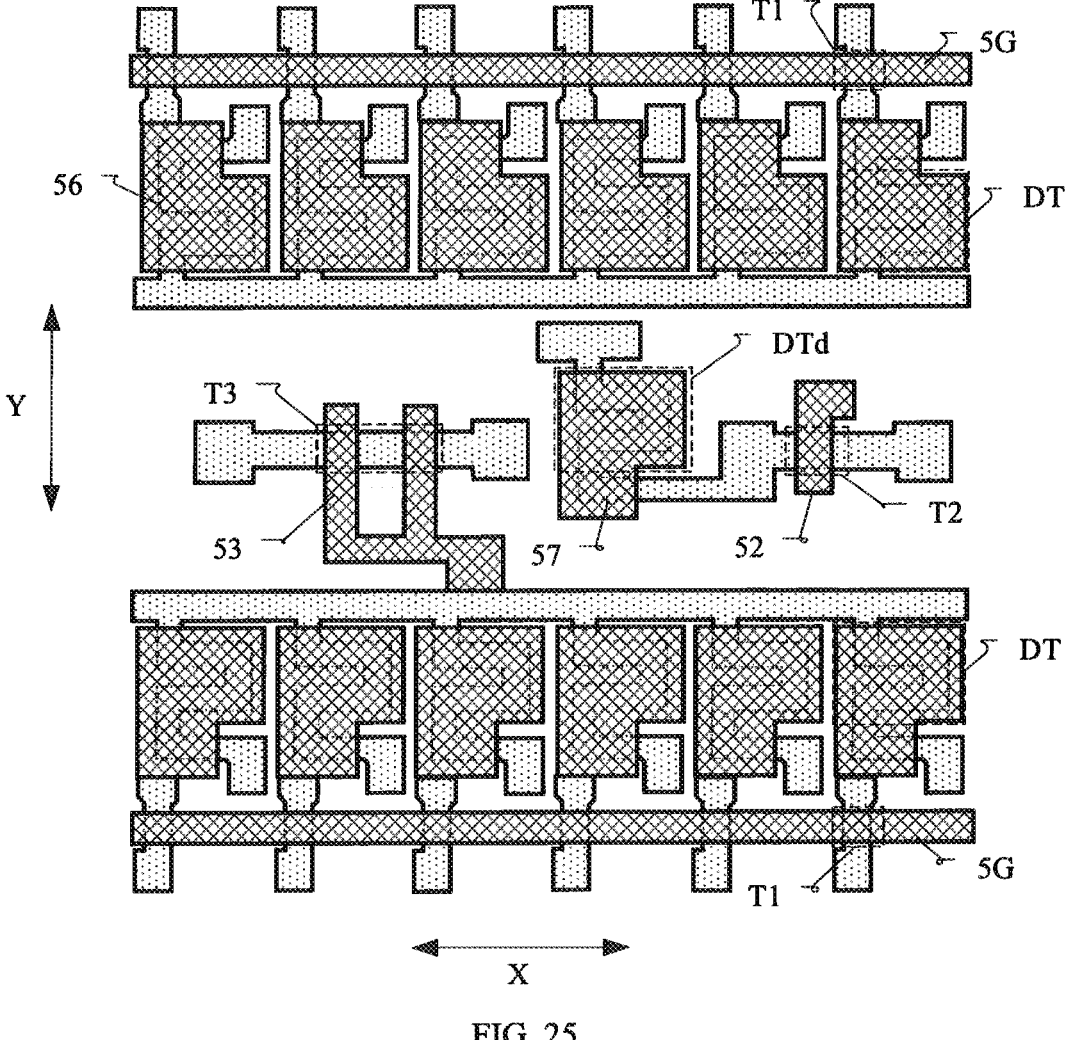
FIG. 25 is a structural layout of the active layer and the first conductive layer in FIG. 18.
Figure 26:
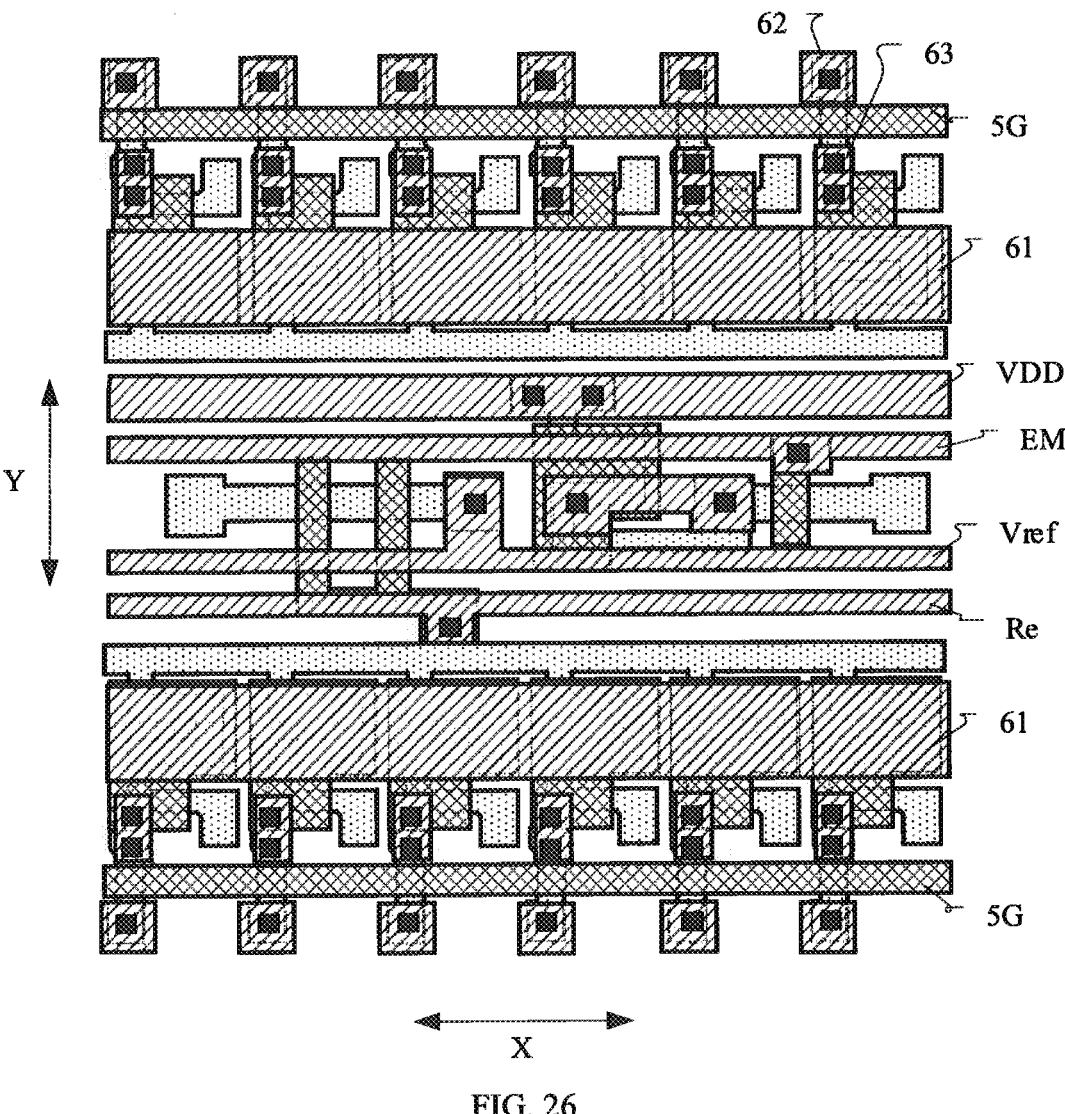
FIG. 26 is a structural layout of the active layer, the first conductive layer, and the second conductive layer in FIG. 18.
Figure 27:
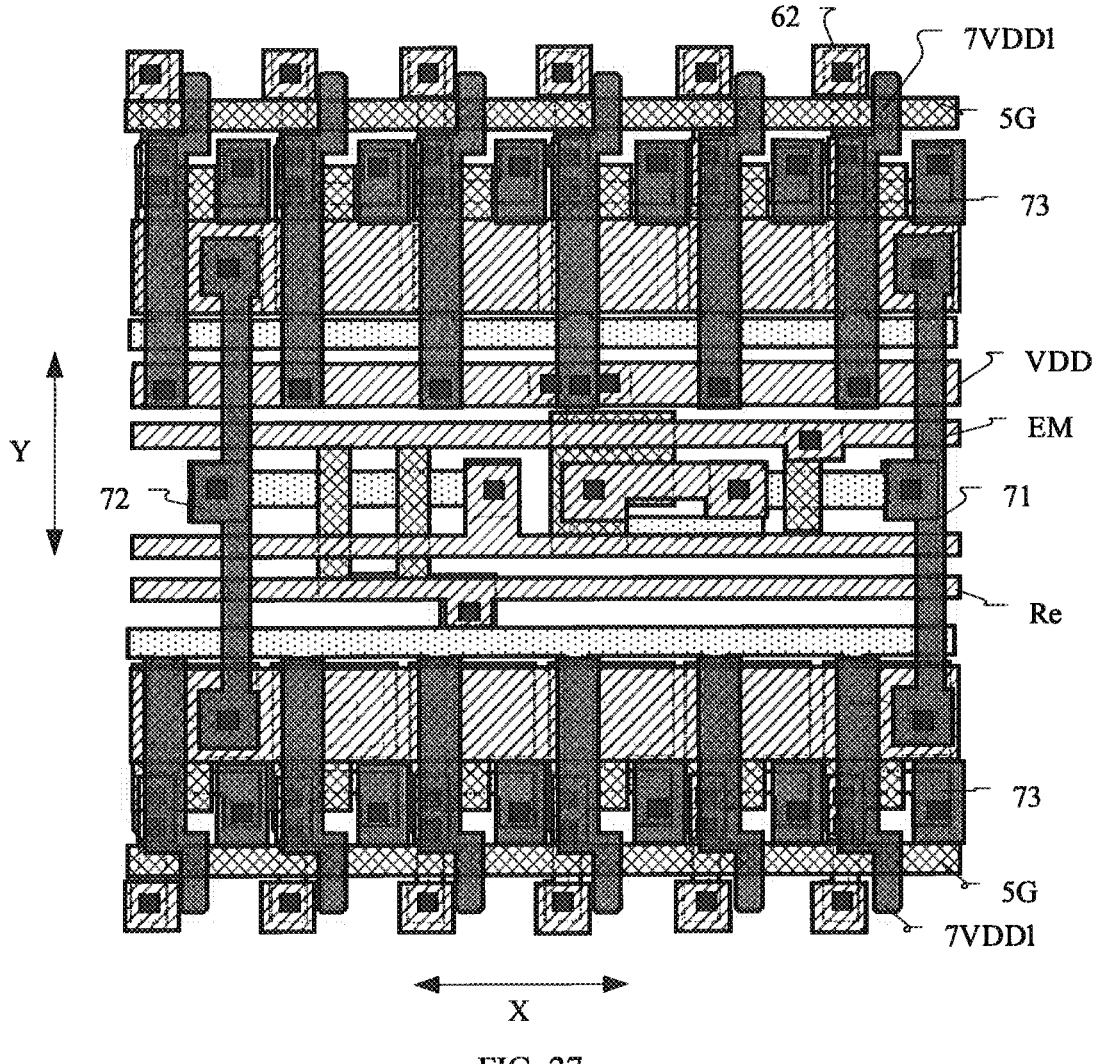
FIG. 27 is a structural layout of the active layer, the first conductive layer, the second conductive layer, and the third conductive layer in FIG. 18.
Figures 28, 29:
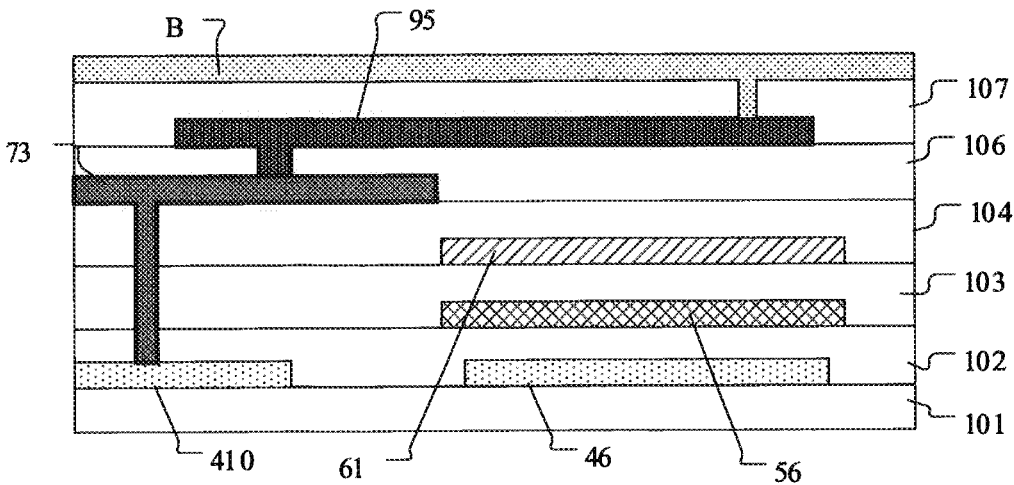
FIG. 28 is a structural layout of the active layer, the first conductive layer, the second conductive layer, the third conductive layer and the fifth conductive layer in FIG. 18.
FIG. 29 is a partial cross-sectional view of the display panel shown in FIG. 18 taken along the dotted line BB.

The exemplary embodiment also provides another display panel, which may include: a substrate, an active layer, a first conductive layer, a second conductive layer, a third conductive layer, a fifth conductive layer and an electrode layer that are stacked in sequence. An insulating layer may be provided between the adjacent layers. As shown in FIGS. 18 to 28, FIG. 18 is a structural layout in an exemplary embodiment of the display panel of the present disclosure. FIG. 19 is a structural layout of the active layer in FIG. 18. FIG. 20 is a structural layout of the first conductive layer in FIG. 18. FIG. 21 is a structural layout of the second conductive layer in FIG. 18. FIG. 22 is a structural layout of the third conductive layer in FIG. 18. FIG. 23 is a structural layout of the fifth conductive layer in FIG. 18. FIG. 24 is the structural layout of the electrode layer in FIG. 18. FIG. 25 is a structural layout of the active layer and the first conductive layer in FIG. 18. FIG. 26 is a structural layout of the active layer, the first conductive layer and the second conductive layer in FIG. 18. FIG. 27 is a structural layout of the active layer, the first conductive layer, the second conductive layer, and the third conductive layer in FIG. 18. FIG. 28 is a structural layout of the active layer, the first conductive layer, the second conductive layer, the third conductive layer, and the fifth conductive layer in FIG. 18. The display panel may include a plurality of driving units Dpi distributed along the row and column directions. The difference between the driving unit in the display panel and the driving unit shown in FIG. 2 is that the driving unit in this exemplary embodiment includes 2 rows and 6 columns of pixel driving circuits.

Figure 18:
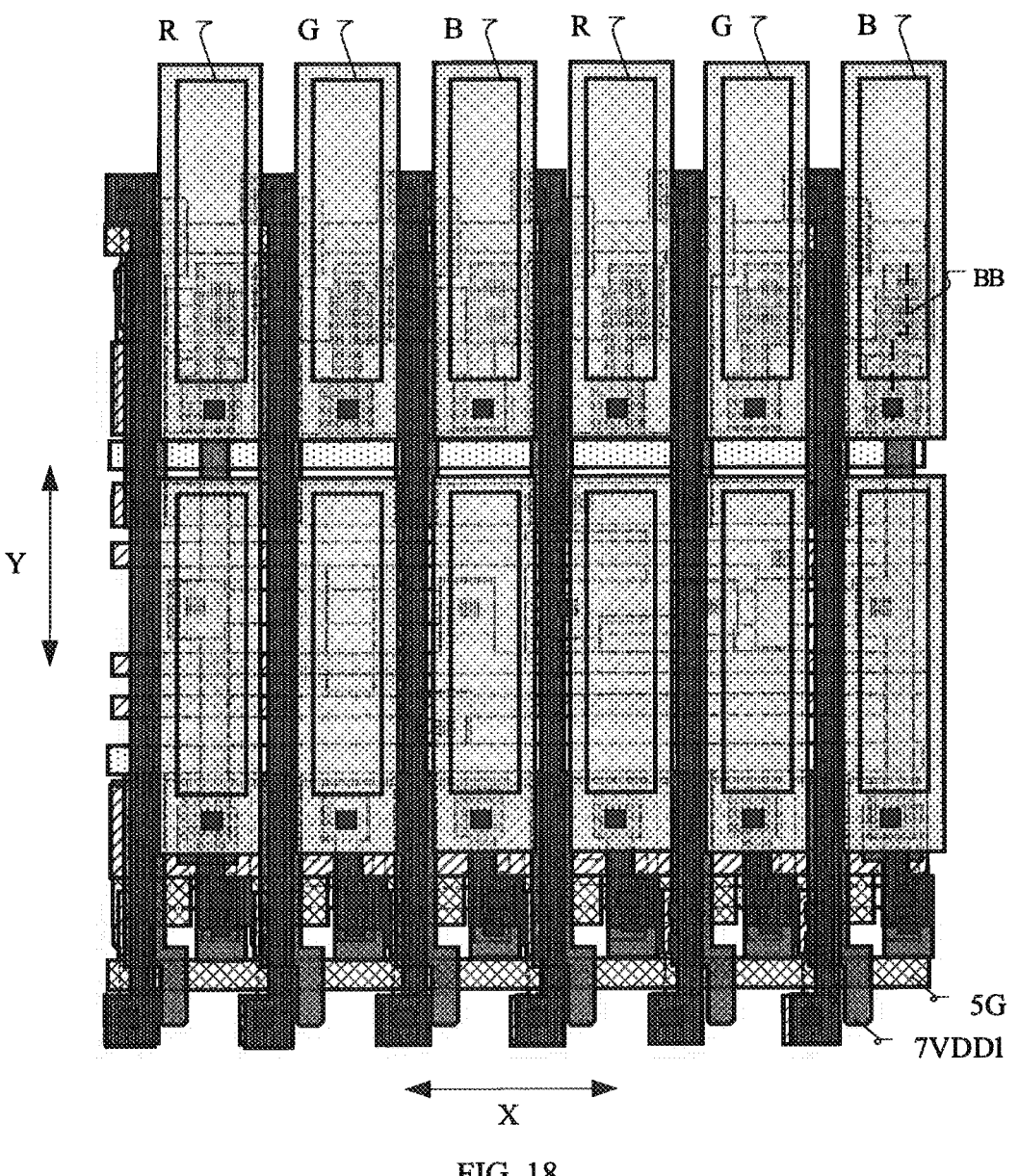
FIG. 18 is a structural layout of in an exemplary embodiment of the display panel of the present disclosure.
Figure 19:
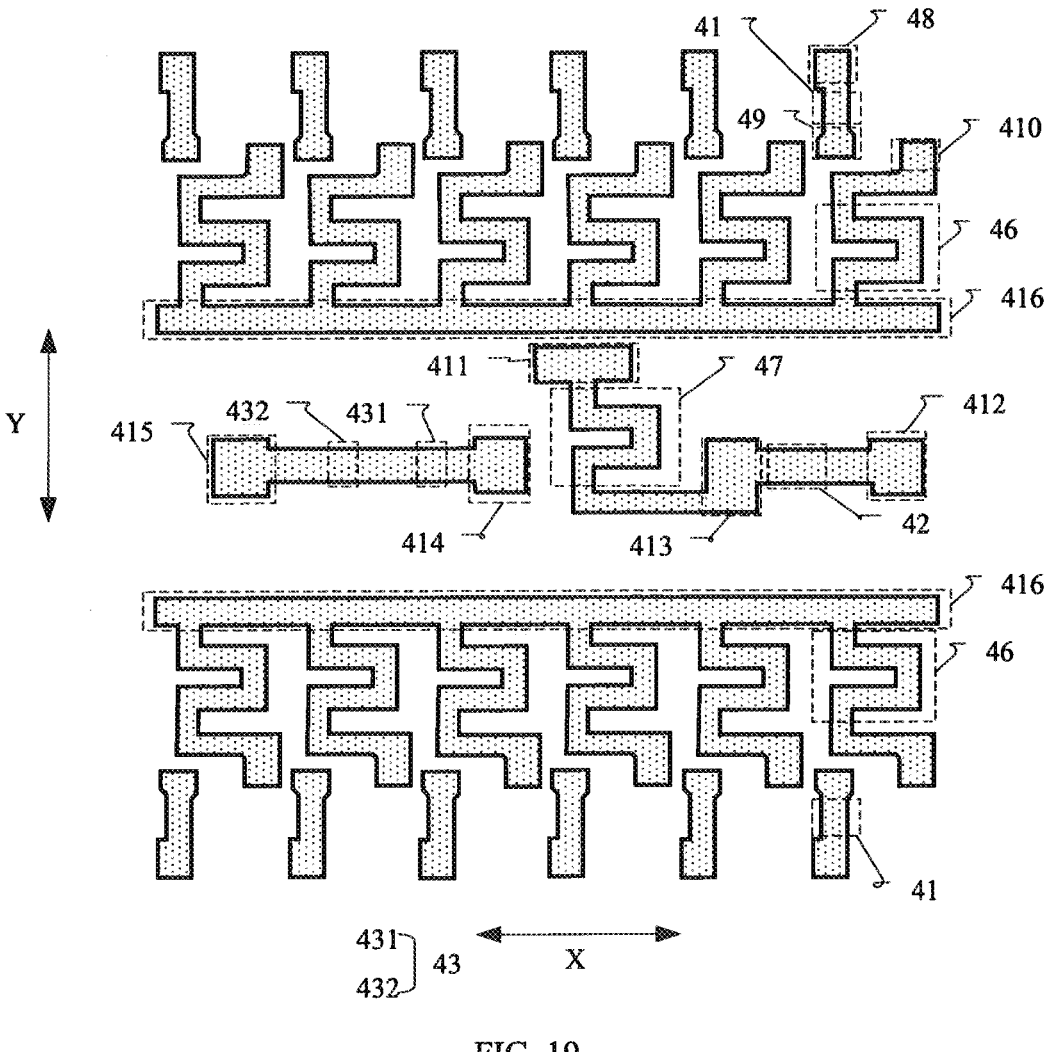
FIG. 19 is a structural layout of the active layer in FIG. 18.

As shown in FIGS. 18, 19, and 25, the active layer in this exemplary embodiment may have the same structure as the active layer in the display panel shown in FIG. 4. The active layer may include a first active part 41, a second active part 42, a third active part 43, a sixth active part 46, a seventh active part 47, an eighth active part 48, a ninth active part 49, a tenth active part 410, an eleventh active part 411, a twelfth active part 412, a thirteenth active part 413, a fourteenth active part 414, a fifteenth active part 415, and an active line 416. The active layer may be formed of polysilicon material. Correspondingly, the first transistor T1, the second transistor T2, the third transistor T3, the driving transistor DT, and the analog transistor DTd may be P-type low-temperature polysilicon thin film transistors.

As shown in FIGS. 18, 20, and 25, the first conductive layer in this exemplary embodiment may have the same structure as the first conductive layer in the display panel shown in FIG. 4. The first conductive layer may include a gate line 5G, a sixth gate part 56, a second gate part 52, a third gate part 53, and a seventh gate part 57. In this exemplary embodiment, the display panel can also use the first conductive layer as a mask to perform conductive treatment on the active layer. That is, the area covered by the first conductive layer in the active layer can form the channel region of the transistor. The area not covered by not covered by the first conductive layer in the active layer forms a conductor structure.

As shown in FIGS. 18, 21, and 26, in this exemplary embodiment, the second conductive layer may include: a first conductive part 61, a second conductive part 62, a third conductive part 63, a power line VDD, an enable signal line EM, a reference signal line Vref, and a reset signal line Re. The only difference between the second conductive layer in this exemplary embodiment and the second conductive layer in the display panel shown in FIG. 4 is that, in this exemplary embodiment, the orthographic projection of the power line VDD on the substrate is dimensionally homogeneous in the column direction Y.

As shown in FIGS. 18, 22, and 27, the third conductive layer may include a first bridge part 71, a second bridge part 72, a third bridge part 73, and a power connection line segment 7VDD1. The first bridge part 71 can be respectively connected to the twelfth active part 412 and the first conductive part 61 located in the two rows of pixel driving circuits through via holes to connect the second electrode of the second transistor T2 and the second electrode of the first capacitor C1. The second bridge part 72 can be respectively connected to the fifteenth active part 415 and the first conductive part 61 located in the two rows of pixel driving circuits through via holes to connect the second electrode of the third transistor T3 and the second electrode of the first capacitor C1. The third bridge part 73 may be connected to the tenth active part 410 through a via hole to connect the second electrode of the driving transistor DT. The orthographic projection of the power connection line segment 7VDD1 on the substrate can extend along the column direction Y, and the power connection line segment 7VDD1 can be connected to a power line VDD through a via hole. The orthographic projection of the same power connection line segment 7VDD1 on the substrate can overlap with the orthographic projection of the first conductive part 61 in the two adjacent rows of pixel driving circuits on the substrate, and the two adjacent rows of the pixel driving circuits are respectively located in adjacent driving units in the column direction. FIG. 22 only shows part of the structure of the complete power connection line segment 7VDD1. The power connection line segment 7VDD1 in the upper row of pixel driving circuits in FIG. 22 only shows the lower half of the complete power connection line segment 7VDD1. The lower row of pixel driving circuits in FIG. 22 only shows the upper half of the complete power connection line segment 7VDD1. The structure and connection relationship of the upper half of the power connection line segment 7VDD1 in the upper row of the pixel driving circuits in FIG. 22 can be the same as the upper half of the power connection line segment 7VDD1 in the lower row of the pixel driving circuits in FIG. 22. Similarly, the structure and connection relationship of the lower half of the power connection line segment 7VDD1 in the lower row of the pixel driving circuits in FIG. 22 can be the same as the lower half of the power connection line segment 7VDD1 in the upper row of the pixel driving circuits in FIG. 22. In addition, the orthographic projection of the power connection line segment 7VDD1 on the substrate may overlap with the orthographic projection of the first conductive part 61 on the substrate, and the power connection line segment 7VDD1 may be configured to form the first electrode of the second capacitor.

As shown in FIGS. 18, 22, and 27, in the driving unit, the orthographic projection of the reference signal line Vref on the substrate is located between the orthographic projection of the enable signal line EM on the substrate and the orthographic projection of the reset signal line Re on the substrate. The orthographic projection of the power connection line segment 7VDD1 on the substrate may be located between the orthographic projections of adjacent reset signal line Re and enable signal line EM in adjacent driving units in the column direction. The adjacent reset signal line Re and enable signal line EM may refer to reset signal line Re and enable signal line EM between which no other reset signal lines Re or enable signal lines EM are disposed. That is, the orthographic projection of the power connection line segment 7VDD1 on the substrate does not overlap with the orthographic projection of the EM on the substrate, the orthographic projection of the reset signal line Re on the substrate, and the orthographic projection of the reference signal line Vref on the substrate. This setting can reduce the parasitic capacitance of the enable signal line EM, the reset signal line Re, and the reference signal line Vref, thereby improving the charging efficiency of the enable signal line EM, the reset signal line Re, and the reference signal line Vref.

As shown in FIGS. 18, 23, and 28, the fifth conductive layer may include: a data line Da and a fifth bridge part 95. The orthographic projection of the data line Da on the substrate may extend along the column direction Y, and the data line Da may be configured to provide a data signal terminal. The data line Da may be connected to the second conductive part 62 through a via hole to connect the first electrode of the first transistor T1. The overlapping part of the orthographic projection of the sixth gate part 56 on the substrate and the orthographic projection of the data line Da on the substrate may overlap with the orthographic projection of the power connection line segment 7VDD1 on the substrate. That is, the power connection line segment 7VDD1 is shielded between the sixth gate part 56 and the data line Da. And/or, the overlapping part of the orthographic projection of the first conductive part 61 on the substrate and the orthographic projection of the data line Da on the substrate can overlap with the orthographic projection of the power connection line segment 7VDD1 on the substrate overlap. That is, the power connection line segment 7VDD1 is shielded between the first conductive part 61 and the data line Da. The power connection line segment 7VDD1 can shield the noise influence of the data line Da on the sixth gate part 56 and the first conductive part 61, thereby improving the stability of the gate voltage of the driving transistor.

As shown in FIGS. 18 and 24, the electrode layer may include a plurality of electrode parts: a first electrode part R, a second electrode part B, and a third electrode part G. Each electrode part may be connected to the fifth bridge part 95 through a via hole to connect the second electrode of the driving transistor DT. The first electrode part R may be configured to form the first electrode of the red light-emitting unit, the second electrode part B may be configured to form the first electrode of the blue light-emitting unit, and the third electrode part G may be configured to form the first electrode of the green light-emitting unit. electrode. In this exemplary embodiment, the light-emitting unit L may be a Real RGB distribution. For example, the first electrode part R, the third electrode part G, and the second electrode part B are distributed alternately in the row direction, and the electrode parts of the same color are located in the same column. As shown in FIG. 18, the orthographic projection of the electrode part on the substrate is located between the orthographic projections of two adjacent data lines Da on the substrate. On the one hand, this arrangement can avoid the influence of the data line Da on the flatness of the electrode part. On the other hand, this arrangement can reduce the noise influence of the data line Da on the electrode part. The display panel may further include a pixel definition layer located on the side of the electrode layer facing away from the substrate. A pixel opening for forming the light-emitting unit is formed on the pixel definition layer. The orthographic projection of the first electrode part R on the substrate coincides with the orthographic projection of the corresponding pixel opening on the pixel definition layer on the substrate. The orthographic projection of the second electrode part B on the substrate coincides with the orthographic projection of the corresponding pixel opening on the pixel definition layer on the substrate. The orthographic projection of the third electrode part G on the substrate coincides with the orthographic projection of the corresponding pixel opening on the pixel definition layer on the substrate.

As shown in FIG. 29, it is a partial cross-sectional view of the display panel shown in FIG. 18 taken along the dotted line BB. The display panel may further include a first insulating layer 102, a second insulating layer 103, a first dielectric layer 104, a second dielectric layer 106, and a planarization layer 107. The substrate 101, the active layer, the first insulating layer 102, the first conductive layer, the second insulating layer 103, the second conductive layer, the first dielectric layer 104, the third conductive layer, the second dielectric layer 106, the fifth conductive layer, the planarization layer 107, and the electrode layer are stacked in sequence. The first insulating layer 102 and the second insulating layer 103 may have a single-layer structure or a multi-layer structure, and the material of the first insulating layer 102 and the second insulating layer 103 may be at least one of silicon nitride, silicon oxide, and silicon oxynitride. The first dielectric layer 104 and the second dielectric layer 106 can be silicon nitride layers. The material of the planarization layer 107 can be an organic material, such as polyimide (PI), polyethylene terephthalate ester (PET), polyethylene naphthalate (PEN), silicon on glass (SOG) and other materials. The substrate 101 may include a glass substrate, a barrier layer, and a polyimide layer that are stacked in sequence. The barrier layer may be an inorganic material. The material of the first conductive layer and the second conductive layer may be an alloy or one of molybdenum, aluminum, copper, titanium, and niobium, or a molybdenum/titanium alloy or laminate. The material of the third conductive layer and the fifth conductive layer may include a metal material. For example, it may be an alloy or one of molybdenum, aluminum, copper, titanium, and niobium, or a molybdenum/titanium alloy or laminate, or it may be titanium/aluminum/titanium laminate. The electrode layer may include an indium tin oxide layer and a silver layer. The sheet resistance of any one of the first conductive layer and the second conductive layer may be greater than the sheet resistance of any one of the fourth conductive layer and the third conductive layer.

Figure 30:
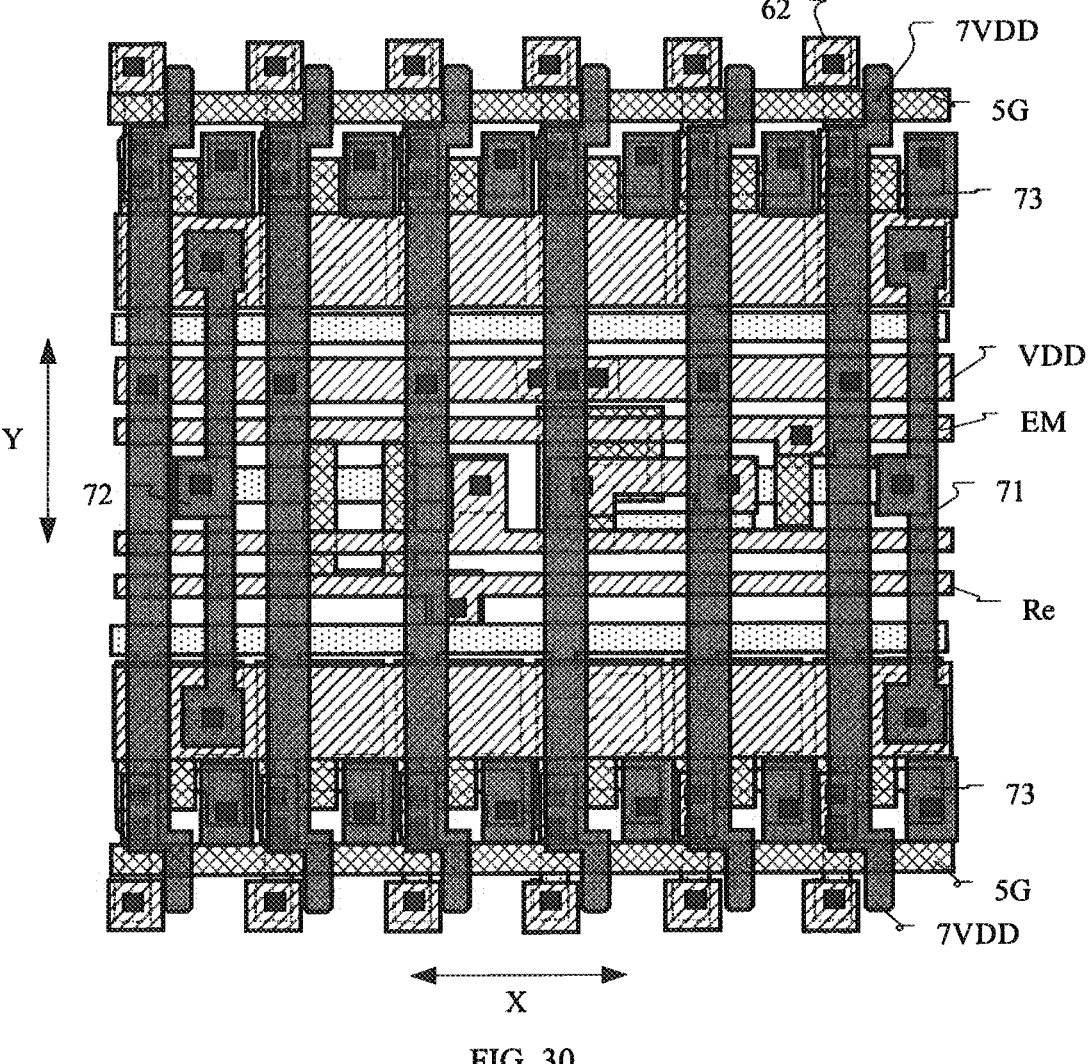
FIG. 30 is a structural layout of another exemplary embodiment of the display panel of the present disclosure.

As shown in FIG. 30, it is a structural layout of another exemplary embodiment of the display panel of the present disclosure. It is different from the display panel shown in FIG. 18 is that the power connection line segments 7VDD1 distributed in the column direction Y in the display panel shown in FIG. 30 are connected to each other to form the power connection line 7VDD. The power connection line 7VDD can form a grid structure with the power line VDD to reduce the self-resistance of the power line.

Figure 31:
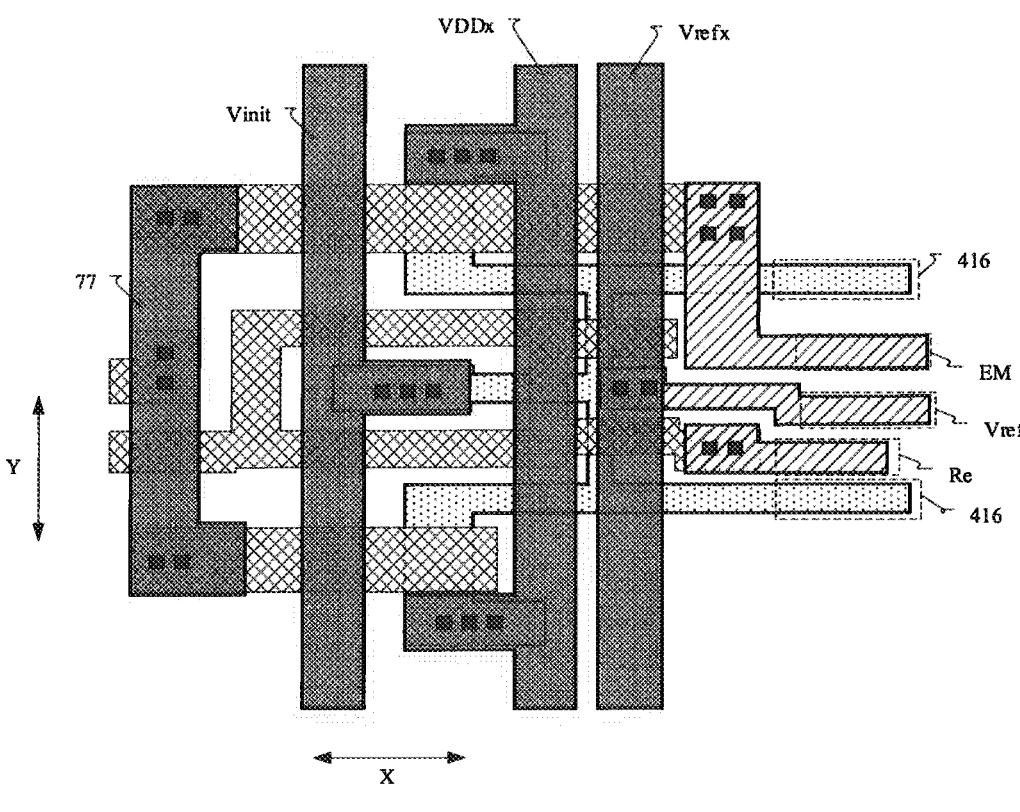
FIG. 31 is a structural layout of in an exemplary embodiment of the display panel of the present disclosure.
Figure 32:
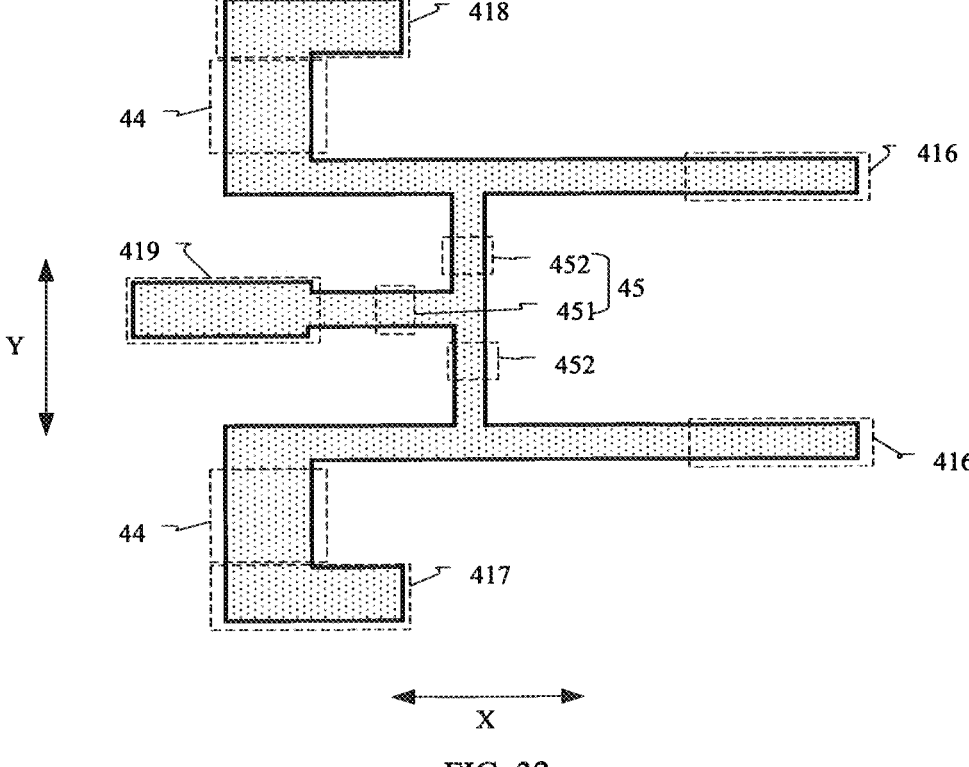
FIG. 32 is a structural layout of the active layer in FIG. 31.
Figures 33, 34:
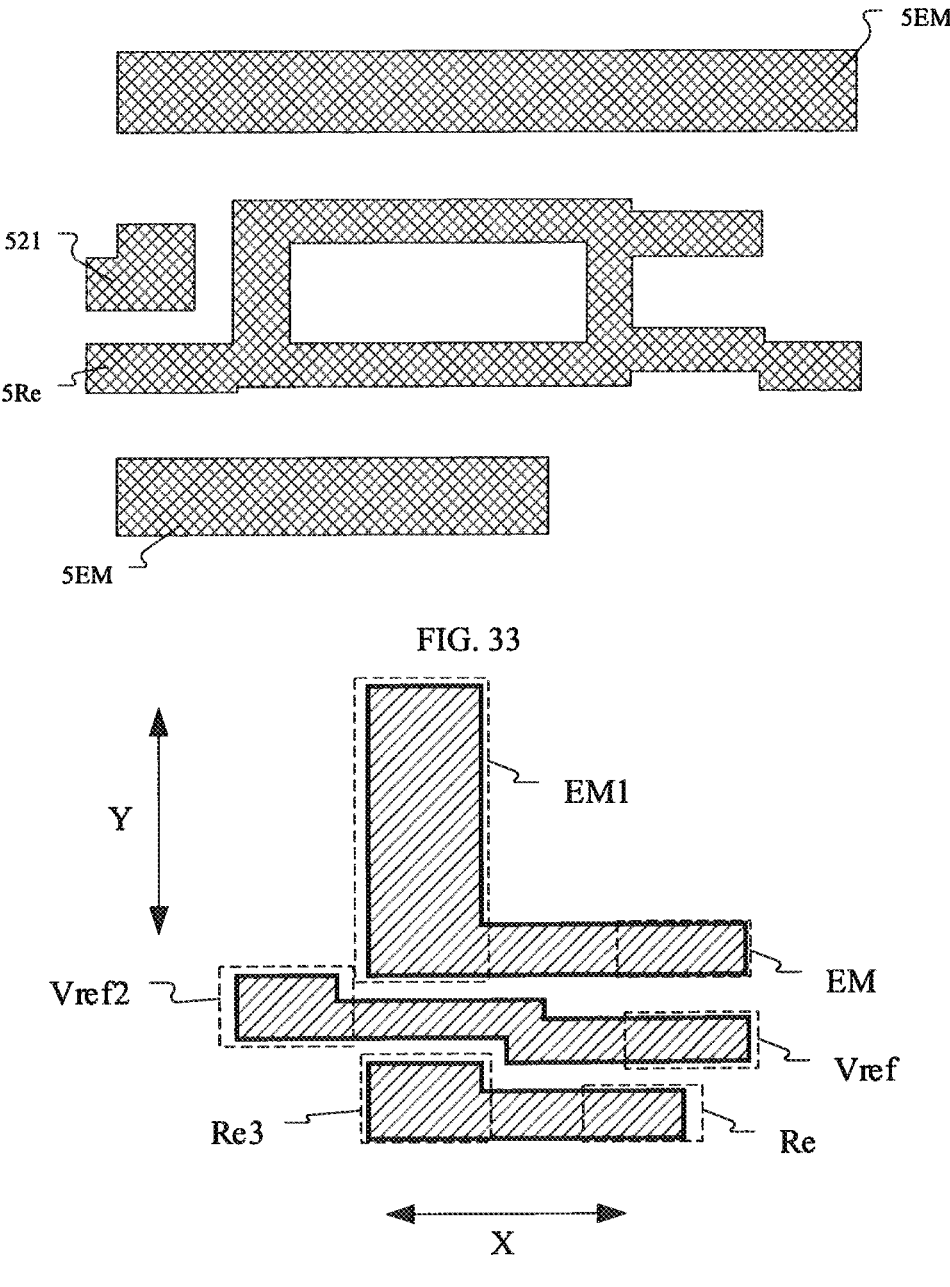
FIG. 33 is a structural layout of the first conductive layer in FIG. 31.
FIG. 34 is a structural layout of the second conductive layer in FIG. 31.
Figures 35, 36:
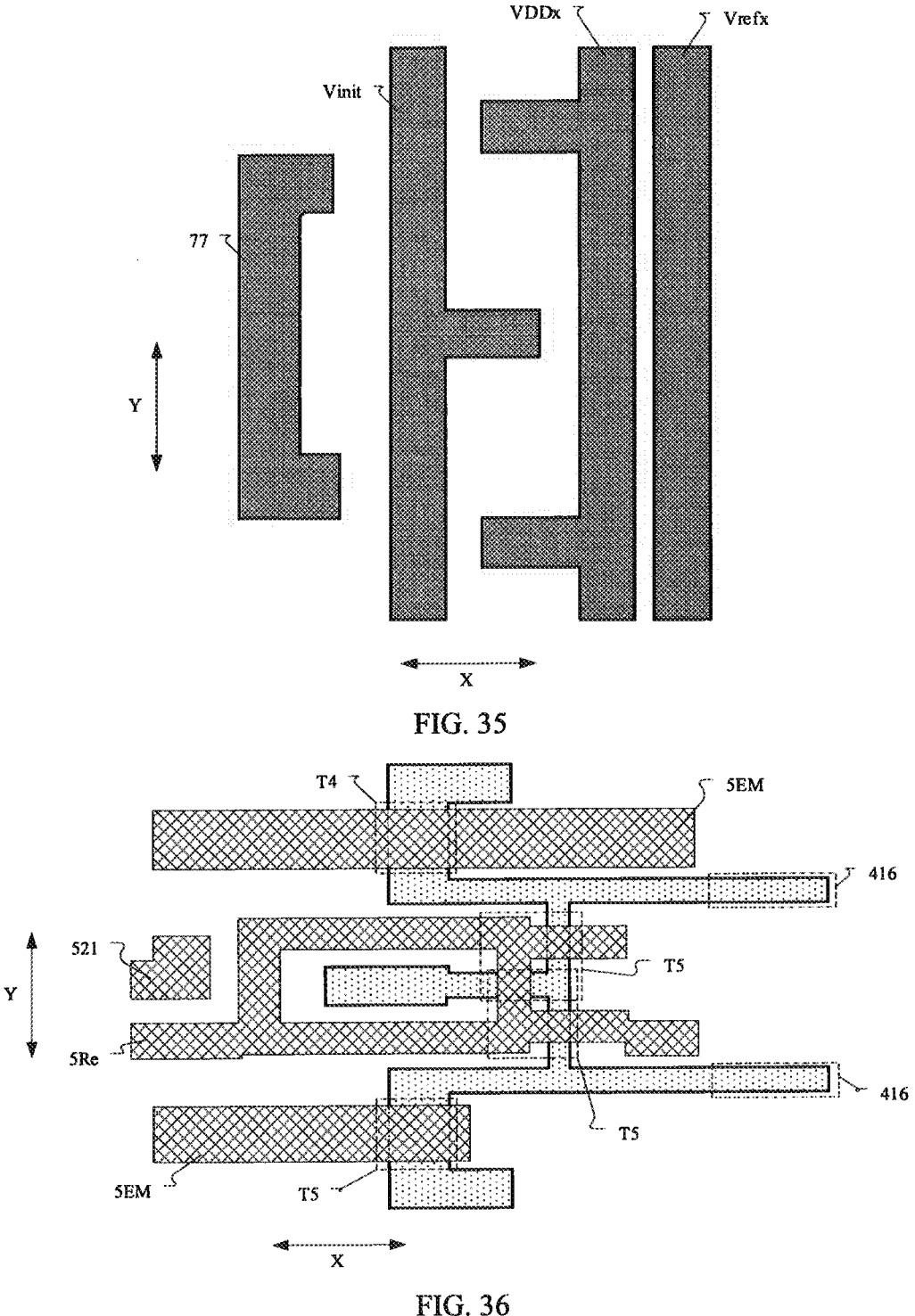
FIG. 35 is a structural layout of the third conductive layer in FIG. 31.
FIG. 36 is a structural layout of the active layer and the first conductive layer in FIG. 31.
Figure 37:
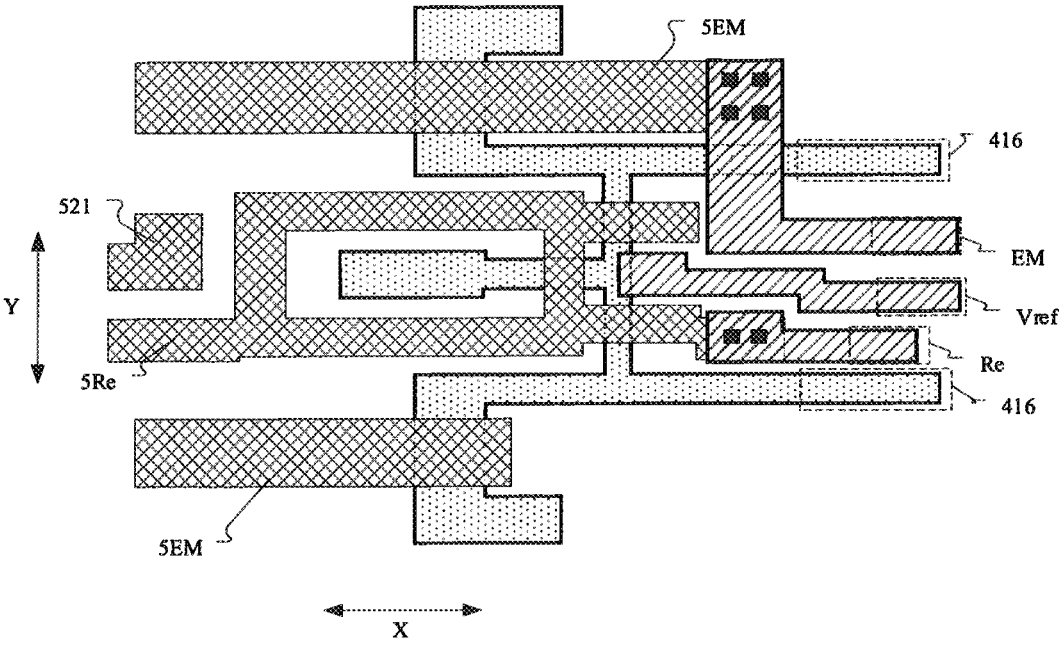
FIG. 37 is a structural layout of the active layer, the first conductive layer, and the second conductive layer in FIG. 31.

As shown in FIGS. 31 to 37, FIG. 31 is a structural layout in an exemplary embodiment of the display panel of the present disclosure. FIG. 31 shows a schematic structural diagram of the fourth transistor T4 and the fifth transistor T5 in FIG. 2. The structures of the fourth transistor and the fifth transistor shown in FIG. 31 can be applied to the display panels shown in FIG. 4, FIG. 18, and FIG. 30. Each row of pixel driving circuits may be provided with two sets of fourth transistors and fifth transistors, and the two sets of fourth transistors and fifth transistors may be respectively located on both sides of the row of pixel driving circuits in the row direction X. FIG. 31 only shows the structure of the fourth transistor and the fifth transistor on one side of the pixel driving circuit row in the row direction X. FIG. 32 is a structural layout of the active layer in FIG. 31. FIG. 33 is a structural layout of the first conductive layer in FIG. 31. FIG. 34 is a structural layout of the second conductive layer in FIG. 31. FIG. 35 is a structural layout of the third conductive layer in FIG. 31. FIG. 36 is a structural layout of the active layer and the first conductive layer in FIG. 31. FIG. 37 is the structural layout of the active layer, the first conductive layer and the second conductive layer in FIG. 31.

As shown in FIGS. 31, 32, and 36, the active layer may further include a fourth active part 44, a fifth active part 45, an eighteenth active part 418, and a nineteenth active part 419. The two active lines 416 in FIG. 32 are two active lines in the same row of driving unit. The fourth active part 44 may be configured to form a channel region of the fourth transistor. The fifth active part 45 may be configured to form a channel region of the fifth transistor T5. The fifth active part 45 may include a third active sub-part 451 and a fourth active sub-part 452. The fifth active parts 45 on the same side of two rows of pixel driving circuits in the same row of the driving unit may share the third active sub-part. The eighteenth active part 418 is connected to a side of the fourth active part 44 away from the fifth active part 45, and the nineteenth active part 419 is connected to a side of the fifth active part 45 away from the fourth active part 44.

As shown in FIGS. 31, 33, and 36, the first conductive layer may further include a fifth gate part 5Re, a first transfer part 521, and a fourth gate part 5EM. The orthographic projection of the fourth gate part 5EM on the substrate covers the orthographic projection of the fourth active part 44 on the substrate. At least part of the structure of the fourth gate part 5EM is configured to form gate of the fourth transistor T4. The orthographic projection of the fifth gate part 5Re on the substrate covers the orthographic projection of the fifth active part 45 on the substrate. At least part of the structure of the fifth gate part 5Re is used to form the gate of the fifth transistor T5. The first transfer part 521 is configured to provide the required enable signal for the enable signal line.

As shown in FIGS. 31, 34, and 37, the second conductive layer may further include a first connection part EM1, a second connection part Vref2, and a third connection part Re3. The enable signal line EM, the reference signal line Vref, and the reset signal line Re shown in FIG. 34 are the enable signal line EM, the reference signal line Vref, and the reset signal line Re in the same row of driving units. The first connection part EM1 is connected to the enable signal line EM, and the first connection part EM1 can be connected to the fourth gate part 5EM through a via hole. The second connection part Vref2 is connected to the reference signal line Vref. The third connection part Re3 is connected to the reset signal line Re, and the third connection part Re3 is connected to the fifth gate part 5Re through a via hole.

As shown in FIGS. 31 and 35, the third conductive layer may include a seventh bridge part 77, an initial signal line Vinit, a first power extension line VDDx, and a reference signal extension line Vrefx. The seventh bridge part 77 may connect the first transfer part 521 and the fourth gate part 5EM through via holes respectively. The orthographic projection of the initial signal line Vinit on the substrate, the orthographic projection of the first power extension line VDDx on the substrate, and the orthographic projection of the reference signal extension line Vrefx on the substrate can all extend along the column direction Y. The initial signal line Vinit may provide an initial signal terminal, and the initial signal line Vinit may be connected to the nineteenth active part 419 through a via hole to connect the first electrode of the fifth transistor and the initial signal terminal. The first power extension line VDDx may be connected to the power line VDD, and the first power extension line VDDx may be connected to the eighteenth active part 418 through a via hole to connect the first electrode of the fourth transistor and the first power terminal. The reference signal extension line Vrefx may be connected to the second connection part Vref2 through a via hole to connect the reference signal line Vref.

Figure 38:
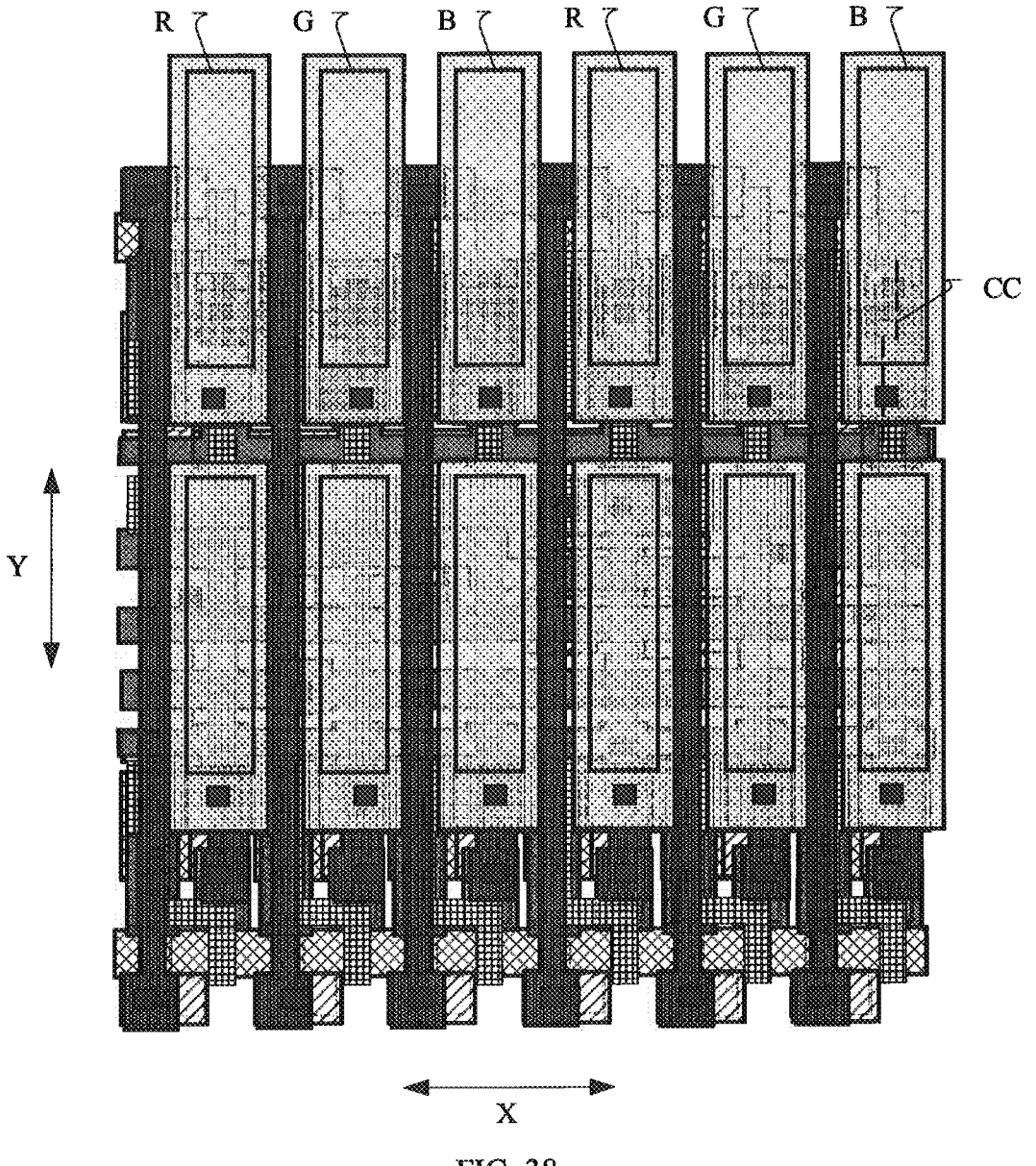
FIG. 38 is a structural layout of in an exemplary embodiment of the display panel of the present disclosure.
Figure 39:
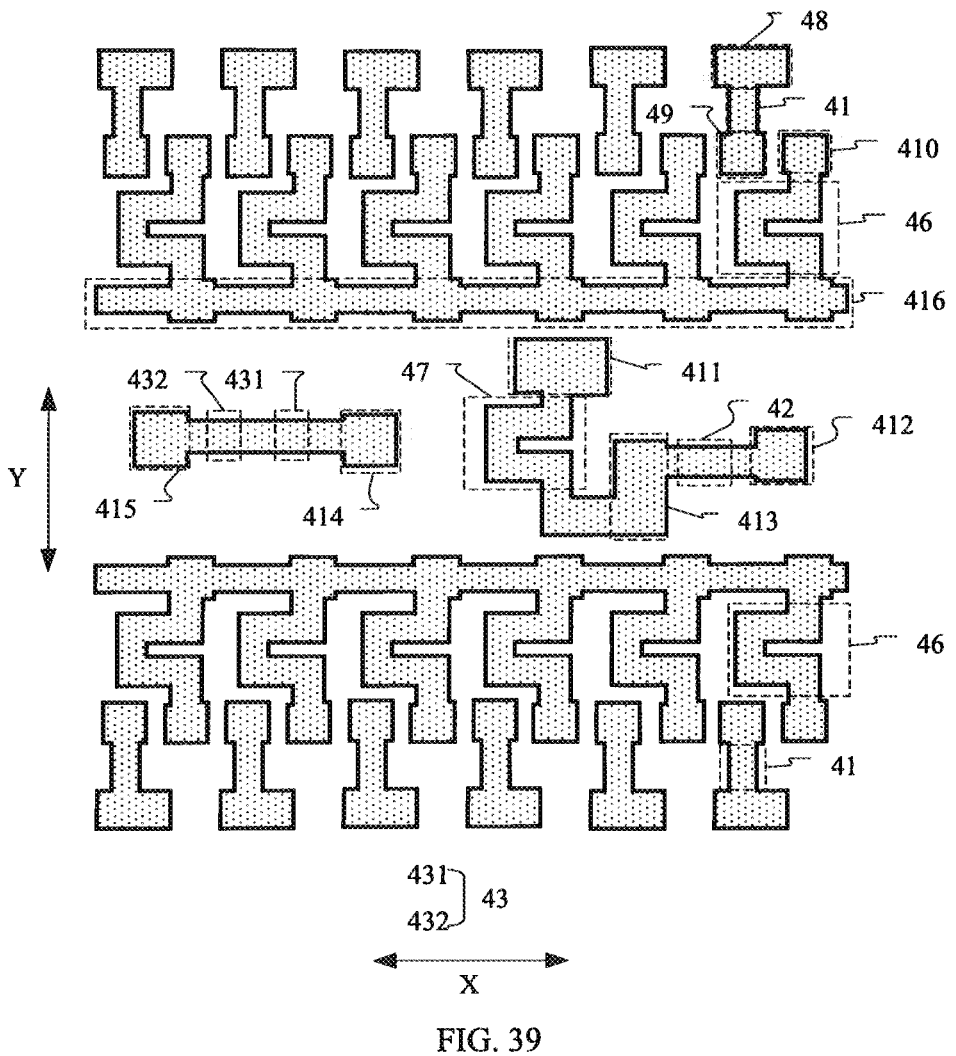
FIG. 39 is a structural layout of the active layer in FIG. 38.
Figure 40:
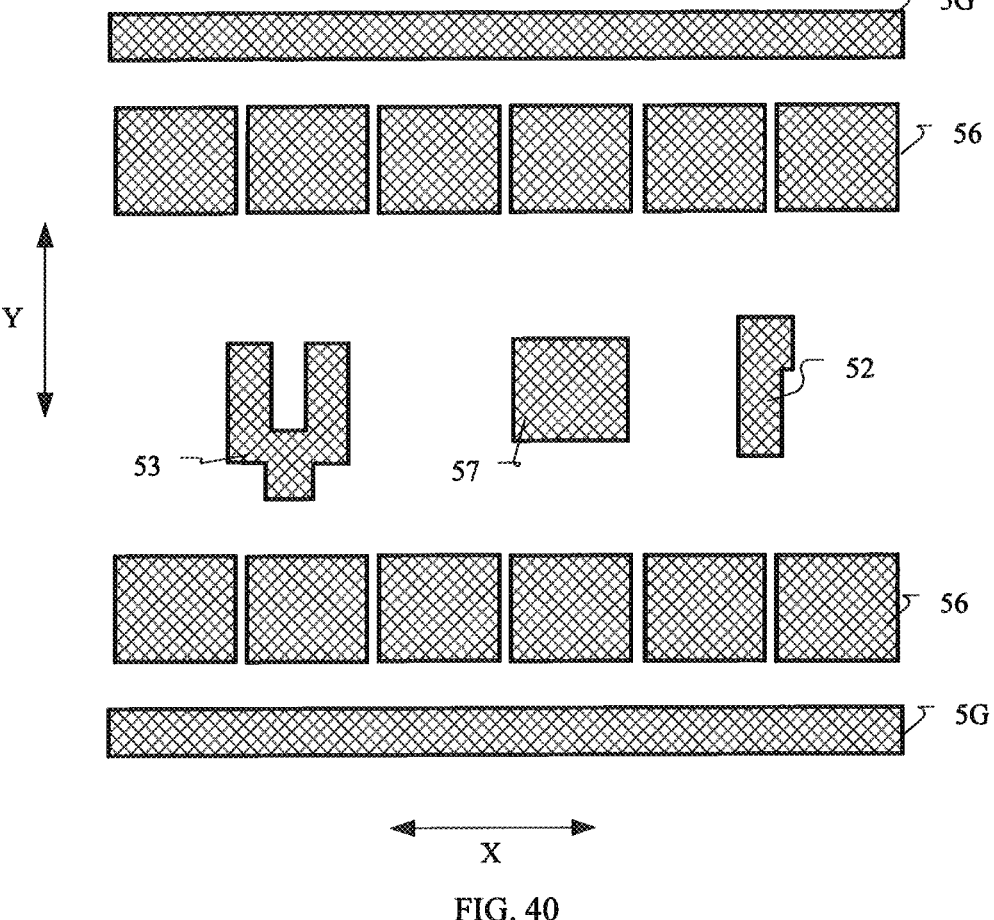
FIG. 40 is a structural layout of the first conductive layer in FIG. 38.
Figure 41:
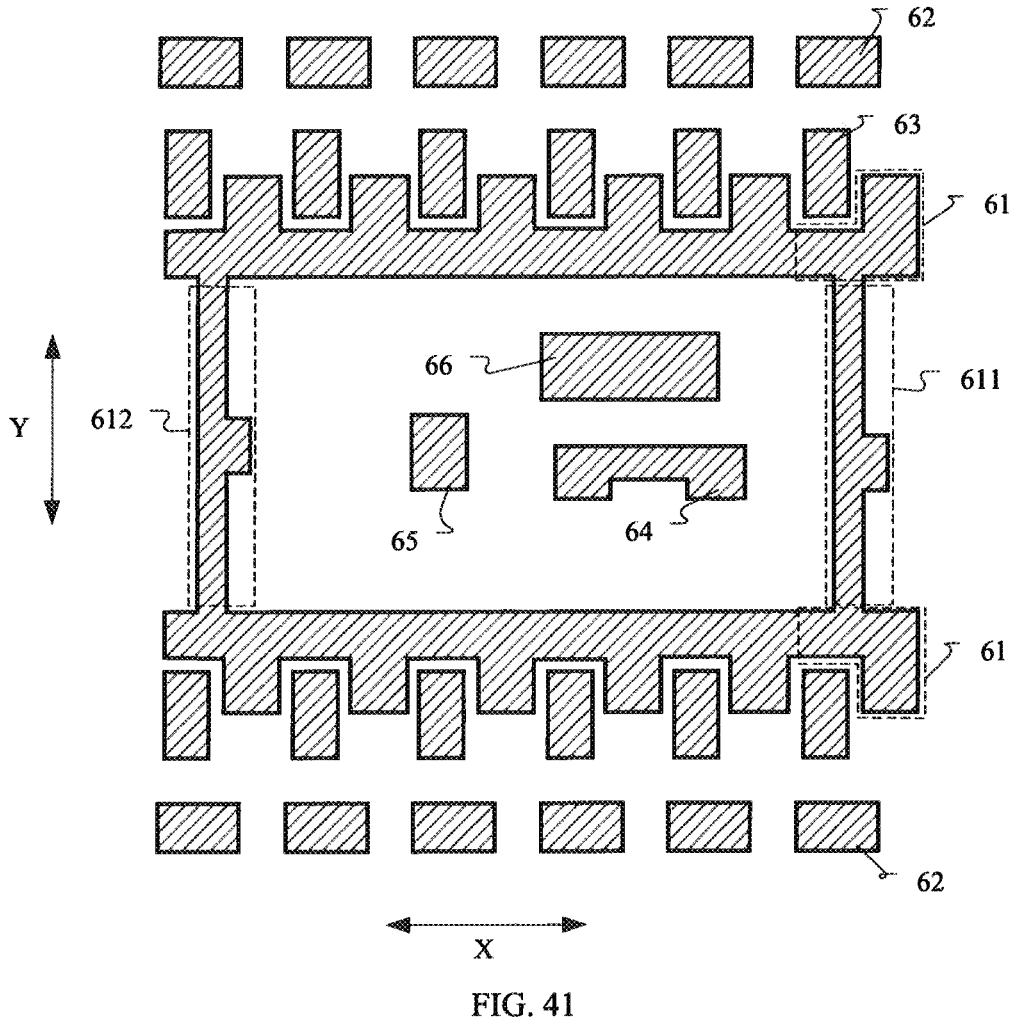
FIG. 41 is a structural layout of the second conductive layer in FIG. 38.
Figure 42:
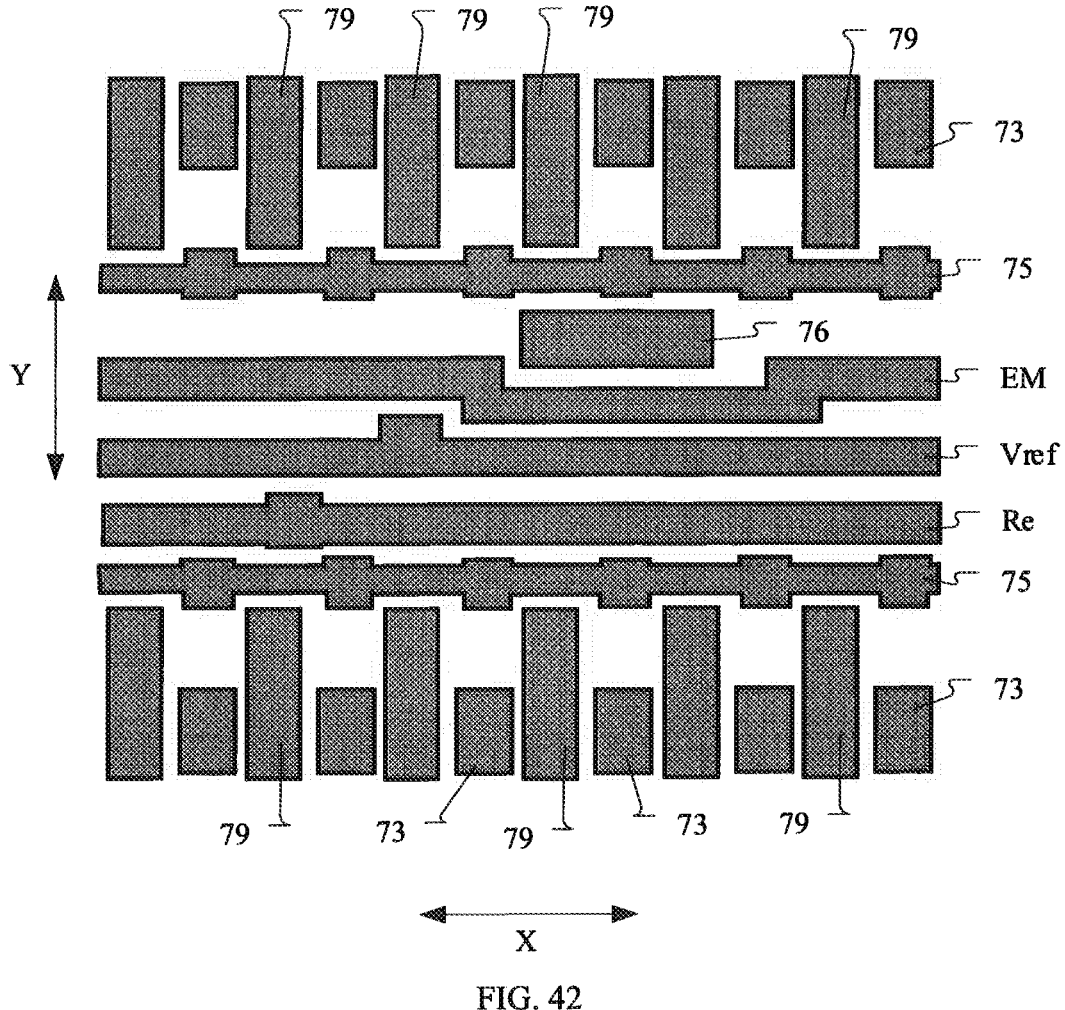
FIG. 42 is a structural layout of the third conductive layer in FIG. 38.
Figure 43:
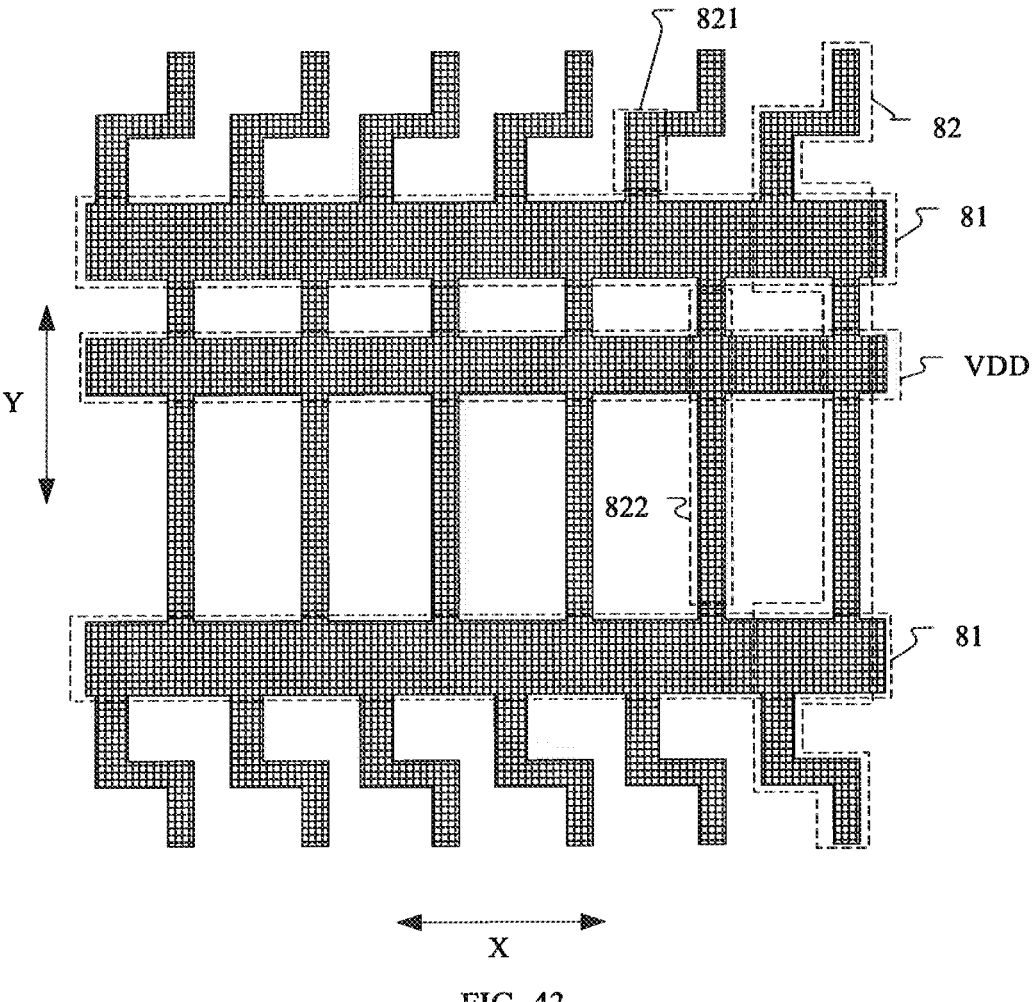
FIG. 43 is a structural layout of the fourth conductive layer in FIG. 38.
Figure 44:
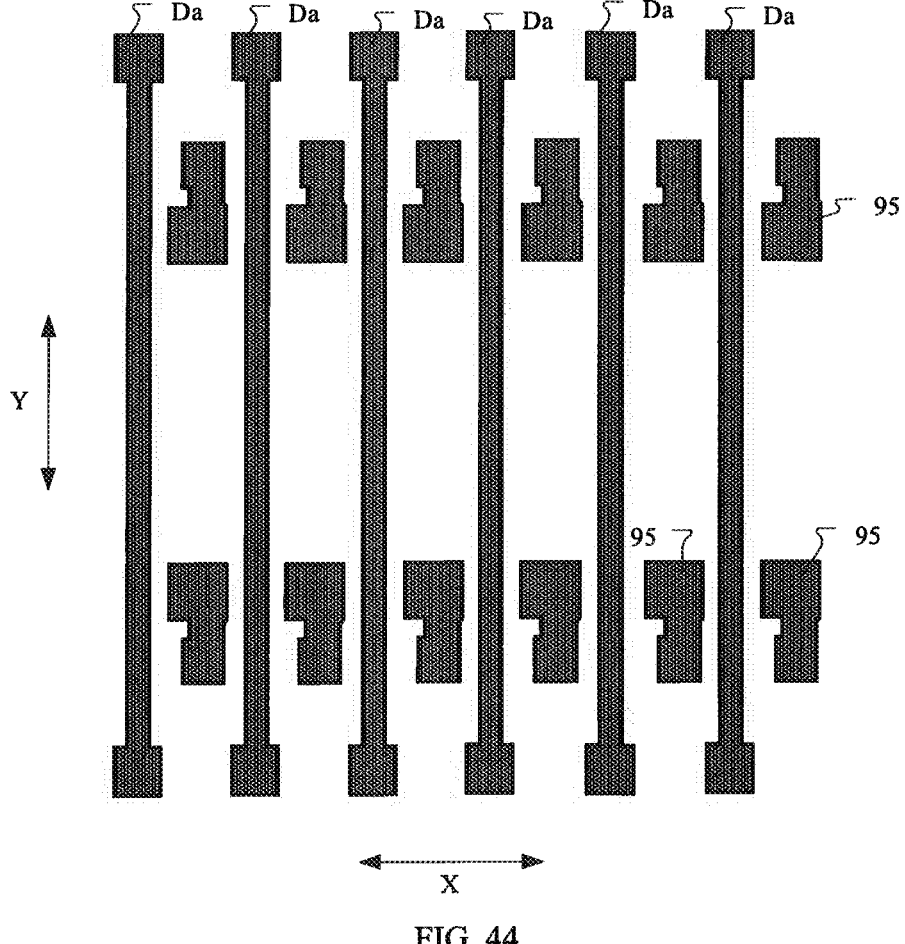
FIG. 44 is a structural layout of the fifth conductive layer in FIG. 38.
Figure 45:
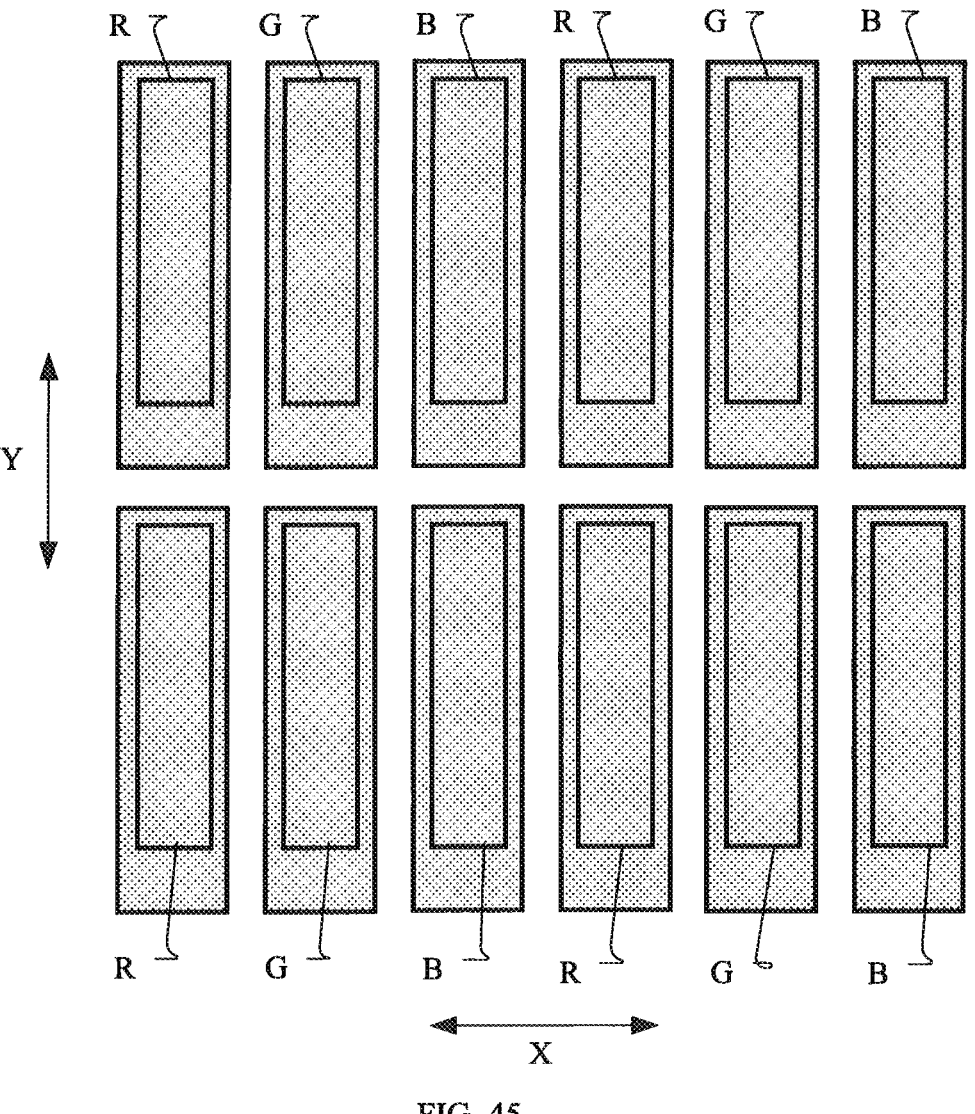
FIG. 45 is a structural layout of the electrode layer in FIG. 38.
Figure 46:
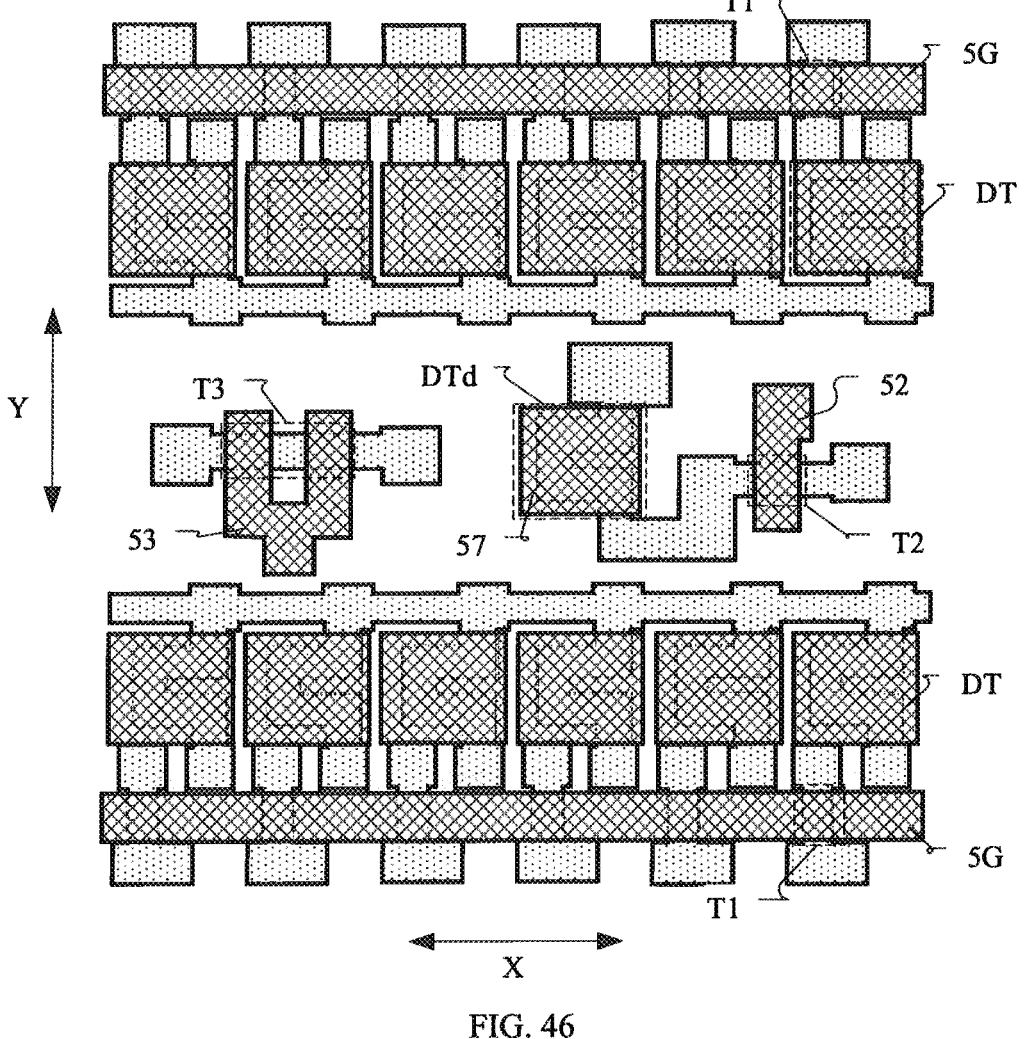
FIG. 46 is a structural layout of the active layer and the first conductive layer in FIG. 38.
Figure 47:
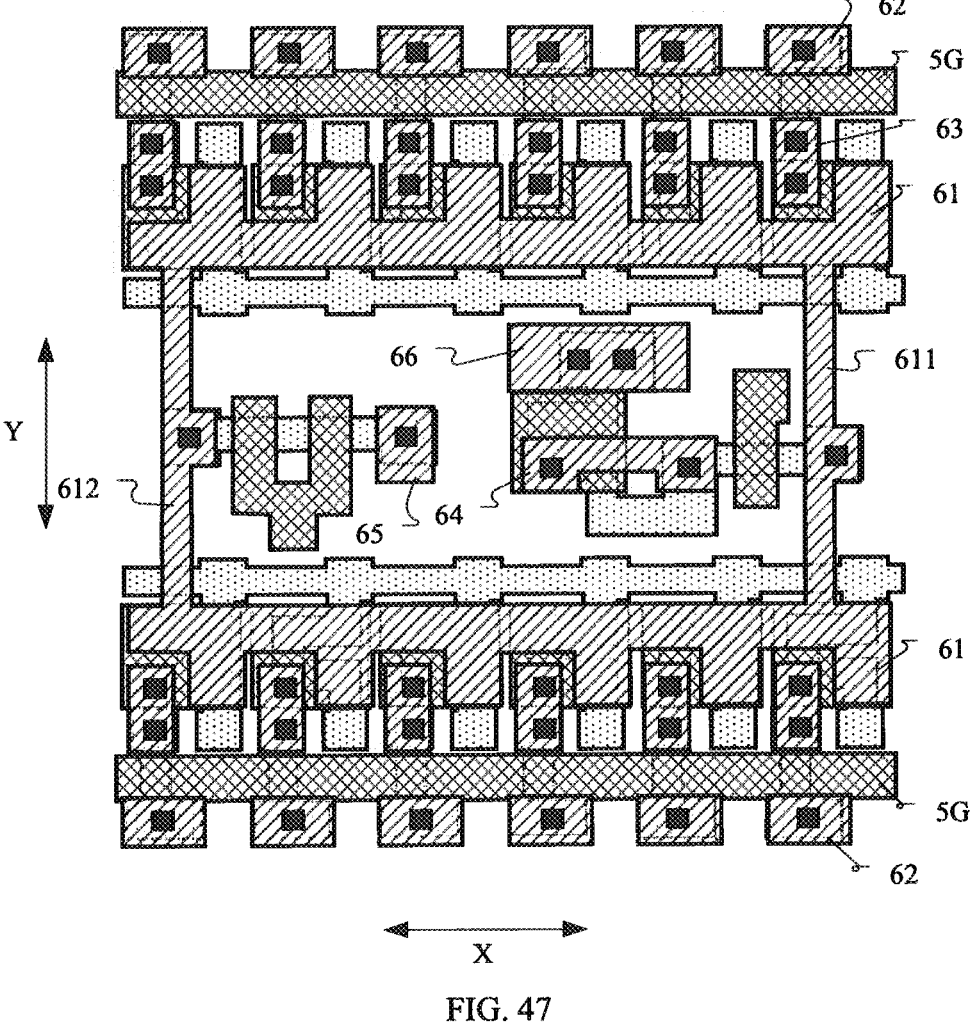
FIG. 47 is a structural layout of the active layer, the first conductive layer, and the second conductive layer in FIG. 38.
Figure 48:
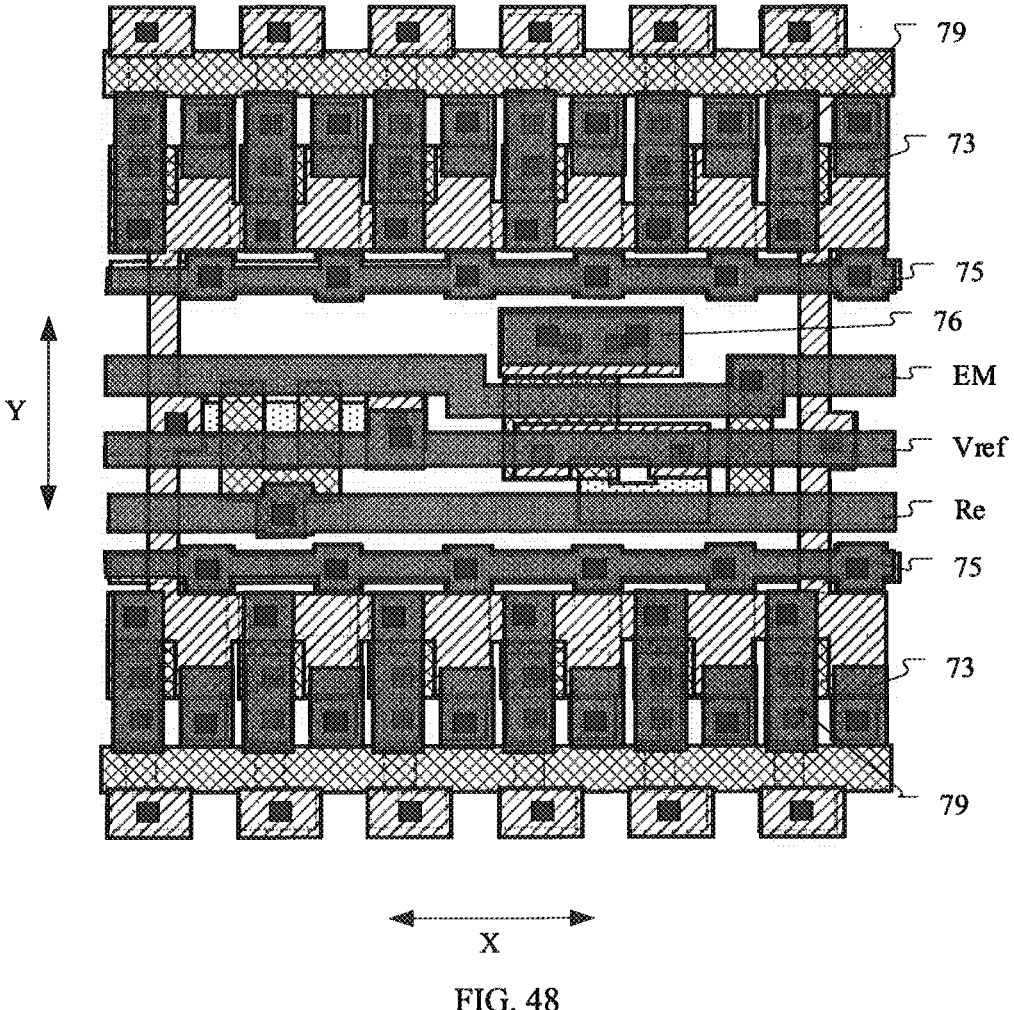
FIG. 48 is a structural layout of the active layer, the first conductive layer, the second conductive layer, and the third conductive layer in FIG. 38.
Figure 49:
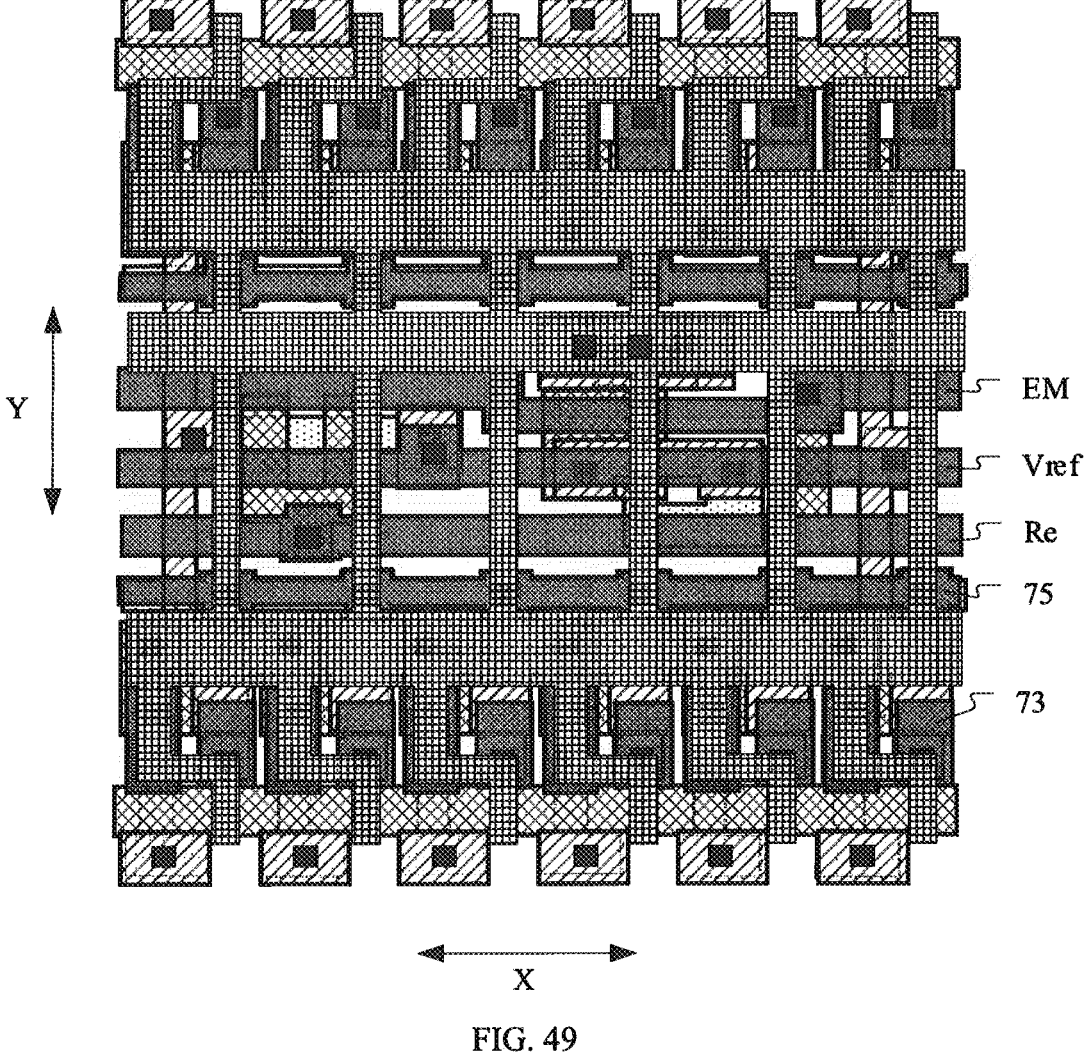
FIG. 49 is a structural layout of the active layer, the first conductive layer, the second conductive layer, the third conductive layer and the fourth conductive layer in FIG. 38.
Figure 50:
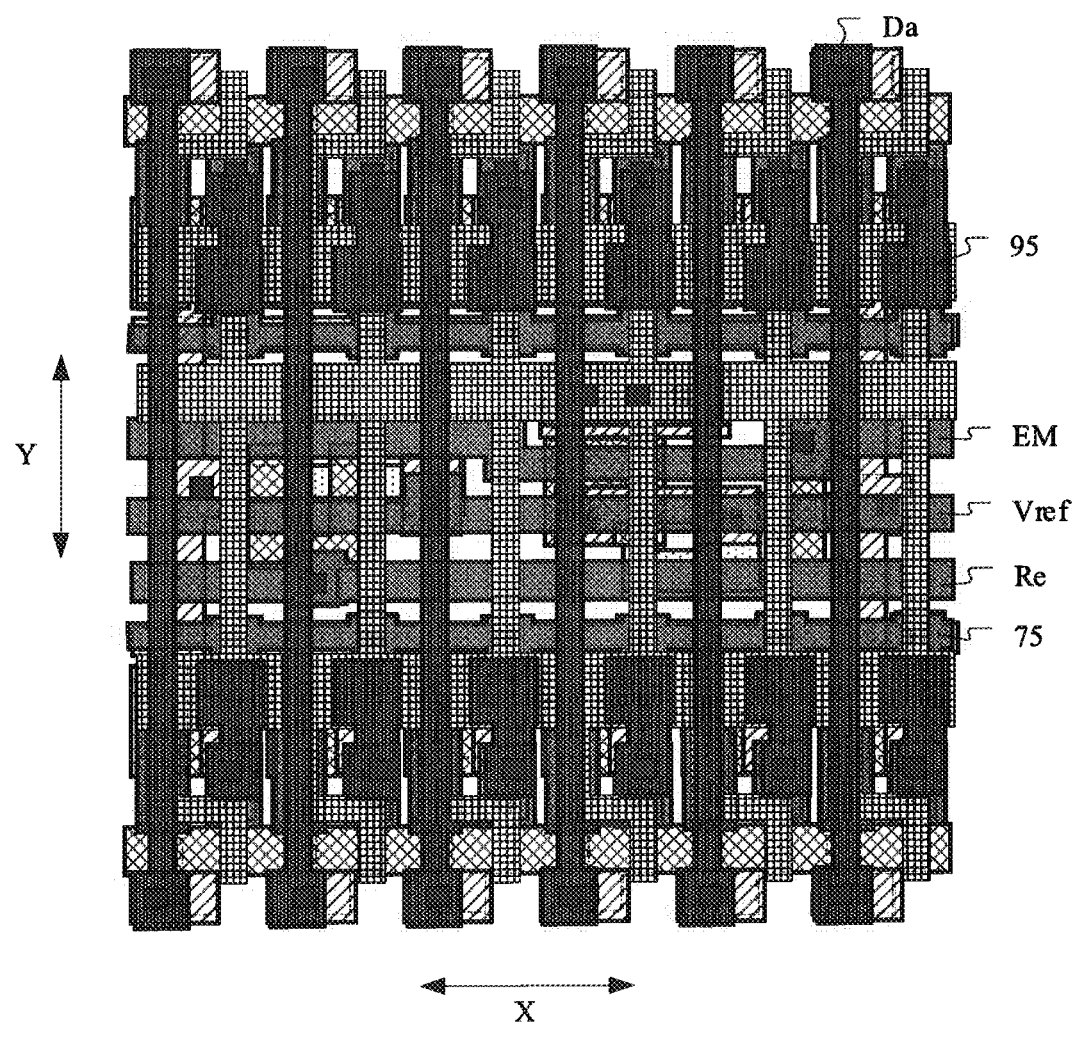
FIG. 50 is a structural layout of the active layer, the first conductive layer, the second conductive layer, the third conductive layer, the fourth conductive layer and the fifth conductive layer in FIG. 38.

This exemplary embodiment also provides another display panel, as shown in FIGS. 38 to 50. FIG. 38 is a structural layout in an exemplary embodiment of the display panel of the present disclosure. FIG. 39 is a structural layout of the active layer in FIG. 38. FIG. 40 is a structural layout of the first conductive layer in FIG. 38. FIG. 41 is a structural layout of the second conductive layer in FIG. 38. FIG. 42 is a structural layout of the third conductive layer in FIG. 38. FIG. 43 is a structural layout of the fourth conductive layer in FIG. 38. FIG. 44 is a structural layout of the fifth conductive layer in FIG. 38. FIG. 45 is a structural layout of the electrode layer in FIG. 38. FIG. 46 is a structural layout of the active layer and the first conductive layer in FIG. 38. FIG. 47 is a structural layout of the active layer, the first conductive layer, and the second conductive layer in FIG. 38. FIG. 48 is a structural layout of the active layer, the first conductive layer, the second conductive layer, and the third conductive layer in FIG. 38. FIG. 49 is a structural layout of the active layer, the first conductive layer, the second conductive layer, the third conductive layer, and the fourth conductive layer in FIG. 38. FIG. 50 is a structural layout of the active layer, the first conductive layer, the second conductive layer, the third conductive layer, the fourth conductive layer, and the fifth conductive layer in FIG. 38. The display panel may include a plurality of driving units Dpi distributed along the row and column directions. The only difference between the driving unit in the display panel and the driving unit shown in FIG. 2 is that the driving unit in this exemplary embodiment includes 2 rows and 6 columns of pixel driving circuits.

As shown in FIGS. 38, 39, and 46, the active layer may include a first active part 41, a second active part 42, a third active part 43, a sixth active part 46, a seventh active part 47, an eighth active part 48, a ninth active part 49, a tenth active part 410, an eleventh active part 411, a twelfth active part 412, a thirteenth active part 413, a fourteenth active part 414, a fifteenth active part 415, and an active line 416. The first active part 41 is configured to form the channel region of the first transistor T1. The second active part 42 is configured to form the channel region of the second transistor T2. The third active part 43 is configured to form the channel region of the third transistor. The third active part 43 includes a first active sub-part 431 and a second active sub-part 432 which are connected. The sixth active part 46 is configured to form the channel region of the driving transistor DT. The seventh active part 47 is configured to form the channel region of the analog transistor DTd. the eighth active part 48 and the ninth active part 49 are connected to both ends of the first active part 41. The tenth active part 410 and the active line 416 are connected to both ends of the sixth active part 46. The orthographic projection of the active line 416 on the substrate can extend along the row direction X. The sixth active part 46 located in the same row is connected to the same active line 416. The thirteenth active part 413 is connected between the seventh active part 47 and the second active part 42. The eleventh active part 411 is connected to one end of the seventh active part 47 away from the second active part 42. The twelfth active part 412 is connected to one end of the second active part 42 away from the seventh active part 47. The fourteenth active part 414 and the fifteenth active part 415 are connected to both ends of the third active part 43. The active layer may be formed of polysilicon material. Correspondingly, the first transistor T1, the second transistor T2, the third transistor T3, the driving transistor DT, and the analog transistor DTd may be P-type low-temperature poly-silicon thin film transistors.

As shown in FIGS. 38, 40, and 46, the first conductive layer may include a gate line 5G, a second gate part 52, a third gate part 53, a sixth gate part 56, and a seventh gate part 57. The orthographic projection of the gate line 5G on the substrate extends along the row direction X, and covers the orthographic projection of the first active part 41 on the substrate. Part of the structure of the gate line 5G can be configured to form the gate of the first transistor T1. The gate line 5G can be configured to provide the gate driving signal terminal. The orthographic projection of the sixth gate part 56 on the substrate covers the orthographic projection of the sixth active part 46 on the substrate, and part of the structure of the sixth gate part 56 is configured to form the gate of the driving transistor DT and the first electrode of capacitor C1. The orthographic projection of the second gate part 52 on the substrate covers the orthographic projection of the second active part 42 on the substrate, and part of the structure of the second gate part 52 is configured to form the gate of the second transistor T2. The orthographic projection of the third gate part 53 on the substrate can cover the orthographic projection of the third active part 43 on the substrate, and part of the structure of the third gate part 53 can be configured to form the gate of the third transistor T3. The third transistor T3 has a double-gate structure, and the third transistor T3 of the double-gate structure has a small off-leakage current. The orthographic projection of the seventh gate part 57 on the substrate can cover the orthographic projection of the seventh active part 47 on the substrate, and part of the structure of the seventh gate part 57 can be configured to form the gate of the analog transistor DTd. In addition, the display panel can use the first conductive layer as a mask to perform conductive treatment on the active layer. That is, the area in the active layer covered by the first conductive layer can form the channel area of the transistor, and the area in the active layer not covered by the first conductive layer forms a conductor structure.

As shown in FIGS. 38, 41 and 47, the second conductive layer may include: a first conductive part 61, a second conductive part 62, a third conductive part 63, a fourth conductive part 64, a fifth conductive part 65, a sixth conductive part 66, a first bridge part 611, and a second bridge part 612. The orthographic projection of the first conductive part 61 on the substrate intersects with the orthographic projection of the sixth gate part 56 on the substrate. The first conductive part 61 can be configured to form the second electrode of the first capacitor C1. The first conductive parts 61 in the same row of the pixel driving circuits in the same driving unit may be connected to each other, and adjacent first conductive parts 61 in adjacent driving units in the row direction X are arranged at intervals. The second conductive part 62 may be connected to the eighth active part through a via hole to connect the first electrode of the first transistor. The third conductive part 63 may be respectively connected to the ninth active part 49 and the sixth gate part 56 through via holes to connect the second electrode of the first transistor T1 and the gate of the driving transistor. The fourth conductive part 64 is respectively connected to the seventh gate part 57 and the thirteenth active part 413 through via holes to connect the second electrode and the gate electrode of the analog transistor DTd. The fifth conductive part 65 may be connected to the fourteenth active part 414 through a via hole to connect the first electrode of the third transistor T3. The sixth conductive part 66 may be connected to the eleventh active part 411 through a via hole to connect the first electrode of the analog transistor DTd. The first bridge part 611 can be connected to the twelfth active part 412 and the first conductive part 61 located in the two rows of pixel driving circuits through a via hole to connect the second electrode of the second transistor T2 and the second electrode of the first capacitor C1. The second bridge part 612 can be connected to the fifteenth active part 415 and the first conductive part 61 located in the two rows of pixel driving circuits through a via hole to connect the second electrode of the third transistor T3 and the second electrode of the first capacitor C1.

As shown in FIGS. 38, 42, and 48, the third conductive layer may include a third bridge part 73, a sixth bridge part 76, a seventh conductive part 79, an enable signal line EM, a reference signal line Vref, and a reset signal line Re. The third bridge part 73 can be connected to the tenth active part 410 through a via hole to connect the second electrode of the driving transistor DT. The sixth bridge part 76 may be connected to the sixth conductive part 66 through a via hole to connect the first electrode of the analog transistor DTd. The orthographic projection of the enable signal line EM on the substrate, the orthographic projection of the reference signal line Vref on the substrate, and the orthographic projection of the reset signal line Re on the substrate can all extend along the row direction X. The enable signal line EM is configured to provide an enable signal terminal. The enable signal line EM can be connected to the second gate part 52 through a via hole to connect the gate of the second transistor T2. The reference signal line Vref is configured to provide a reference signal terminal. The reference signal line Vref can be connected to the fifth conductive part 65 through a via hole to connect the first electrode of the third transistor T3. The reset signal line Re is configured to provide a reset signal terminal. The reset signal line Re can be connected to the third gate part 53 through a via hole to connect the gate of the third transistor T3. The first conductive line 75 may be connected to the active line 416 through a plurality of via holes distributed in the row direction X to connect the first electrode of the driving transistor DT. The first conductive line 75 can reduce the resistance of the active line 416, thereby reducing the voltage drop of the signal on the active line 416. The seventh conductive part 79 may be connected to the first conductive part 61 through a via hole. In this exemplary embodiment, the sheet resistance of the second conductive layer is greater than the sheet resistance of the third conductive layer. In this exemplary embodiment, the enable signal line EM, the reference signal line Vref, and the reset signal line Re are provided in the third conductive layer, which can reduce the resistance of the above-mentioned signal line, thereby improving the signal transmission efficiency of the above-mentioned signal line.

As shown in FIGS. 38, 43, and 49, the fourth conductive layer may include a first shielding line 81, a second shielding line 82, and a power line VDD. The orthographic projection of the power line VDD on the substrate, the orthographic projection of the first shielding line 81 on the substrate may extend along the row direction X, and the orthographic projection of the second shielding line 82 on the substrate may extend along the column direction Y. The orthographic projections of the first shielding line 81 and the power line VDD on the substrate intersect with the orthographic projection of the second shielding line 82 on the substrate. Each column of pixel driving circuits may be provided with a corresponding second shielding line 82, each row of pixel driving circuits may be provided with a corresponding first shielding line 81, and each row of driving units may be provided with a corresponding power line VDD. The plurality of first shielding lines 81, the plurality of power lines VDD, and the plurality of second shielding lines 82 can form a grid structure. The power lines of the grid structure have smaller resistance, thereby reducing the voltage drop of the power signal on the power line. The orthographic projection of the first shielding line 81 and the second shielding line 82 on the substrate may at least partially overlap with the orthographic projection of the equipotential structure of the second electrode of the first capacitor C1 on the substrate. Part of structures of the first shielding line 81 and the second shielding line 82 can be configured to form the first electrode of the second capacitor C2, and the second electrode of the first capacitor C1 can be multiplexed as the second electrode of the second capacitor C2. For example, the orthographic projection of the second shielding line 82 on the substrate can overlap with the orthographic projection of the seventh conductive part 79 on the substrate, and the orthographic projection of the first shielding line 81 on the substrate can overlap with the orthographic projection of the first conductive part 61 on the substrate. The power line VDD may be configured to provide a first power terminal, and the power line VDD may be connected to the sixth bridge part 76 through a via hole to connect the first electrode of the analog transistor DTd and the first power terminal.

As shown in FIGS. 38, 44, and 50, the fifth conductive layer may include: a data line Da and a fifth bridge part 95. The orthographic projection of the data line Da on the substrate may extend along the column direction Y, and the data line Da may be configured to provide a data signal terminal. The data line Da may be connected to the second conductive part 62 through a via hole to connect the first electrode of the first transistor T1. The fifth bridge part 95 may be connected to the third bridge part 73 through a via hole to connect the second electrode of the driving transistor.

As shown in FIGS. 38, 43, 44, and 50, the second shielding line 82 may include a first extending part 821 and a second extending part 822. The overlapping part of the orthographic projection of the seventh conductive part 79 on the substrate and the orthographic projection of the data line Da on the substrate overlaps with the orthographic projection of the first extending part 821 on the substrate. That is, the first extending part 821 is shielded between the seventh conductive part 79 and the data line Da to shield the noise influence of the data line Da on the seventh conductive part 79, thereby improving the stability of the gate voltage of the driving transistor. The orthographic projection of the second extending part 822 on the substrate may be located between the orthographic projections of the adjacent data lines Da on the substrate. That is, the orthographic projection of the second extending part 822 on the substrate does not overlap with the orthographic projection of the data line Da on the substrate. This setting can reduce the parasitic capacitance of the data line Da, thereby improving the efficiency of writing data signal to the data line.

As shown in FIGS. 38 and 45, the electrode layer may include a plurality of electrode parts: a first electrode part R, a second electrode part B, and a third electrode part G. Each electrode part may be connected to the fifth bridge part 95 through a via hole to connect the second electrode of the driving transistor DT. The first electrode part R may be configured to form the first electrode of the red light-emitting unit, the second electrode part B may be configured to form the first electrode of the blue light-emitting unit, and the third electrode part G may be configured to form the first electrode of the green light-emitting unit. In this exemplary embodiment, the light-emitting unit L may be a Real RGB distribution. For example, the first electrode part R, the third electrode part G, and the second electrode part B are distributed alternately in the row direction, and the electrode parts of the same color are located in the same column. As shown in FIG. 38, the orthographic projection of the electrode part on the substrate is located between the orthographic projections of two adjacent data lines Da on the substrate. On the one hand, this arrangement can avoid the influence of the data line Da on the flatness of the electrode part. On the other hand, this arrangement can reduce the noise influence of the data line Da on the electrode part. The display panel may further include a pixel definition layer located on the side of the electrode layer facing away from the substrate. A pixel opening for forming the light-emitting unit is formed on the pixel definition layer. The orthographic projection of the first electrode part R on the substrate coincides with the orthographic projection of the corresponding pixel opening on the pixel definition layer on the substrate, the orthographic projection of the second electrode part B on the substrate coincides with the orthographic projection of the corresponding pixel opening on the pixel definition layer on the substrate, and the orthographic projection of the third electrode part G on the substrate coincides with the orthographic projection of the corresponding pixel opening on the pixel definition layer on the substrate.

Figure 51:
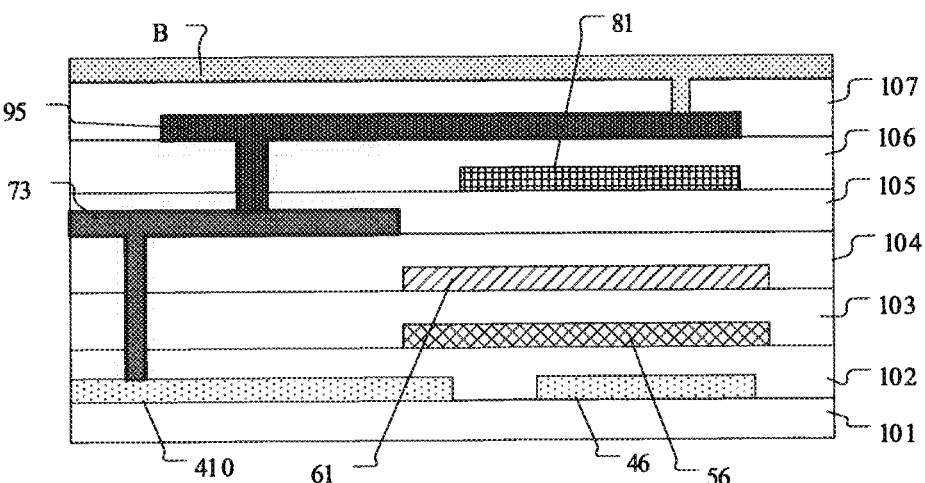
FIG. 51 is a partial cross-sectional view of the display panel shown in FIG. 38 taken along the dotted line CC.

As shown in FIG. 51, it is a partial cross-sectional view of the display panel shown in FIG. 38 taken along the dotted line CC. The display panel may further include a first insulating layer 102, a second insulating layer 103, a first dielectric layer 104, a passivation layer 105, a second dielectric layer 106, and a planarization layer 107. The substrate 101, the active layer, the first insulating layer 102, the first conductive layer, the second insulating layer 103, the second conductive layer, the first dielectric layer 104, the third conductive layer, the passivation layer 105, the fourth conductive layer, the second dielectric layer 106, the fifth conductive layer, the planarization layer 107, and the electrode layer are stacked in sequence. The first insulating layer 102 and the second insulating layer 103 may have a single-layer structure or a multi-layer structure. The material of the first insulating layer 102 and the second insulating layer 103 may be at least one of silicon nitride, silicon oxide, and silicon oxynitride. The first dielectric layer 104 and the second dielectric layer 106 can be silicon nitride layers. The material of the planarization layer 107 can be an organic material, such as polyimide (PI), polyethylene terephthalate ester (PET), polyethylene naphthalate (PEN), silicon on glass (SOG) and other materials. The material of the passivation layer 105 may be silicon oxide. The substrate 101 may include a glass substrate, a barrier layer, and a polyimide layer that are stacked in sequence. The barrier layer may be an inorganic material. The material of the first conductive layer and the second conductive layer may be an alloy or one of molybdenum, aluminum, copper, titanium, and niobium, or a molybdenum/titanium alloy or laminate. The material of the third conductive layer and the fifth conductive layer may include a metal material. For example, it may be an alloy or one of molybdenum, aluminum, copper, titanium, and niobium, or a molybdenum/titanium alloy or laminate, or it may be titanium/aluminum/titanium laminate. The electrode layer may include an indium tin oxide layer and a silver layer. The sheet resistance of any one of the first conductive layer and the second conductive layer may be greater than the sheet resistance of any one of the fourth conductive layer and the third conductive layer.

Figure 52:
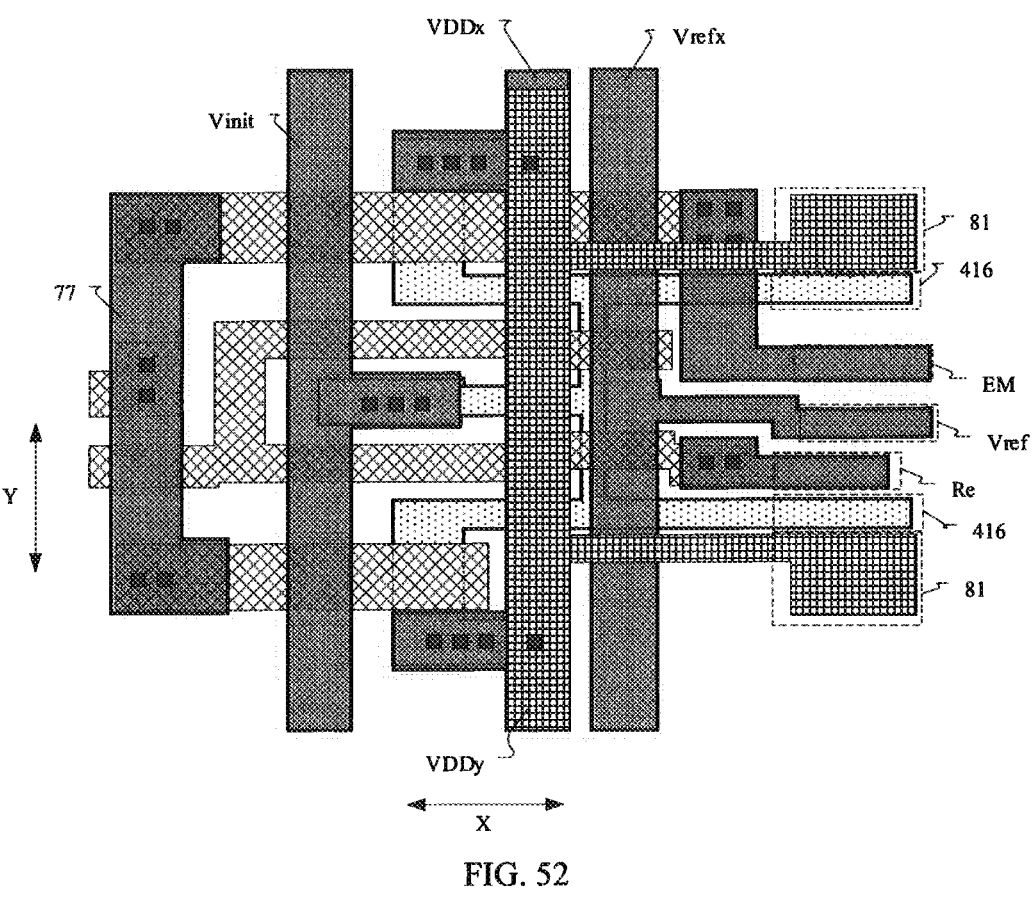
FIG. 52 is a partial structural layout of in an exemplary embodiment of the display panel of the present disclosure.
Figure 53:
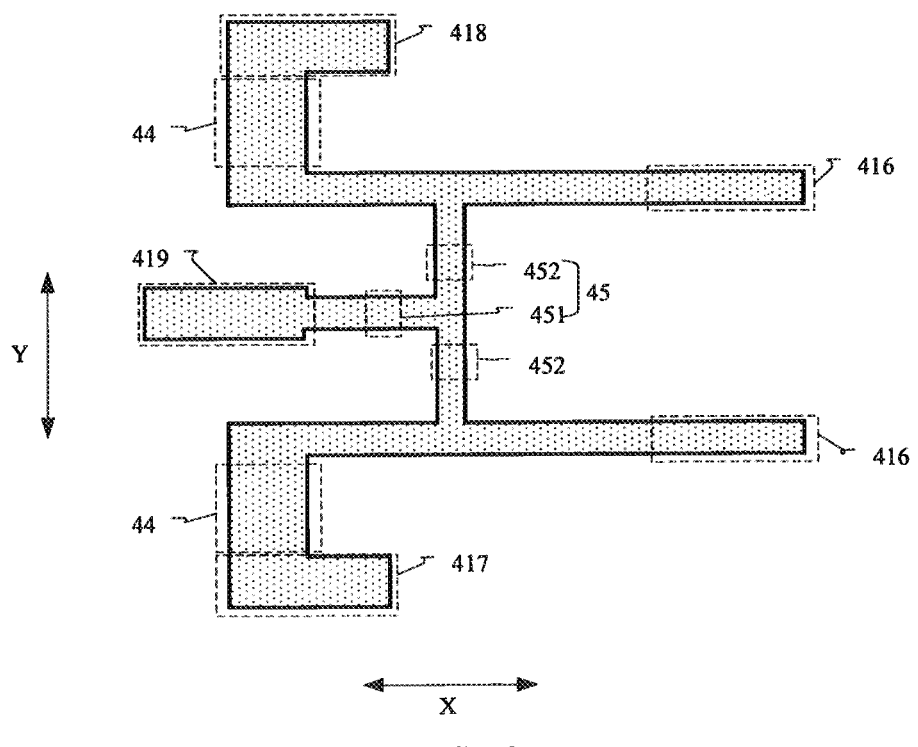
FIG. 53 is a structural layout of the active layer in FIG. 52.
Figures 54, 55:
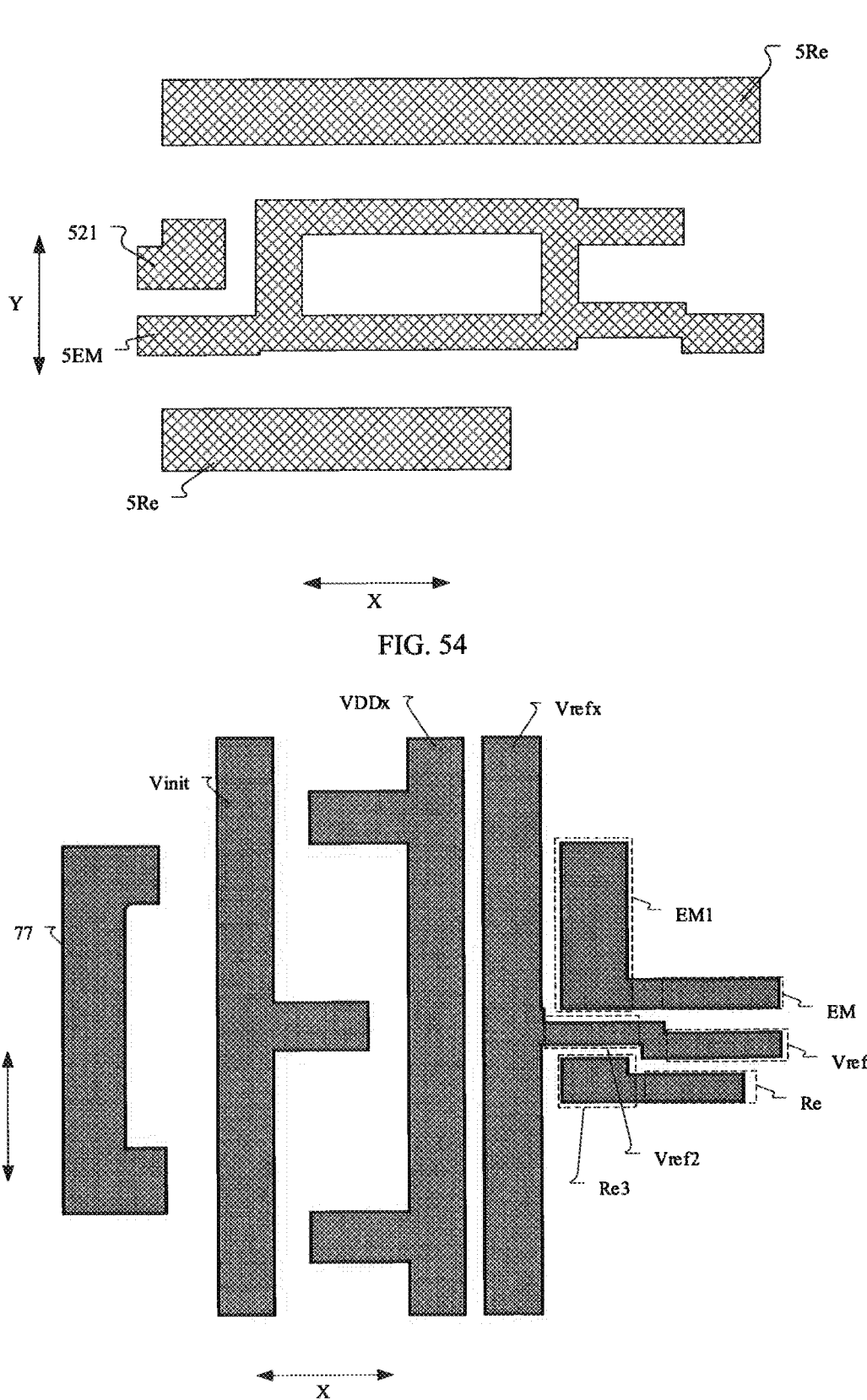
FIG. 54 is a structural layout of the first conductive layer in FIG. 52.
FIG. 55 is a structural layout of the third conductive layer in FIG. 52.
Figures 56, 57:
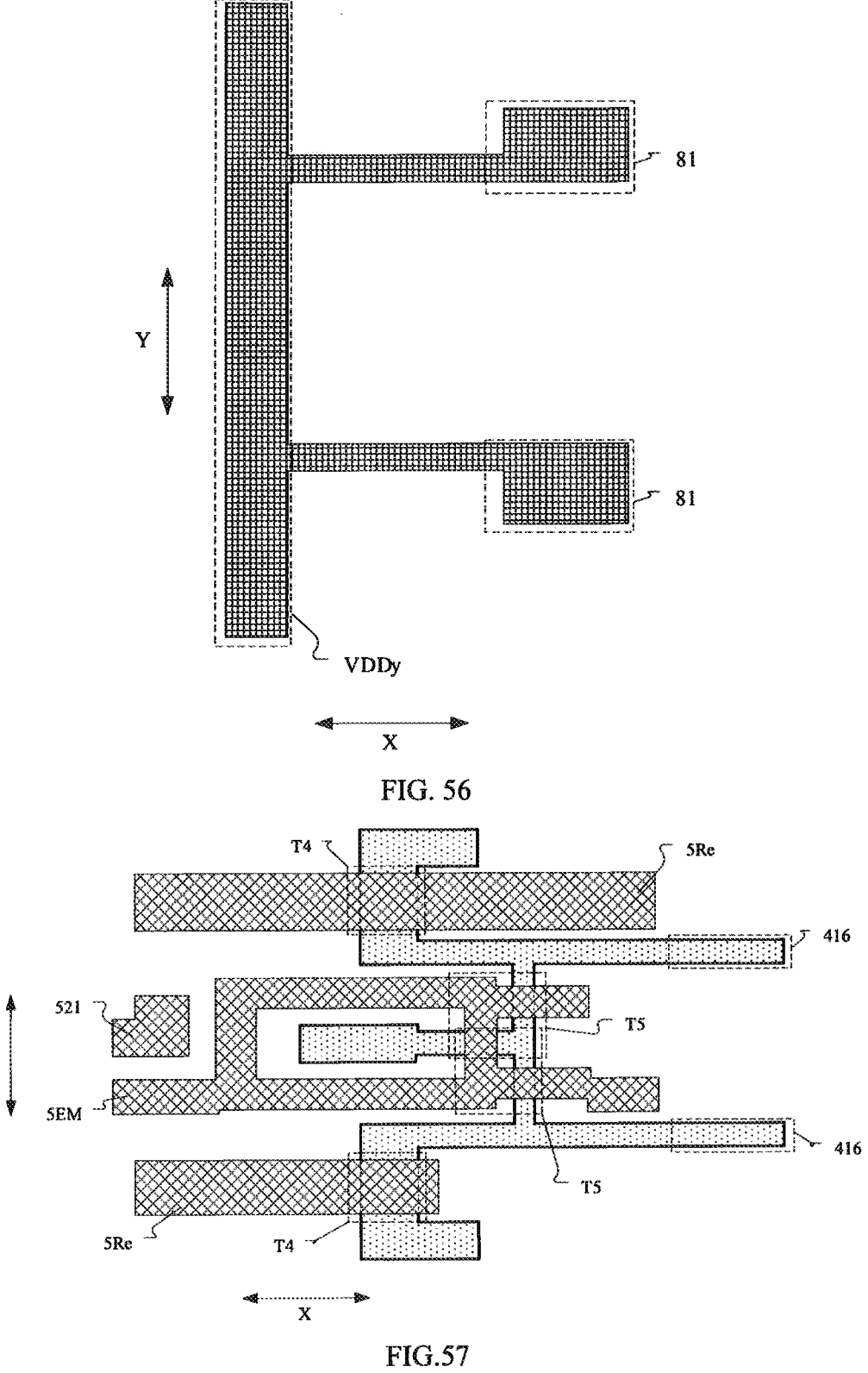
FIG. 56 is a structural layout of the fourth conductive layer in FIG. 52.
FIG. 57 is a structural layout of the active layer and the first conductive layer in FIG. 52.
Figure 58:
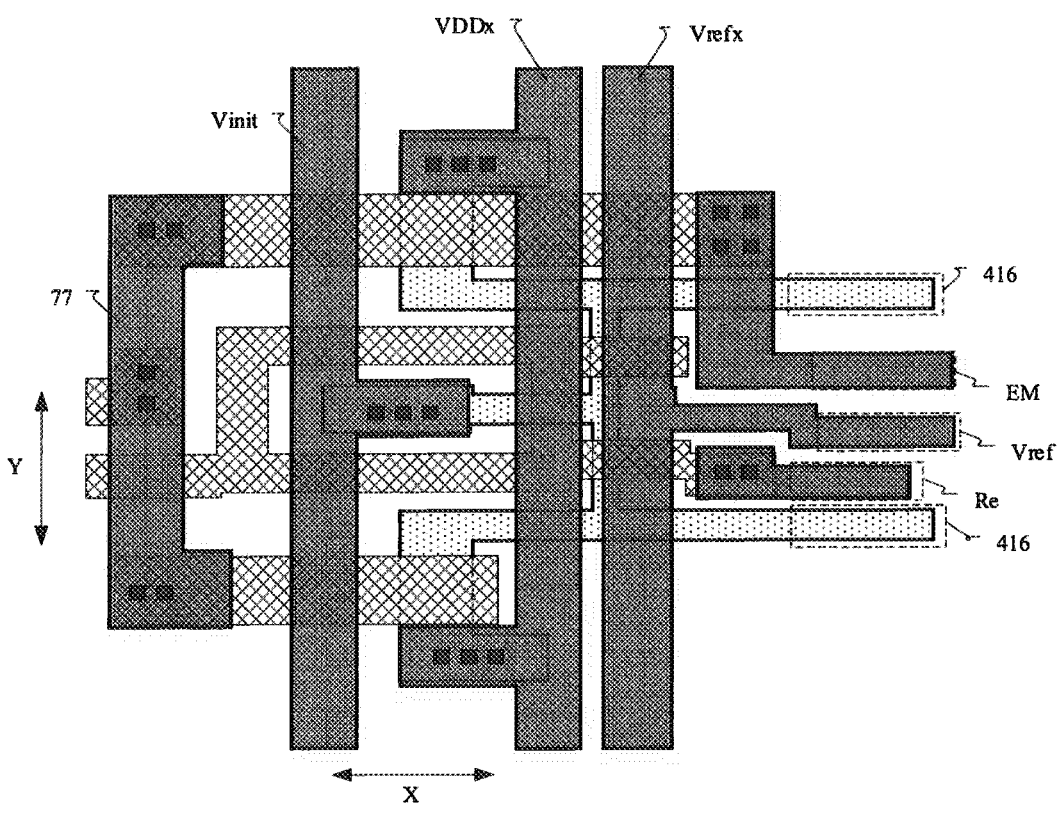
FIG. 58 is a structural layout of the active layer, the first conductive layer, and the third conductive layer in FIG. 52.

As shown in FIGS. 52 to 58, FIG. 52 is a partial structural layout in an exemplary embodiment of the display panel of the present disclosure. FIG. 52 shows a schematic structural diagram of the fourth transistor T4 and the fifth transistor T5 in FIG. 2. The structure of the fourth transistor and the fifth transistor shown in FIG. 52 may be part of the structure of the display panel shown in FIG. 38. Each row of pixel driving circuits may be provided with two sets of fourth transistors and fifth transistors, and the two sets of fourth transistors and fifth transistors may be respectively located on both sides of the row of pixel driving circuits in the row direction X. FIG. 52 only shows the structure of the fourth transistor and the fifth transistor on one side of the row of the pixel driving circuits in the row direction X. FIG. 53 is a structural layout of the active layer in FIG. 52. FIG. 54 is a structural layout of the first conductive layer in FIG. 52. FIG. 55 is a structural layout of the third conductive layer in FIG. 52. FIG. 56 is a structural layout of the fourth conductive layer in FIG. 52. FIG. 57 is a structural layout of the active layer and the first conductive layer in FIG. 52. FIG. 58 is the structural layout of the active layer, the first conductive layer and the third conductive layer in FIG. 52.

As shown in FIGS. 52, 53, and 57, the active layer may include a fourth active part 44, a fifth active part 45, an eighteenth active part 418, and a nineteenth active part 419. The two active lines 416 in FIG. 52 are two active lines in the same row of the driving units. The fourth active part 44 may be configured to form a channel region of the fourth transistor. The fifth active part 45 may be configured to form a channel region of the fifth transistor T5. The fifth active part 45 may include a third active sub-part 451 and a fourth active sub-part 452. The fifth active parts 45 on the same side of the two rows of pixel driving circuits in the same row of the driving units share the third active sub-part. The eighteenth active part 418 is connected to one side of the fourth active part 44 away from the fifth active part 45, and the nineteenth active part 419 is connected to one side of the fifth active part 45 away from the fourth active part 44.

As shown in FIGS. 52, 54, and 57, the first conductive layer may further include a fifth gate part 5Re, a first transfer part 521, and a fourth gate part 5EM. The orthographic projection of the fourth gate part 5EM on the substrate covers the orthographic projection of the fourth active part 44 on the substrate. At least part of the structure of the fourth gate part 5EM is configured to form the gate of the fourth transistor T4. The orthographic projection of the fifth gate part 5Re on the substrate covers the orthographic projection of the fifth active part 45 on the substrate. At least part of the structure of the fifth gate part 5Re is configured to form the gate of the fifth transistor T5. The first transfer part 521 is configured to provide a required enable signal for the enable signal line.

As shown in FIGS. 52, 55, and 58, the third conductive layer may include a seventh bridge part 77, an initial signal line Vinit, a first power extension line VDDx, a reference signal extension line Vrefx, a first connection part EM1, a second connection part Vref2, and a third connection part Re3. The enable signal line EM, the reference signal line Vref, and the reset signal line Re shown in FIG. 55 are the enable signal line EM, the reference signal line Vref, and the reset signal line Re in the same row of driving units. The first connection part EM1 is connected to the enable signal line EM, and is connected to the fourth gate part 5EM through a via hole to connect the gate of the fourth transistor and the enable signal terminal. The second connection part Vref2 is connected between the reference signal line Vref and the reference signal extension line Vrefx. The third connection part Re3 is connected to the reset signal line Re and is connected to the fifth gate part 5Re through a via hole to connect the gate of the fifth transistor and the reset signal terminal. The seventh bridge part 77 may be connected to the first transfer part 521 and the fourth gate part 5EM through via holes respectively. The orthographic projection of the initial signal line Vinit on the substrate, the orthographic projection of the first power extension line VDDx on the substrate, and the orthographic projection of the reference signal extension line Vrefx on the substrate can all extend along the column direction Y. The initial signal line Vinit may provide an initial signal terminal. The initial signal line Vinit may be connected to the nineteenth active part 419 through a via hole to connect the first electrode of the fifth transistor and the initial signal terminal. The first power extension line VDDx may be connected to the eighteenth active part 418 through a via hole to connect the first electrode of the fourth transistor and the first power terminal.

As shown in FIGS. 52 and 56, the fourth conductive layer may include a second power extension line VDDy. In FIG. 52, the two first shielding lines 81 are two first shielding lines in the same driving unit. The second power extension line VDDy can be connected to the two first shielding lines 81. The second power extension line VDDy can be connected to the first power extension line VDDx through a via hole, so that the analog transistor DTd and the fourth transistor T4 are connected to the first power terminal.

Figure 63:
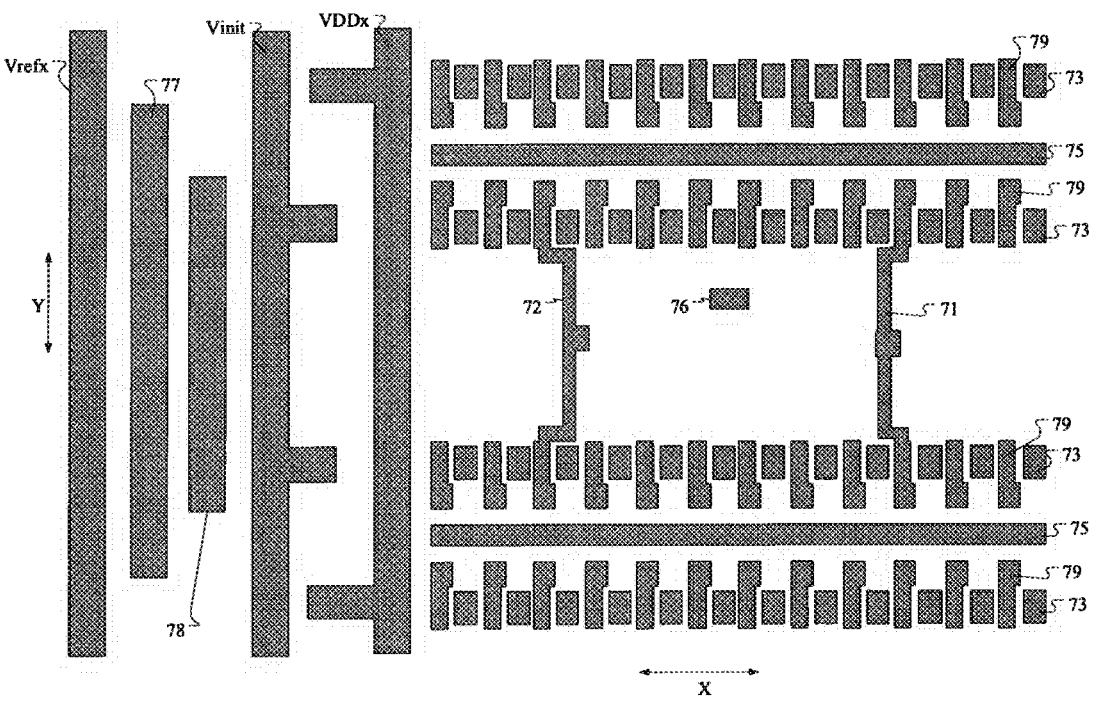
FIG. 63 is a structural layout of the third conductive layer in FIG. 59.
Figure 64:
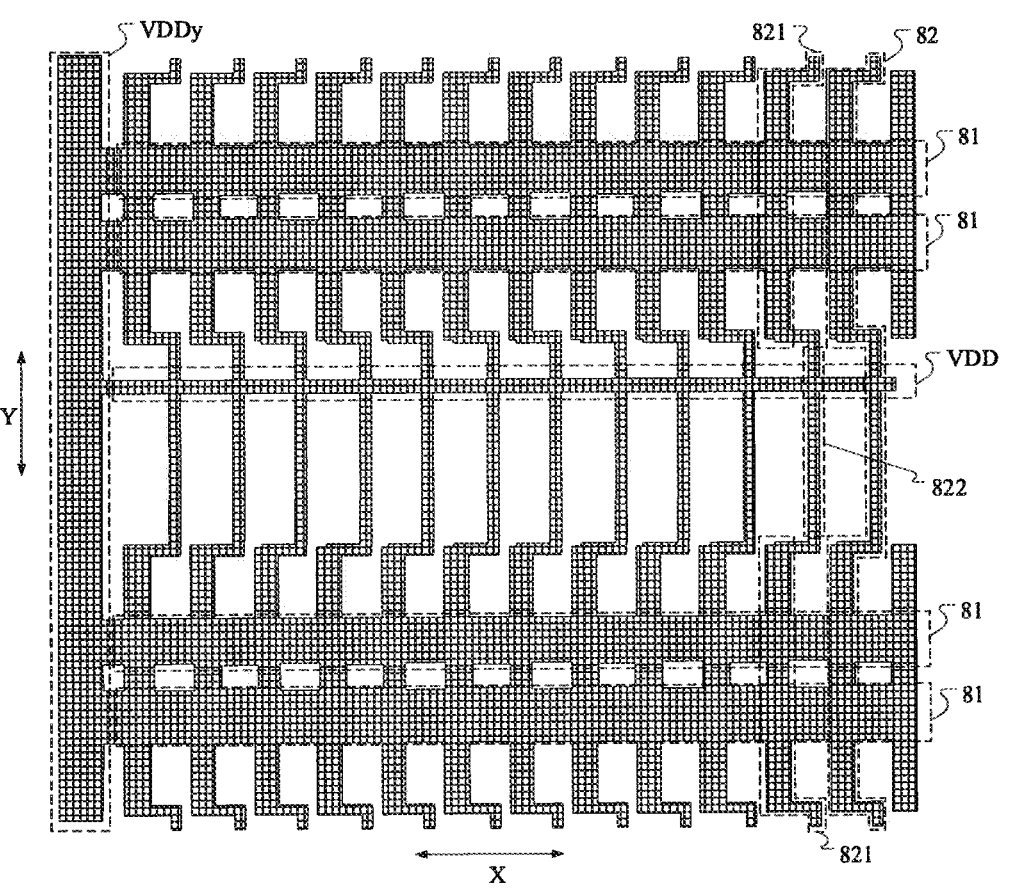
FIG. 64 is a structural layout of the fourth conductive layer in FIG. 59.
Figure 65:
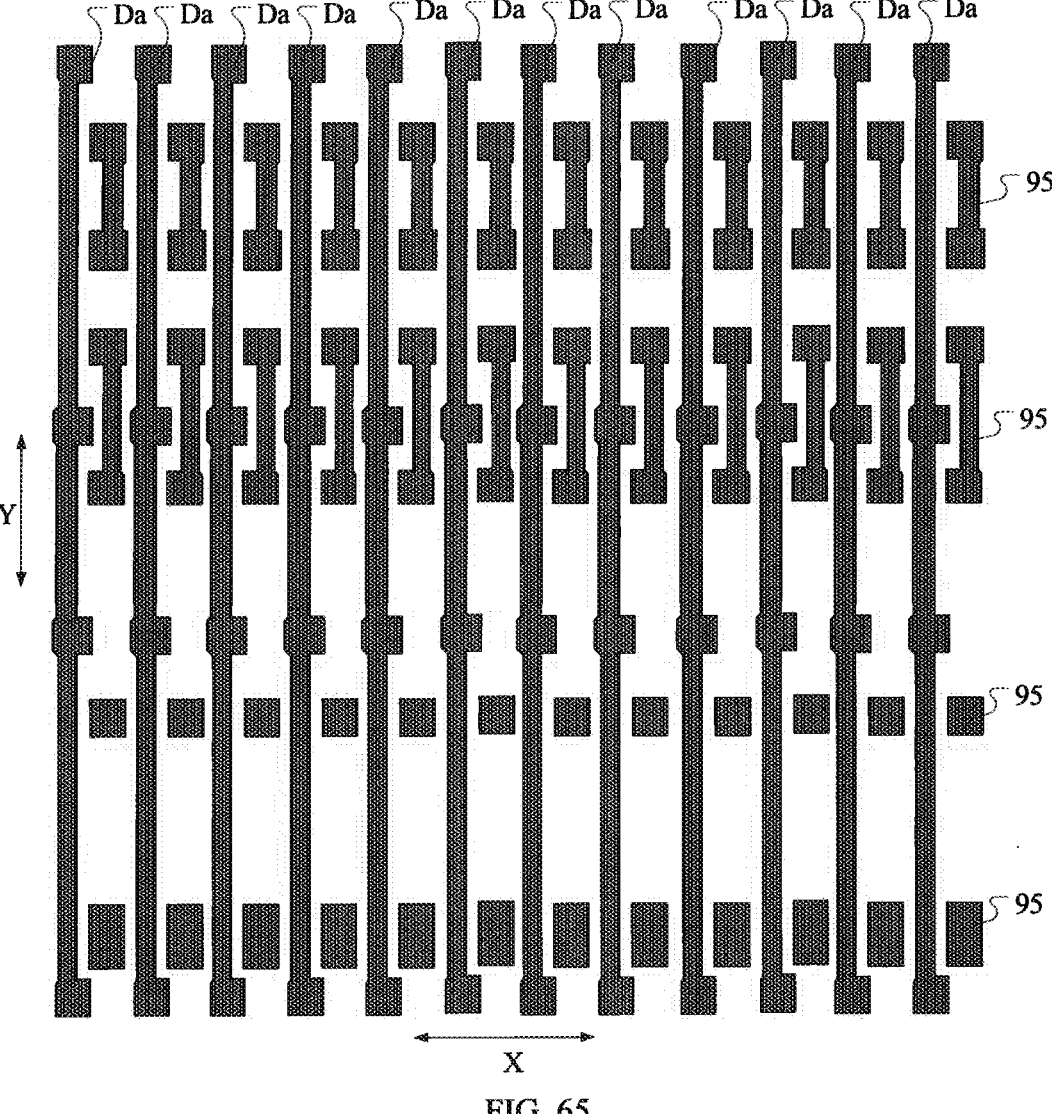
FIG. 65 is a structural layout of the fifth conductive layer in FIG. 59.
Figure 66:
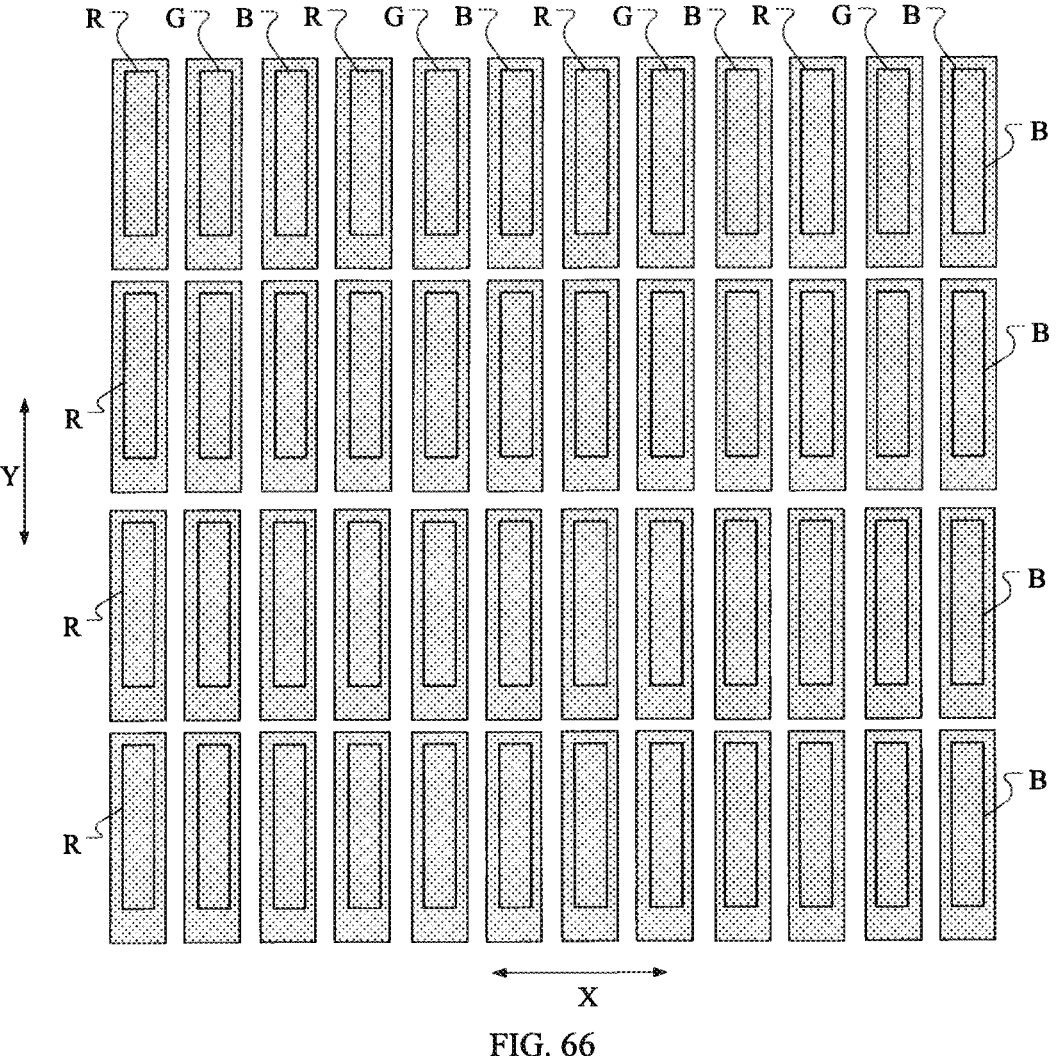
FIG. 66 is a structural layout of the electrode layer in FIG. 59.
Figure 67:
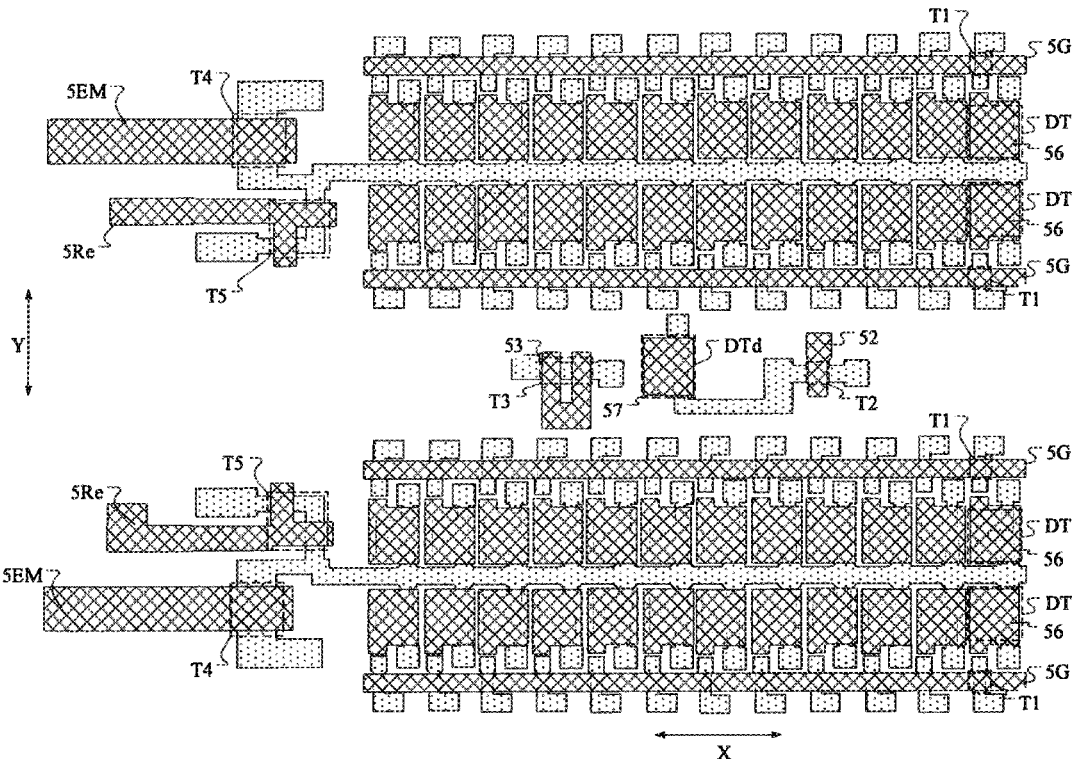
FIG. 67 is a structural layout of the active layer and the first conductive layer in FIG. 59.
Figure 68:
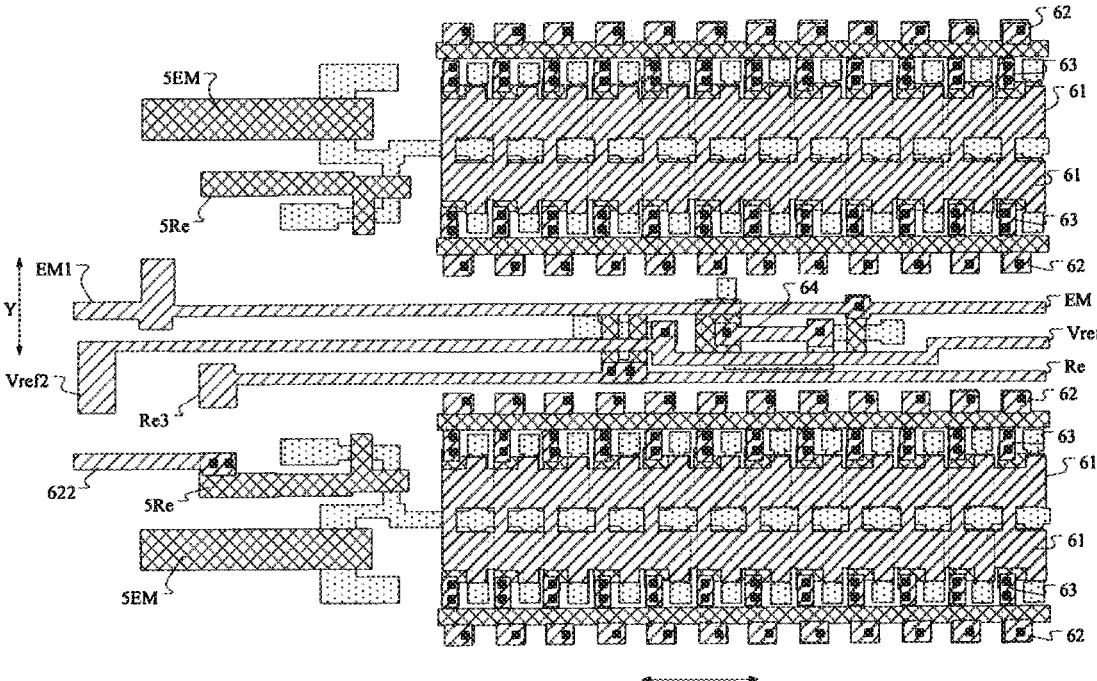
FIG. 68 is a structural layout of the active layer, the first conductive layer, and the second conductive layer in FIG. 59.
Figure 69:
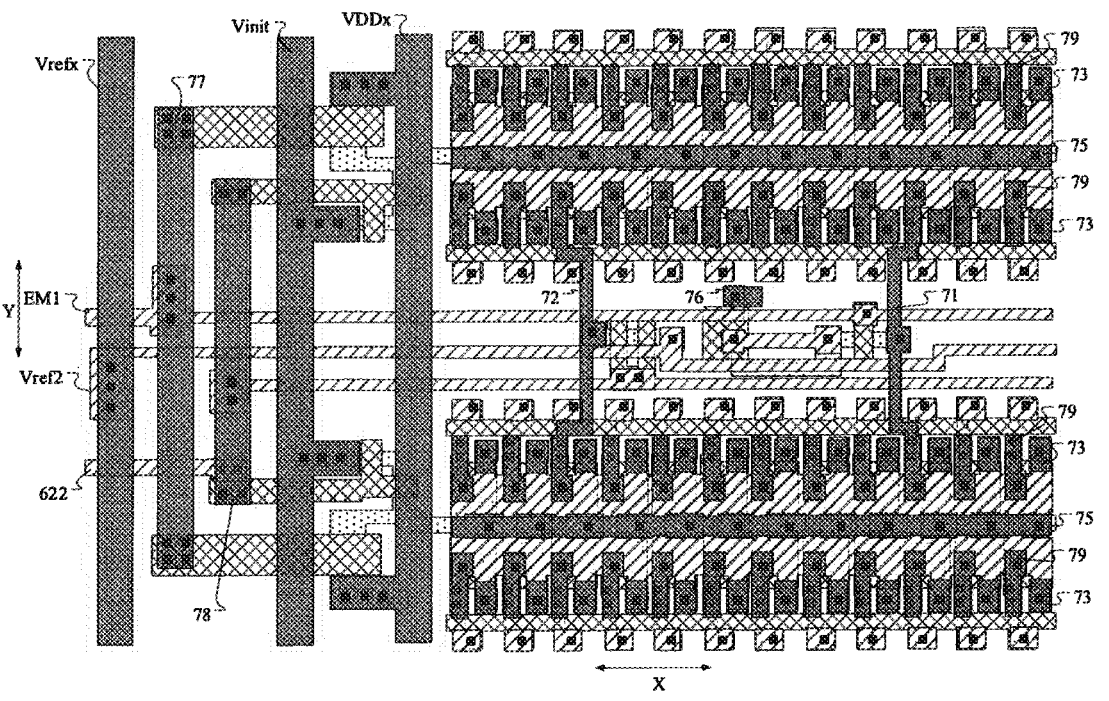
FIG. 69 is a structural layout of the active layer, the first conductive layer, the second conductive layer, and the third conductive layer in FIG. 59.
Figure 70:
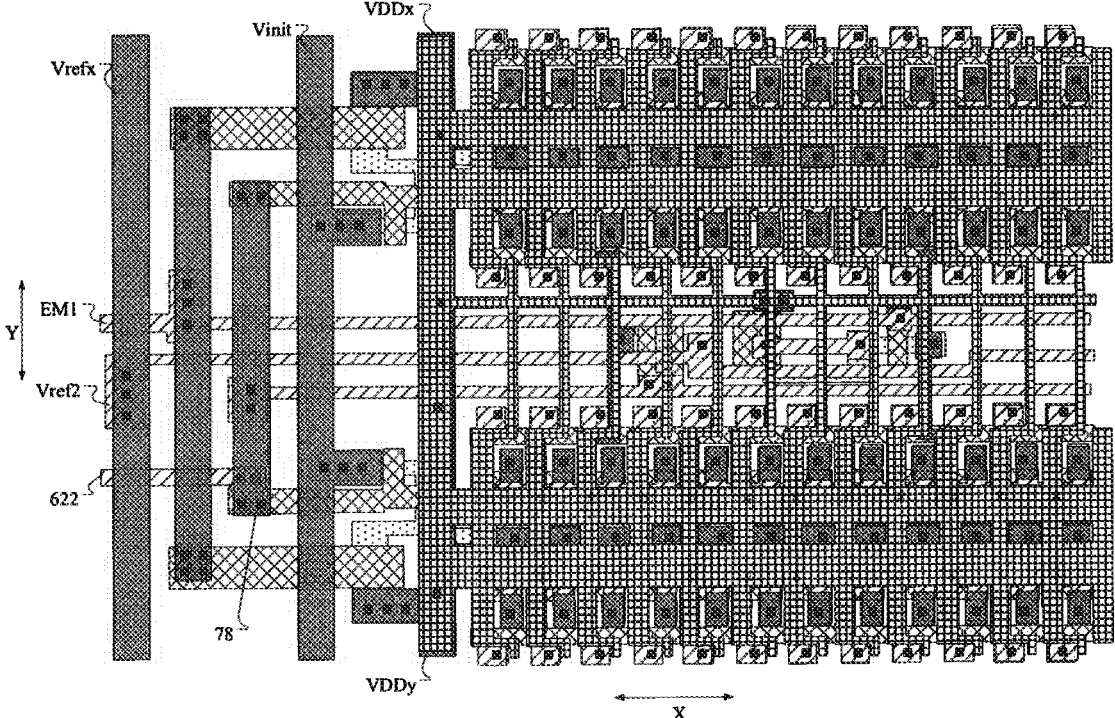
FIG. 70 is a structural layout of the active layer, the first conductive layer, the second conductive layer, the third conductive layer and the fourth conductive layer in FIG. 59.
Figure 71:
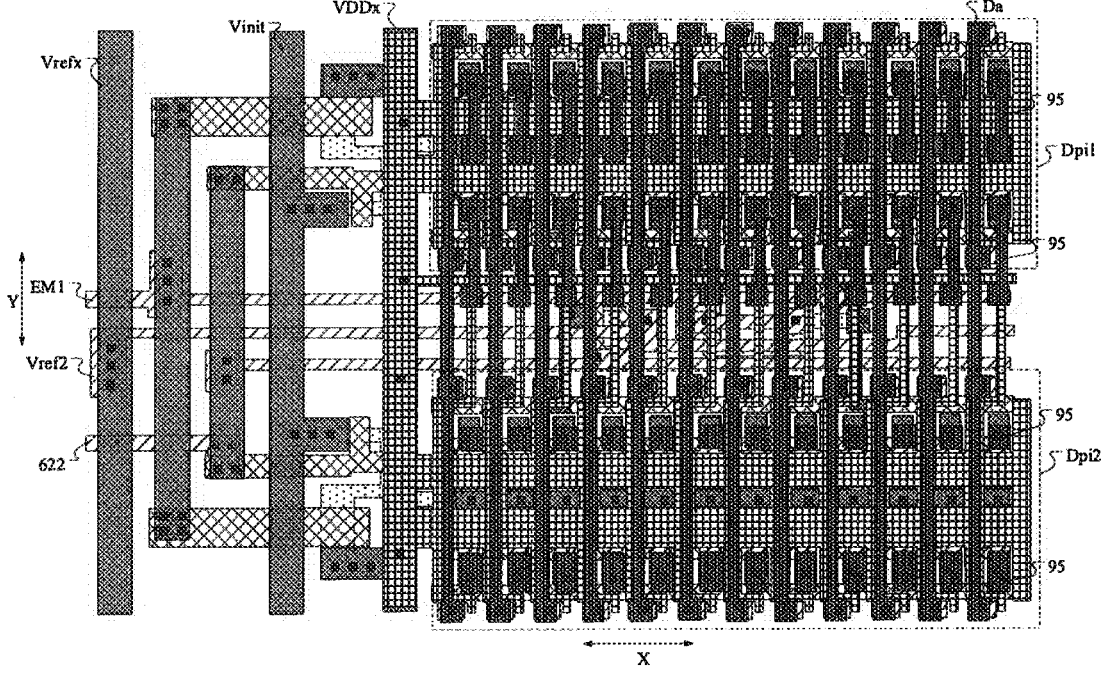
FIG. 71 is a structural layout of the active layer, the first conductive layer, the second conductive layer, the third conductive layer, the fourth conductive layer and the fifth conductive layer in FIG. 59.

This exemplary embodiment also provides another display panel, which may include a substrate, an active layer, a first conductive layer, a second conductive layer, a third conductive layer, a fourth conductive layer, a fifth conductive layer and an electrode layer which are stacked in sequence. An insulating layer may be provided between the adjacent layers. As shown in FIGS. 59 to 71, FIG. 59 is a structural layout in an exemplary embodiment of the display panel of the present disclosure. FIG. 60 is a structural layout of the active layer in FIG. 59. FIG. 61 is a structural layout of the first conductive layer in FIG. 59. FIG. 62 is the structural layout of the second conductive layer in FIG. 59. FIG. 63 is a structural layout of the third conductive layer in FIG. 59. FIG. 64 is a structural layout of the fourth conductive layer in FIG. 59. FIG. 65 is a structural layout of the fifth conductive layer in FIG. 59. FIG. 66 is a structural layout of the electrode layer in FIG. 59. FIG. 67 is a structural layout of the active layer and the first conductive layer in FIG. 59. FIG. 68 is a structural layout of the active layer, the first conductive layer and the second conductive layer in FIG. 59. FIG. 69 is a structural layout of the active layer, the first conductive layer, the second conductive layer and the third conductive layer in FIG. 59. FIG. 70 is a structural layout of the active layer, the first conductive layer, the second conductive layer, the third conductive layer and the fourth conductive layer in FIG. 59. FIG. 71 is a structural layout of the active layer, the first conductive layer, the second conductive layer, the third conductive layer, the fourth conductive layer and the fifth conductive layer in FIG. 59. The display panel may include a plurality of driving units Dpi distributed along the row and column directions. The difference between the driving unit in the display panel and the driving unit shown in FIG. 2 is that the driving unit in this exemplary embodiment includes 12 columns and 4 rows of pixel driving circuits. As shown in FIG. 71, the same driving unit includes two driving sub-units: a first driving sub-unit Dpi1 and a second driving sub-unit Dpi2. Two driving sub-units are distributed in the column direction Y. The first driving sub-unit Dpi1 and the second driving sub-unit Dpi2 both include adjacent 2 rows and 12 columns of pixel driving circuits. Each row of driving sub-units Dpix may be provided with two sets of fourth transistors T4 and fifth transistors T5. The two sets of fourth transistors T4 and fifth transistors T5 are respectively disposed on both sides of a row of driving sub-units Dpix in the row direction X. In this exemplary embodiment, FIG. 59 only shows a set of fourth transistor and fifth transistor on one side of one row of driving sub-units Dpix in the row direction X.

Figure 59:
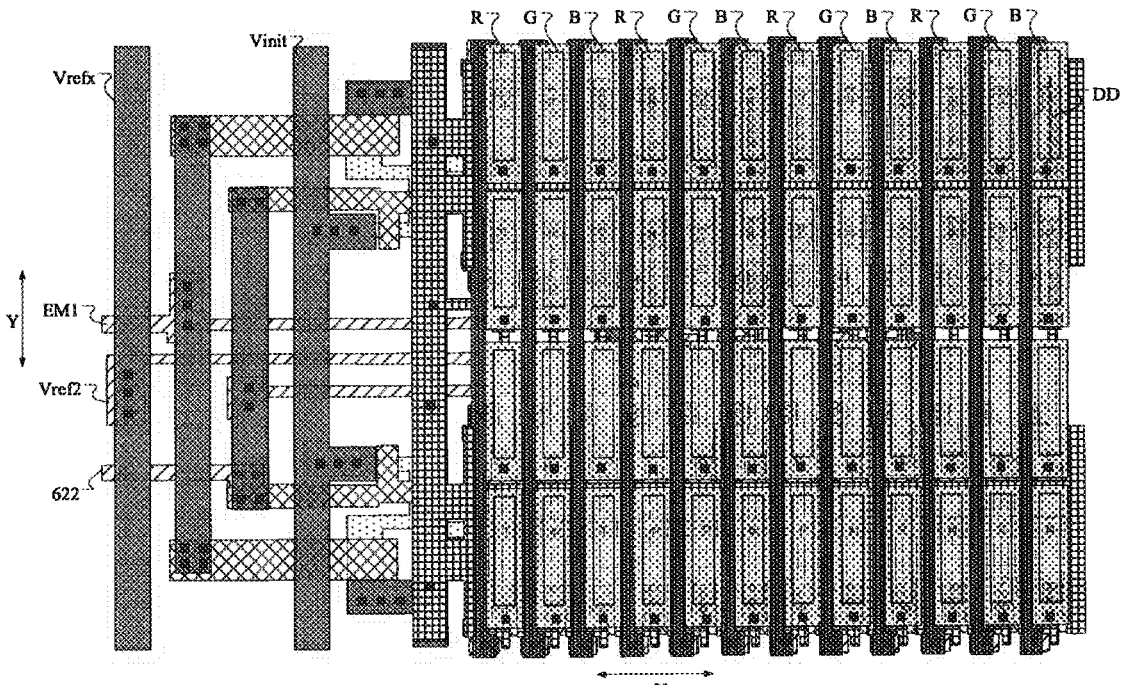
FIG. 59 is a structural layout of in an exemplary embodiment of the display panel of the present disclosure.
Figure 60:
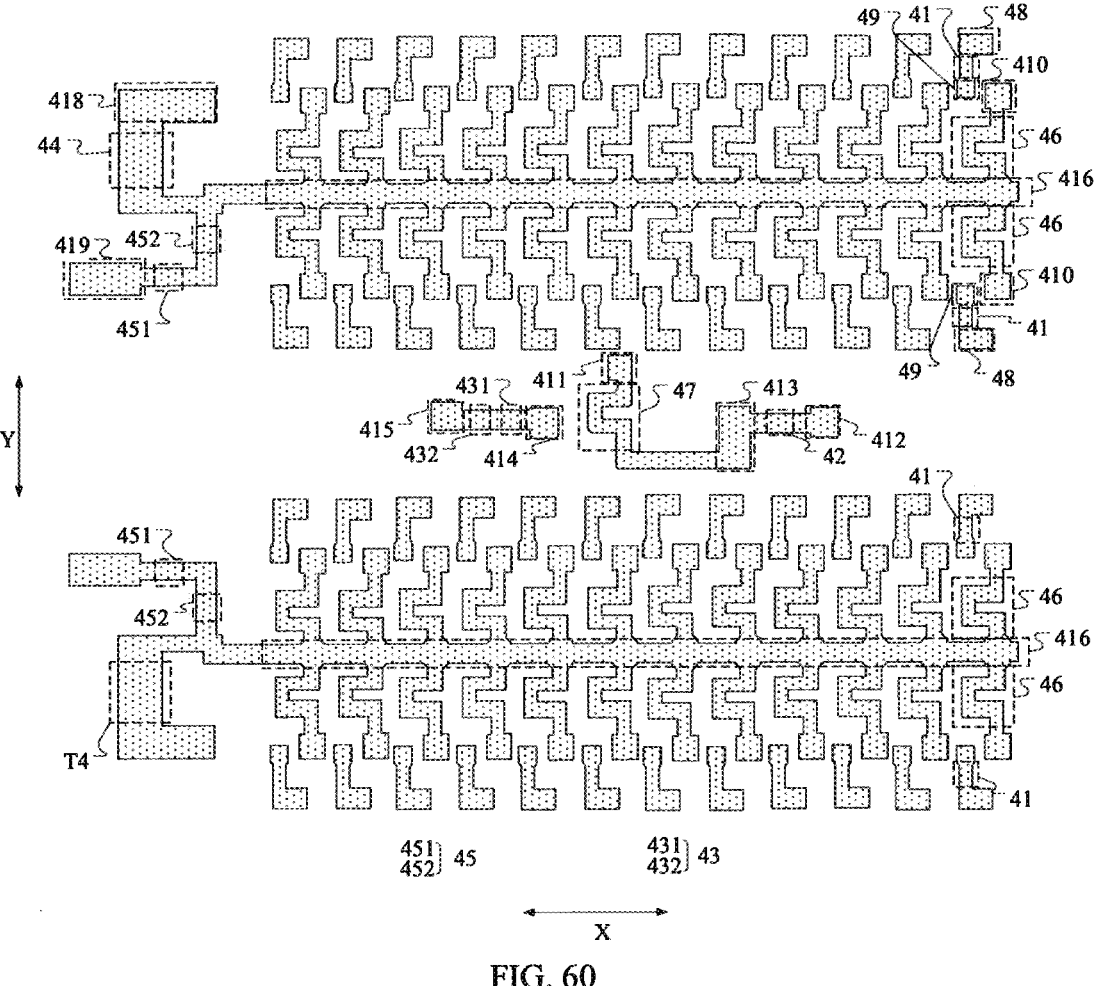
FIG. 60 is a structural layout of the active layer in FIG. 59.
Figures 61, 62:
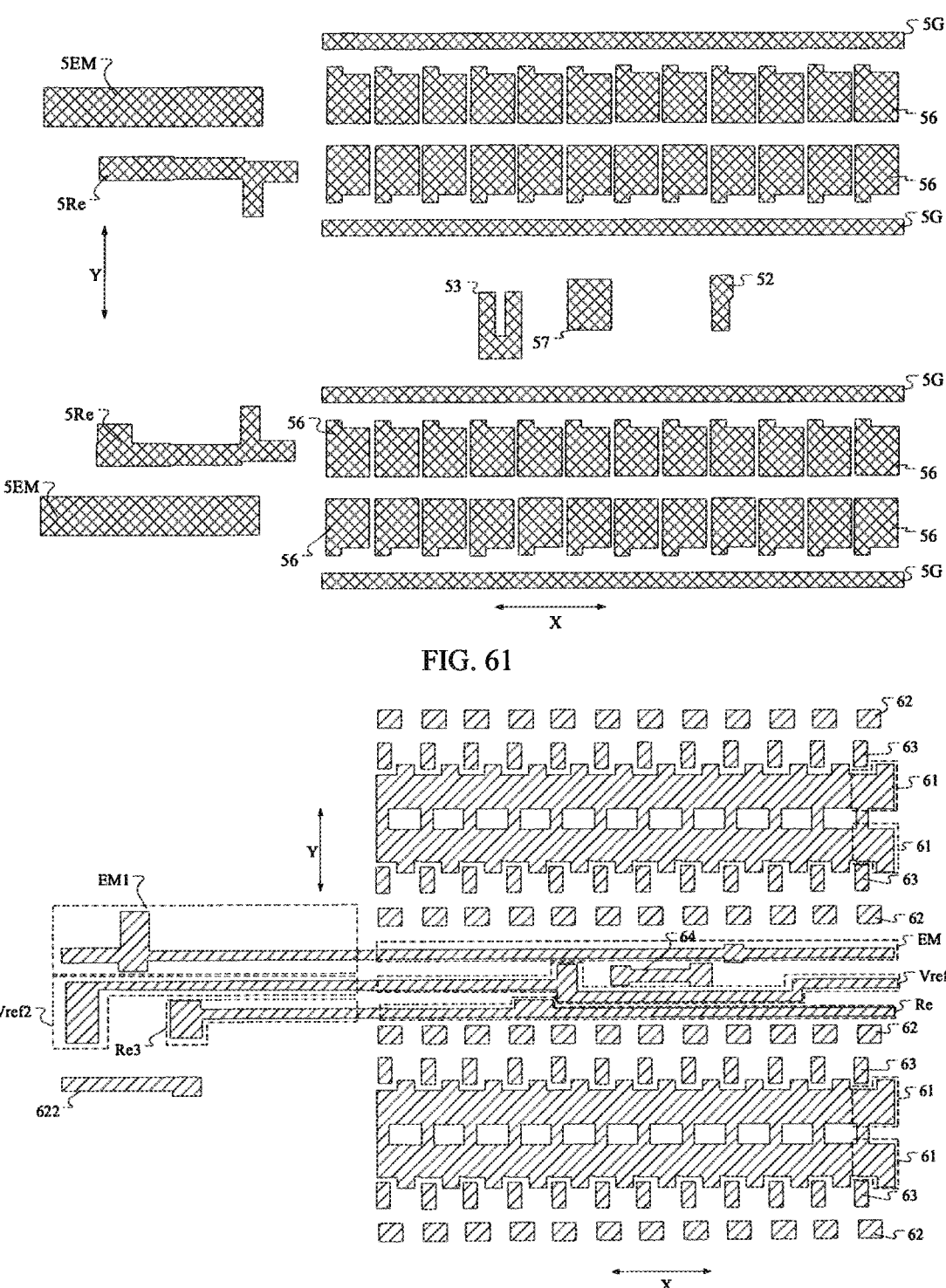
FIG. 61 is a structural layout of the first conductive layer in FIG. 59.
FIG. 62 is a structural layout of the second conductive layer in FIG. 59.

As shown in FIGS. 59, 60, and 67, the active layer may include a first active part 41, a second active part 42, a third active part 43, a sixth active part 46, a seventh active part 47, an eighth active part 48, a ninth active part 49, a tenth active part 410, an eleventh active part 411, a twelfth active part 412, a thirteenth active part 413, a fourteenth active part part 414, a fifteenth active part 415, and the active line 416. The first active part 41 is configured to form a channel region of the first transistor T1. The second active part 42 is configured to form a channel region of the second transistor T2. The second active part 42 includes a first active sub-part 421 and a second active sub-part 422 which are connected. The third active part 43 is configured to form the channel region of the third transistor. The sixth active part 46 is configured to form the channel region of the driving transistor DT. The seventh active part 47 is configured to form the channel region of the analog transistor DTd. The eighth active part 48 and the ninth active part 49 are connected to both ends of the first active part 41. The tenth active part 410 and the active line 416 are connected to both ends of the sixth active part 46. The orthographic projection of the active line 416 on the substrate may extend along the row direction X. The sixth active part 46 located in two rows of the same driving sub-unit may be connected to the same active line 416. The thirteenth active part 413 is connected between the seventh active part 47 and the second active part 42. The eleventh active part 411 is connected to one end of the seventh active part 47 away from the second active part 42. The twelfth active part 412 is connected to one end of the second active part 42 away from the seventh active part 47. The fourteenth active part 414 and the fifteenth active part 415 are connected to both ends of the third active part 43. The active layer may further include a fourth active part 44, a fifth active part 45, an eighteenth active part 418, and a nineteenth active part 419. The fourth active part 44 and the fifth active part 45 may be connected to the active line 416. The fourth active part 44 may be configured to form a channel region of the fourth transistor. The fifth active part 45 may be configured to form a channel region of the fifth transistor T5. The fifth active part 45 may include a third active sub-part 451 and a fourth active sub-part 452. The eighteenth active part 418 is connected to one side of the fourth active part 44 away from the fifth active part 45. The nineteenth active part 419 is connected to one side of the fifth active part 45 away from the fourth active part 44. The active layer may be formed of polysilicon material. Correspondingly, the first transistor T1, the second transistor T2, the third transistor T3, the driving transistor DT, the analog transistor DTd, the fourth transistor T4, and the fifth transistor T5 may be P-type low temperature Polycrystalline silicon thin film transistors.

As shown in FIGS. 59, 61, and 67, the first conductive layer may include a gate line 5G, a second gate part 52, a third gate part 53, a sixth gate part 56, and a seventh gate part 57. The orthographic projection of the gate line 5G on the substrate extends along the row direction X, and covers the orthographic projection of the first active part 41 on the substrate. Part of the structure of the gate line 5G can be configured to provide the gate driving signal terminal. The orthographic projection of the sixth gate part 56 on the substrate covers the orthographic projection of the sixth active part 46 on the substrate. Part of the structure of the sixth gate part 56 is configured to form the gate of the driving transistor DT and the first electrode of capacitor C1. The orthographic projection of the second gate part 52 on the substrate covers the orthographic projection of the second active part 42 on the substrate. Part of the structure of the second gate part 52 is configured to form the gate of the second transistor T2. The orthographic projection of the third gate part 53 on the substrate can cover the orthographic projection of the third active part 43 on the substrate. Part of the structure of the third gate part 53 can be configured to form the gate of the third transistor T3. The third transistor T3 has a double-gate structure, and the third transistor T3 of the double-gate structure has a small off-leakage current. The orthographic projection of the seventh gate part 57 on the substrate can cover the orthographic projection of the seventh active part 47 on the substrate. Part of the structure of the seventh gate part 57 can be configured to form the gate of the analog transistor DTd. The first conductive layer may further include a fourth gate part 5EM and a fifth gate part 5Re. The orthographic projection of the fourth gate part 5EM on the substrate covers the orthographic projection of the fourth active part 44 on the substrate. At least part of the structure of the fourth gate part 5EM is configured to form the gate of the fourth transistor T4. The orthographic projection of the fifth gate part 5Re on the substrate covers the orthographic projection of the fifth active part 45 on the substrate. At least part of the structure of the fifth gate part 5Re is configured to form the gate of the fifth transistor T5. In addition, the display panel can use the first conductive layer as a mask to perform conductive treatment on the active layer. That is, the area in the active layer covered by the first conductive layer can form the channel area of the transistor, and the area in the active layer not covered by the first conductive layer forms a conductor structure.

As shown in FIGS. 59, 62, and 68, the second conductive layer may include: a first conductive part 61, a second conductive part 62, a third conductive part 63, a fourth conductive part 64, an enable signal line EM, a reference signal line Vref, and a reset signal line Re. The orthographic projection of the enable signal line EM on the substrate, the orthographic projection of the reference signal line Vref on the substrate, and the orthographic projection of the reset signal line Re on the substrate can all extend along the row direction X. The enable signal line EM is configured to provide an enable signal terminal. The enable signal line EM can be connected to the second gate part 52 through a via hole to connect the gate of the second transistor T2. The reference signal line Vref is configured to provide a reference signal terminal. The reference signal line Vref can be connected to the fourteenth active part 414 through a via hole to connect the first electrode of the third transistor T3. The reset signal line Re is configured to provide a reset signal terminal. The reset signal line Re can be connected to the third gate part 53 through a via hole to connect the gate of the third transistor T3. The orthographic projection of the first conductive part 61 on the substrate intersects the orthographic projection of the sixth gate part 56 on the substrate. The first conductive part 61 can be configured to form a second electrode of the first capacitor C1. The first conductive parts 61 in the same row of the pixel driving circuits in the same driving unit may be connected to each other, and adjacent first conductive parts 61 in adjacent driving units in the row direction X are arranged at intervals.

The first conductive parts 61 located in different rows of pixel driving circuits in the same driving sub-unit may also be connected to each other. The second conductive part 62 may be connected to the eighth active part through a via hole to connect the first electrode of the first transistor. The third conductive part 63 may be respectively connected to the ninth active part 49 and the sixth gate part 56 through via holes to connect the second electrode of the first transistor T1 and the gate of the driving transistor. The fourth conductive part 64 is respectively connected to the seventh gate part 57 and the thirteenth active part 413 through via holes to connect the second electrode and the gate electrode of the analog transistor DTd. The second conductive layer may also include a first connection part EM1, a second connection part Vref2, a third connection part Re3, and a second transfer part 622. The first connection part EM1 is connected to the enable signal line EM. The second connection part Vref2 is connected to the reference signal line Vref. The third connection part Re3 is connected to the reset signal line Re. The second transfer part 622 can be connected to the fifth gate part 5Re through a via hole. The second transfer part 622 may be configured to provide a required reset signal for the reset signal line.

As shown in FIGS. 59, 63, and 69, the third conductive layer may include a first bridge part 71, a second bridge part 72, a third bridge part 73, a first conductive line 75, a seventh conductive part 79, and a sixth bridge part 76. The seventh conductive part 79 may be connected to the first conductive part 61 through a via hole. The first bridge part 71 can be respectively connected to the twelfth active part 412 and the seventh conductive parts 79 located in different driving sub-units in the same driving unit through via holes to connect the second electrode of the second transistor T2 and the second electrode of the first capacitor C1. The second bridge part 72 can be respectively connected to the fifteenth active part 415 and the seventh conductive parts 79 located in different driving sub-units in the same driving unit through via holes to connect the second electrode of the third transistor T3 and the second electrode of the first capacitor C1. The third bridge part 73 may be connected to the tenth active part 410 through a via hole to connect the second electrode of the driving transistor DT. The sixth bridge part 76 may be connected to the eleventh active part 411 through a via hole to connect the first electrode of the analog transistor DTd. The first conductive line 75 may be connected to the active line 416 through a plurality of via holes distributed in the row direction X to reduce the voltage drop of the signal on the active line 416. The third conductive layer may also include a seventh bridge part 77, an eighth bridge part 78, an initial signal line Vinit, a first power extension line VDDx, and a reference signal extension line Vrefx. The seventh bridge part 77 can be connected to the fourth gate part 5EM and the first connection part EM1 through via holes respectively. The orthographic projection of the initial signal line Vinit on the substrate, the orthographic projection of the first power extension line VDDx on the substrate, and the orthographic projection of the reference signal extension line Vrefx on the substrate can all extend along the column direction Y. The initial signal line Vinit may provide an initial signal terminal. The initial signal line Vinit may be connected to the nineteenth active part 419 through a via hole to connect the first electrode of the fifth transistor and the initial signal terminal. The first power extension line VDDx may be connected to the power line VDD, and the first power extension line VDDx may be connected to the eighteenth active part 418 through a via hole to connect the first electrode of the fourth transistor and the first power terminal. The reference signal extension line Vrefx may be connected to the second connection part Vref2 through a via hole to connect the reference signal line Vref.

As shown in FIGS. 59, 64, and 70, the fourth conductive layer may include a first shielding line 81, a second shielding line 82, and a power line VDD. The orthographic projection of the power line VDD on the substrate and the orthographic projection of the first shielding line 81 extend along the row direction X, and the orthographic projection of the second shielding line 82 on the substrate extends along the column direction Y. The orthographic projections of the first shielding line 81 and the power line VDD on the substrate intersect with the orthographic projection of the second shielding line 82 on the substrate. Each column of pixel driving circuits may be provided with a corresponding second shielding line 82, each row of pixel driving circuits may be provided with a corresponding first shielding line 81, and each row of driving units may be provided with a corresponding power line VDD. The plurality of power lines VDD, the plurality of first shielding lines 81 and the plurality of second shielding lines 82 may form a grid structure. The orthographic projections of the first shielding line 81 and the second shielding line 82 on the substrate may at least partially overlap with the orthographic projection of the equipotential structure of the second electrode of the first capacitor C1 on the substrate. Part of the structure of the first shielding line 81 and the second shielding line 82 can be configured to form the first electrode of the second capacitor C2, and the second electrode of the first capacitor C1 can be multiplexed as the second electrode of the second capacitor C2. For example, the orthographic projection of the second shielding line 82 on the substrate can overlap with the orthographic projection of the seventh conductive part 79 on the substrate, and the orthographic projection of the first shielding line 81 on the substrate can overlap with the orthographic projection of the first conductive part 61 on the substrate. The power line VDD may be configured to provide a first power terminal. The power line VDD may be connected to the sixth bridge part 76 through a via hole to connect the first electrode of the analog transistor DTd and the first power terminal. The fourth conductive layer may further include a second power extension line VDDy. The second power extension line VDDy may be connected to the first power extension line VDDx through a via hole, so that the analog transistor DTd and the fourth transistor T4 are connected to the first power terminal.

As shown in FIGS. 59, 65, and 71, the fifth conductive layer may include: a data line Da and a fifth bridge part 95. The orthographic projection of the data line Da on the substrate may extend along the column direction Y. The data line Da may be configured to provide a data signal terminal. The data line Da may be connected to the second conductive part 62 through a via hole to connect the first electrode of the first transistor T1. The fifth bridge part 95 may be connected to the third bridge part 73 through a via hole to connect the second electrode of the driving transistor.

As shown in FIGS. 59, 64, 65, and 71, the second shielding line 82 may include a first extending part 821 and a second extending part 822. The overlapping part of the orthographic projection of the seventh conductive part 79 on the substrate and the orthographic projection of the data line Da on the substrate overlaps with the orthographic projection of the first extending part 821 on the substrate. The overlapping part of the orthographic projection of the conductive part 61 on the substrate and the orthographic projection of the data line Da on the substrate overlaps with the orthographic projection of the first extending part 821 on the substrate. That is, the first extending part 821 is shielded between the seventh conductive part 79 and the data line Da, and between the first conductive part 61 and the data line Da. The first extending part 821 can shield the noise influence of the data line Da on the first conductive part 61, thereby improving the stability of the gate voltage of the driving transistor. The orthographic projection of the second extending part 822 on the substrate may be located between the orthographic projections of the adjacent data lines Da on the substrate. That is, the orthographic projection of the second extending part 822 on the substrate does not overlap with the orthographic projection of the data line Da on the substrate. This setting can reduce the parasitic capacitance of the data line Da, thereby improving the efficiency of writing data signal to the data line.

As shown in FIGS. 59 and 66, the electrode layer may include a plurality of electrode parts: a first electrode part R, a second electrode part B, and a third electrode part G. Each electrode part may be connected to the fifth bridge part 95 through a via hole to connect the second electrode of the driving transistor DT. The first electrode part R may be configured to form the first electrode of the red light-emitting unit, the second electrode part B may be configured to form the first electrode of the blue light-emitting unit, and the third electrode part G may be configured to form the first electrode of the green light-emitting unit. In this exemplary embodiment, the light-emitting unit L may be a Real RGB distribution. For example, the first electrode part R, the third electrode part G, and the second electrode part B are distributed alternately in the row direction, and the electrode parts of the same color are located in the same column. As shown in FIG. 59, the orthographic projection of the electrode part on the substrate is located between the orthographic projections of two adjacent data lines Da on the substrate. On the one hand, this arrangement can avoid the influence of the data line Da on the flatness of the electrode part. On the other hand, this arrangement can reduce the noise influence of the data line Da on the electrode part. The display panel may further include a pixel definition layer located on one side of the electrode layer facing away from the substrate. A pixel opening for forming the light-emitting unit is formed on the pixel definition layer. The orthographic projection of the first electrode part R on the substrate coincides with the orthographic projection of the corresponding pixel opening on the pixel definition layer on the substrate. The orthographic projection of the second electrode part B on the substrate coincides with the orthographic projection of the corresponding pixel opening on the pixel definition layer on the substrate. The orthographic projection of the third electrode part G on the substrate coincides with the orthographic projection of the corresponding pixel opening on the pixel definition layer on the substrate.

Figure 72:
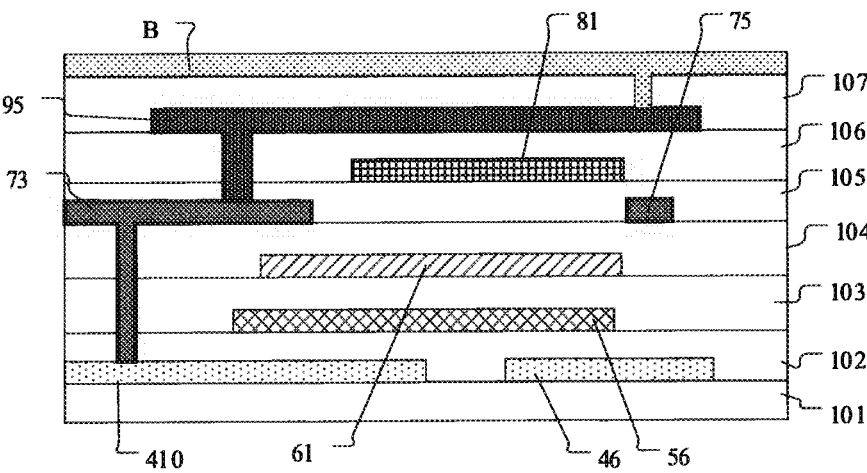
FIG. 72 is a partial cross-sectional view of the display panel shown in FIG. 59 taken along the dotted line DD.

As shown in FIG. 72, it is a partial cross-sectional view of the display panel shown in FIG. 59 taken along the dotted line DD. The display panel may further include a first insulating layer 102, a second insulating layer 103, a first dielectric layer 104, a passivation layer 105, a second dielectric layer 106, and a planarization layer 107. The substrate 101, the active layer, the first insulating layer 102, the first conductive layer, the second insulating layer 103, the second conductive layer, the first dielectric layer 104, the third conductive layer, the passivation layer 105, the fourth conductive layer, the second dielectric layer 106, the fifth conductive layer, the planarization layer 107, and the electrode layer are stacked in sequence. The first insulating layer 102 and the second insulating layer 103 may have a single-layer structure or a multi-layer structure. The material of the first insulating layer 102 and the second insulating layer 103 may be at least one of silicon nitride, silicon oxide, and silicon oxynitride. The first dielectric layer 104 and the second dielectric layer 106 can be silicon nitride layers. The material of the planarization layer 107 can be an organic material, such as polyimide (PI), polyethylene terephthalate ester (PET), polyethylene naphthalate (PEN), silicon on glass (SOG) and other materials. The material of the passivation layer 105 may be silicon oxide. The substrate 101 may include a glass substrate, a barrier layer, and a polyimide layer that are stacked in sequence. The barrier layer may be an inorganic material. The material of the first conductive layer and the second conductive layer may be an alloy or one of molybdenum, aluminum, copper, titanium, and niobium, or a molybdenum/titanium alloy or laminate. The material of the third conductive layer and the fifth conductive layer may include a metal material. For example, it may be an alloy or one of molybdenum, aluminum, copper, titanium, and niobium, or a molybdenum/titanium alloy or laminate, or it may be titanium/aluminum/titanium laminate. The electrode layer may include an indium tin oxide layer and a silver layer. The sheet resistance of any one of the first conductive layer and the second conductive layer may be greater than the sheet resistance of any one of the fourth conductive layer and the third conductive layer.

Figure 73:
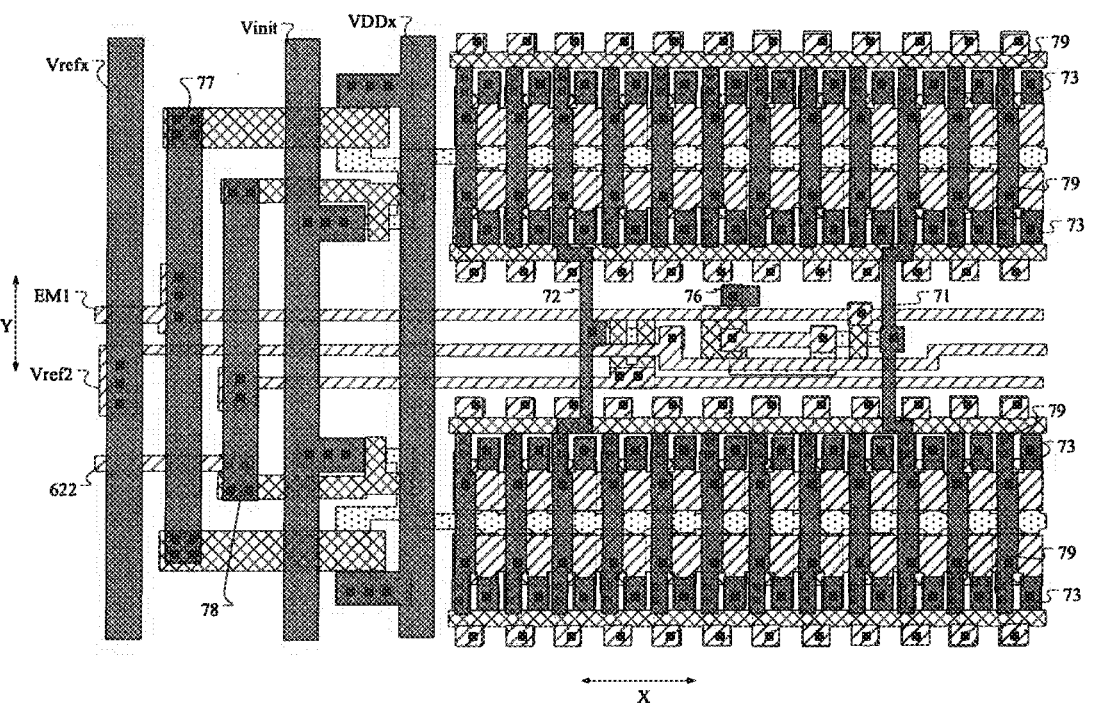
FIG. 73 is a structural layout of in another exemplary embodiment of the display panel of the present disclosure.
Figure 74:
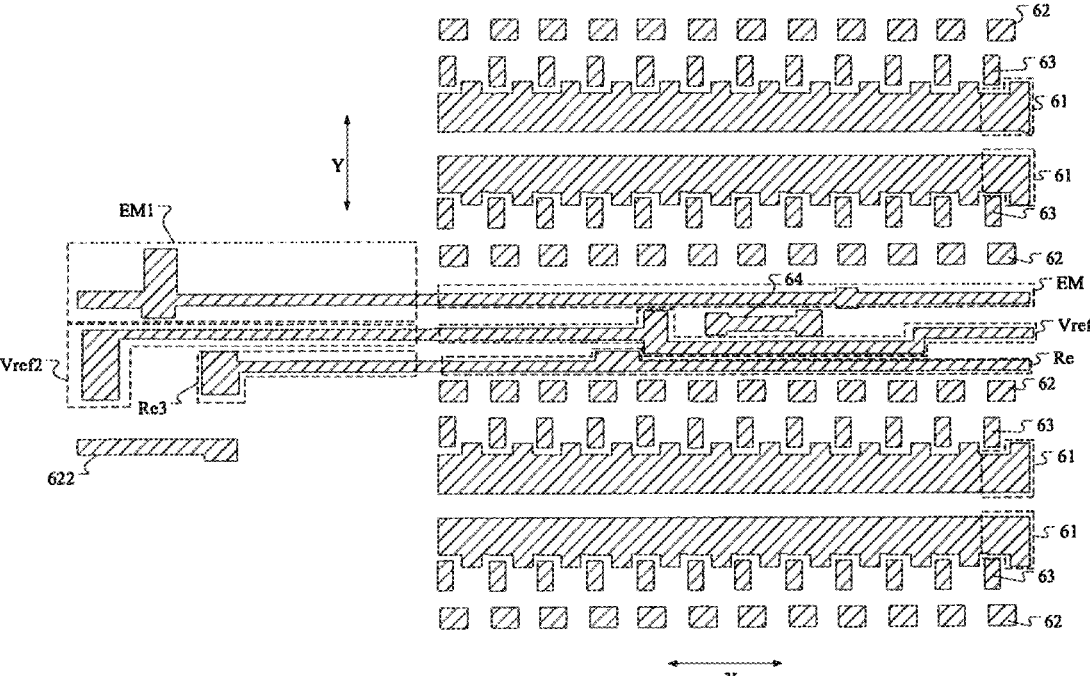
FIG. 74 is a structural layout of the second conductive layer in FIG. 73.
Figure 75:
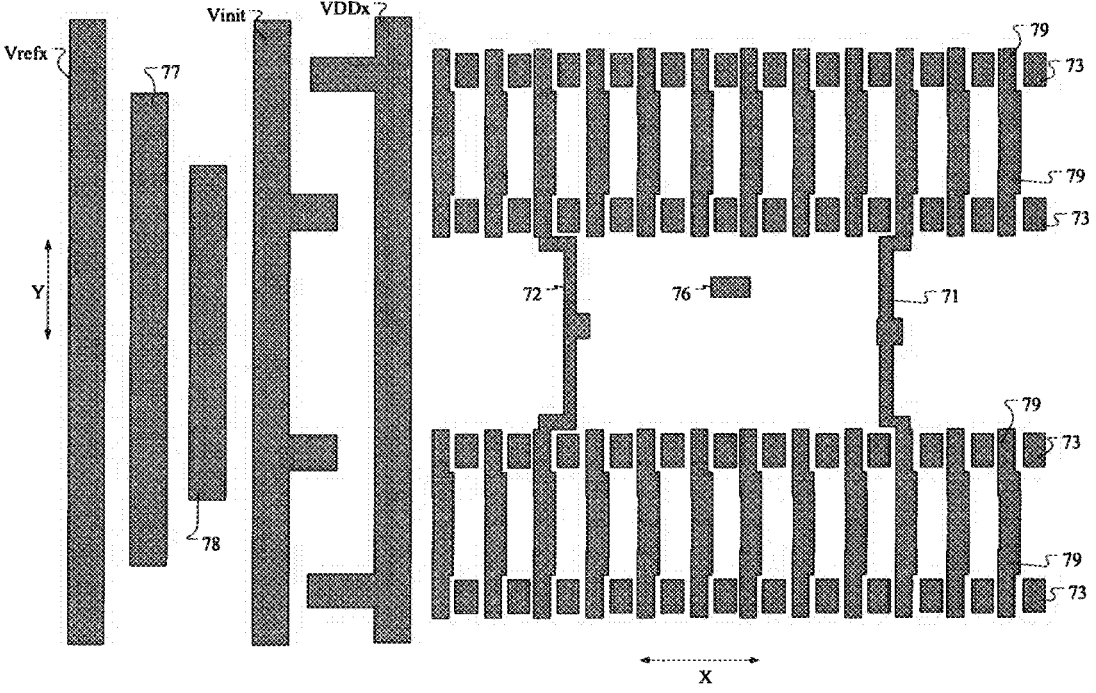
FIG. 75 is a structural layout of the third conductive layer in FIG. 73.

This exemplary embodiment also provides another display panel, as shown in FIGS. 73 to 75. FIG. 73 is a structural layout in another exemplary embodiment of the display panel of the present disclosure. FIG. 74 is a structural layout of the second conductive layer in FIG. 73. FIG. 75 is a structural layout of the third conductive layer in FIG. 73.

The difference between the display panel provided by this exemplary embodiment and the display panel shown in FIG. 59 only lies in the second conductive layer and the third conductive layer. As shown in FIGS. 73 to 75, in this exemplary embodiment, in the same driving sub-unit, the first conductive parts 61 located in different rows are not connected. The third conductive layer is not provided with the first conductive line 75, and in the same driving sub-unit, the seventh conductive parts 79 adjacent in the column direction are connected.

It should be noted that in each of the above exemplary embodiments, the black square drawn on the side of the second conductive layer facing away from the substrate represents the via hole through which the second conductive layer is connected to other layers on the side facing the substrate. The black square on the side of the third conductive layer facing away from the substrate represents the via hole through which the third conductive layer is connected to other layers on the side facing the substrate. The black square drawn on the side of the fourth conductive layer facing away from the substrate represents the via hole through which the fourth conductive layer is connected to other layers on the side facing the substrate. The black square drawn on the side of the fifth conductive layer facing away from the substrate represents the via hole through which the fifth conductive layer is connected to other levels on the side facing the substrate. The black square drawn on the side of the electrode layer facing away from the substrate represents the via hole through which the electrode layer is connected to other layers on the side facing the substrate. The black square only represents the location of the via hole. Different via holes represented by black squares at different positions can penetrate different insulation layers.

The proportions of the drawings in this disclosure can be used as a reference in the actual process, but are not limited thereto. For example, the width-to-length ratio of the channel, the thickness and spacing of each film layer, and the width and spacing of each signal line can be adjusted according to actual needs. The number of pixels in the display substrate and the number of sub-pixels in each pixel are not limited to the numbers shown in the figures. The figures described in this disclosure are only structural schematic diagrams. In addition, first, second and other qualifiers are only used to define different structure names and have no specific order meaning. In this exemplary embodiment, the orthographic projection of a certain structure on the substrate extends along a certain direction, which can be understood as the orthographic projection of the structure on the substrate extending straightly or in a bend along the direction. A transistor is a component that includes at least three terminals: a gate, a drain, and a source. A transistor has a channel region between a drain (drain electrode terminal, drain region, or drain electrode) and a source (source electrode terminal, source region, or source electrode), and current can flow through the drain, channel region, and source. In this exemplary embodiment, the channel region refers to a region through which current mainly flows. In this exemplary embodiment, the first electrode may be a drain electrode and the second electrode may be a source electrode, or the first electrode may be a source electrode and the second electrode may be a drain electrode. When transistors with opposite polarities are used or when the direction of current changes during circuit operation, the functions of "source" and "drain" may be interchanged. Therefore, in this exemplary embodiment, "source" and "drain" may be interchanged with each other. In addition, the gate can also be called the control electrode.

This exemplary embodiment also provides a display device, which includes the above-mentioned display panel. The display device can be a display device such as a mobile phone, a tablet computer, or a television.

Other embodiments of the disclosure will be readily apparent to those skilled in the art from consideration of the specification and practice of the disclosure herein. This application is intended to cover any variations, uses, or adaptations of the disclosure that follow the general principles of the disclosure and include common knowledge or customary technical means in the technical field that are not disclosed in the disclosure. It is intended that the specification and examples be considered as exemplary only, with a true scope and spirit of the disclosure being indicated by the following claims.

The drawings in the present disclosure only refer to the structures involved in the present disclosure, and other structures may refer to common designs. If there is no conflict, the embodiments of the present disclosure and the features in the embodiments may be combined with each other to obtain new embodiments. Those of ordinary skill in the art should understand that the technical solutions of the present disclosure can be modified or equivalently substituted without departing from the spirit and scope of the technical solutions of the present disclosure, and all should be covered by the scope of the claims of the present disclosure.

It is to be understood that the present disclosure is not limited to the precise structures described above and illustrated in the accompanying drawings, and various modifications and changes may be made without departing from the scope thereof. The scope of the disclosure is limited only by the appended claims.

What is claimed is:

1. A display panel, wherein the display panel comprises:
a substrate; and
a plurality of driving units located on one side of the substrate, wherein orthographic projections of the plurality of driving units on the substrate are arrayed along row and column directions, and the driving unit comprises:
n rows and m columns of pixel driving circuits, n and m are both positive integers greater than or equal to 1, and n+m is greater than or equal to 3; and
a compensation circuit, wherein the compensation circuit is connected to a plurality of pixel driving circuits located in a same driving unit, and the compensation circuit is configured to provide threshold compensation signals to the pixel driving circuits connected to the compensation circuit,
wherein the driving unit comprises a first driving sub-unit and a second driving sub-unit, and an orthographic projection of the first driving sub-unit on the substrate and an orthographic projection of the second driving sub-unit on the substrate are spaced apart in the column direction;
the first driving sub-unit comprises n1 rows and m columns of pixel driving circuits, and the second driving sub-unit comprises n2 rows and m columns of pixel driving circuits, wherein n1 and n2 are positive integers greater than or equal to 1, and n1+n2=n; and
an orthographic projection of at least part of a structure of the compensation circuit on the substrate is located between the orthographic projection of the first driving sub-unit on the substrate and the orthographic projection of the second driving sub-unit on the substrate.

2. The display panel according to claim 1, wherein the pixel driving circuit comprises:
a driving circuit comprising a first input terminal, a first output terminal, and a first control terminal, and configured to use the first input terminal to provide a driving current to the first output terminal according to a voltage of the first control terminal;
a data writing circuit connected to the first control terminal, a data line, and a gate line, and configured to transmit a signal on the data line to the first control terminal in response to a signal of the gate line; and
a first storage circuit, connected between the first control terminal and a first node, and configured to store a voltage difference between the first control terminal and the first node;
wherein the compensation circuit comprises:
an analog circuit having a same or substantially same threshold voltage as the driving circuit, wherein the analog circuit comprises a second input terminal, a second output terminal, and a second control terminal, and the analog circuit is configured to use the second input terminal to provide a driving current to the second output terminal according to a voltage of the second control terminal, the second input terminal is connected to a power line, and the second output terminal is connected to the second control terminal;
a compensation control circuit connected to the first node, the second output terminal, and an enable signal line, and configured to connect the first node and the second output terminal in response to a signal of the enable signal line; and
a first reset circuit connected to the first node, a reference signal line, and a reset signal line, and configured to transmit a signal of the reference signal line to the first node in response to a signal of the reset signal line.

3. The display panel according to claim 2, wherein the driving unit comprises the first driving sub-unit and the second driving sub-unit; and
orthographic projections of the analog circuit, the compensation control circuit, and the first reset circuit on the substrate are located between the orthographic projection of the first driving sub-unit on the substrate and the orthographic projection of the second driving sub-unit on the substrate.

4. The display panel according to claim 2, wherein the compensation circuit further comprises:
a second storage circuit connected between the power line and the first node, and configured to store a voltage difference between the power line and the first node.

5. The display panel according to claim 2, wherein the display panel further comprises:
a light-emitting control circuit, connected to the power line, the first input terminal, and the enable signal line, and configured to transmit a signal of the power line to the first input terminal in response to a signal of the enable signal line; and
a second reset circuit connected to the first input terminal, an initial signal line, and the reset signal line, and configured to transmit a signal of the initial signal line to the first input terminal in response to the signal of the reset signal line.

6. The display panel according to claim 5, wherein the light-emitting control circuit and the second reset circuit form an auxiliary driving circuit, and pixel driving circuits located in a same row share one or more sets of the auxiliary driving circuits.

7. The display panel according to claim 6, wherein the pixel driving circuits located in the same row share two sets of the auxiliary driving circuits, and the pixel driving circuits located in the same row form a row of pixel driving circuits, and orthographic projections of the two sets of the auxiliary driving circuits on the substrate are respectively located on both sides of an orthographic projection of the row of the pixel driving circuits on the substrate in the row direction, wherein the row of the pixel driving circuits are connected to the two sets of the auxiliary driving circuits.

8. The display panel according to claim 5, wherein the driving circuit comprises:
a driving transistor comprising a first electrode forming the first input terminal, a second electrode forming the first output terminal, and a gate electrode forming the first control terminal;
wherein the data writing circuit comprises:
a first transistor comprising a first electrode connected to the data line, a second electrode connected to the first control terminal, and a gate electrode connected to the gate line;
wherein the first storage circuit comprises:
a first capacitor comprising a first electrode connected to the first control terminal, and a second electrode connected to the first node;
wherein the analog circuit comprises:
an analog transistor, wherein the analog transistor and the driving transistor have a same or substantially same threshold voltage, a first electrode of the analog transistor forms the second input terminal, a second electrode forms the second output terminal, and a gate electrode forms the second control terminal;

wherein the compensation control circuit comprises:

a second transistor comprising a first electrode connected to the second output terminal, a second electrode connected to the first node, and a gate electrode connected to the enable signal line;

wherein the first reset circuit comprises:

a third transistor comprising a first electrode connected to the reference signal line, a second electrode connected to the first node, and a gate electrode connected to the reset signal line;

wherein the light-emitting control circuit comprises:

a fourth transistor comprising a first electrode connected to the power line, a second electrode connected to the first input terminal, and a gate electrode connected to the enable signal line;

wherein the second reset circuit comprises:

a fifth transistor comprising a first electrode connected to the initial signal line, a second electrode connected to the first input terminal, and a gate electrode connected to the reset signal line.

9. The display panel according to claim 6, wherein the driving circuit comprises:

a driving transistor comprising a first electrode forming the first input terminal, a second electrode forming the first output terminal, and a gate electrode forming the first control terminal;

wherein the light-emitting control circuit comprises:

a fourth transistor comprising a first electrode connected to the power line, a second electrode connected to the first input terminal, and a gate electrode connected to the enable signal line;

wherein the second reset circuit comprises:

a fifth transistor comprising a first electrode connected to the initial signal line, a second electrode connected to the first input terminal, and a gate electrode connected to the reset signal line;

wherein the display panel further comprises:

an active layer located on one side of the substrate, wherein the active layer comprises a fourth active part, a fifth active part, a sixth active part, and an active line;

wherein, the fourth active part is configured to form a channel region of the fourth transistor, the fifth active part is configured to form a channel region of the fifth transistor, and the sixth active part is configured to form a channel region of the driving transistor;

wherein, an orthographic projection of the active line on the substrate extends along the row direction, the active line is connected to the first electrode of the driving transistor, sixth active parts located in a same row of the pixel driving circuits are connected to a same active line, and the fifth active part and the sixth active part are connected to a same terminal of the active line in the row direction.

10. The display panel according to claim 9, wherein the driving unit comprises the first driving sub-unit, and the orthographic projection of the first driving sub-unit on the substrate is located on one side of an orthographic projection of the auxiliary driving circuit on the substrate in the column direction, the first driving sub-unit comprises adjacent two rows and m columns of pixel driving circuits; and in a same row of the first driving sub-units, the sixth active parts in the driving circuit are connected to the same active line.

11. The display panel according to claim 2, wherein the driving circuit comprises:

a driving transistor comprising a first electrode forming the first input terminal, a second electrode forming the first output terminal, and a gate electrode forming the first control terminal;

wherein the first storage circuit comprises:

a first capacitor comprising a first electrode connected to the first control terminal, and a second electrode connected to the first node;

wherein the display panel further comprises:

a first conductive layer located on one side of the substrate, wherein the first conductive layer comprises a sixth gate part, at least part of a structure of the sixth gate part is configured to form the gate electrode of the driving transistor and the first electrode of the first capacitor;

a second conductive layer located on one side of the first conductive layer facing away from the substrate, wherein the second conductive layer comprises a first conductive part, an orthographic projection of the first conductive part on the substrate at least partially overlaps with an orthographic projection of the sixth gate part on the substrate, and the first conductive part is configured to form the second electrode of the first capacitor;

wherein m is a positive integer greater than or equal to 2, and in the same driving unit, the first conductive parts in a same row of the pixel driving circuits are connected.

12. The display panel according to claim 11, wherein the compensation control circuit comprises:

a second transistor comprising a first electrode connected to the second output terminal, a second electrode connected to the first node, and a gate electrode connected to the enable signal line;

wherein the first reset circuit comprises:

a third transistor comprising a first electrode connected to the reference signal line, a second electrode connected to the first node, and a gate electrode connected to the reset signal line;

wherein the driving unit comprises the first driving sub-unit and the second driving sub-unit, the orthographic projection of the first driving sub-unit on the substrate and the orthographic projection of the second driving sub-unit on the substrate are distributed in the column direction;

wherein the first driving sub-unit comprises n1 rows and m columns of pixel driving circuits, and the second driving sub-unit comprises n2 rows and m columns of pixel driving circuits, wherein n1 and n2 are positive integers greater than or equal to 1, and n1+n2=n; and orthographic projections of the analog circuit, the compensation control circuit, and the first reset circuit on the substrate are located between the orthographic projection of the first driving sub-unit on the substrate and the orthographic projection of the second driving sub-unit on the substrate;

wherein the display panel further comprises:

a first bridge part, wherein an orthographic projection of the first bridge part on the substrate extends along the column direction, the first bridge part is connected to the second electrode of the second transistor, and the connection is respectively located on the first conductive part in the second driving sub-unit and the first driving sub-unit; and a second bridge part, wherein an orthographic projection of the second bridge part on the substrate extends along the column direction, the second bridge part is connected to the second electrode of the third transistor, and the connection is respectively located on the first conductive part in the second driving sub-unit and the first driving sub-unit;

wherein the first bridge part and the second bridge part are connected to different first conductive parts.

13. The display panel according to claim 11, wherein the display panel further comprises:

a fourth conductive layer located on one side of the second conductive layer facing away from the substrate, wherein the fourth conductive layer comprises a second shielding line, the second shielding line is connected to a stable power terminal, an orthographic projection of the second shielding line on the substrate extends along the column direction, and the second shielding line comprises a first extending part; and a fifth conductive layer located on one side of the fourth conductive layer facing away from the substrate, and comprising the data line;

wherein an overlapping part of an orthographic projection of the sixth gate part on the substrate and an orthographic projection of the data line on the substrate at least partially overlaps with an orthographic projection of the first extending part on the substrate, and/or an overlapping part of the orthographic projection of the first conductive part on the substrate and the orthographic projection of the data line on the substrate at least partially overlaps with the orthographic projection of the first extending part on the substrate.

14. The display panel according to claim 13, wherein the second shielding line further comprises a second extending part, and an orthographic projection of the second extending part on the substrate is located between orthographic projections of adjacent two data lines on the substrate.

15. The display panel according to claim 12, wherein the compensation circuit further comprises a second capacitor, a first electrode of the second capacitor is connected to the power line, and a second electrode of the second capacitor is connected to the first node;

wherein the display panel further comprises:

a third conductive layer located on one side of the second conductive layer facing away from the substrate, and comprising the first bridge part and the second bridge part; and a fourth conductive layer located on one side of the third conductive layer facing away from the substrate, and comprising a plurality of second shielding lines, wherein the second shielding line is connected to the power line, and the second shielding line comprises a second extending part;

wherein an orthographic projection of the first bridge part on the substrate overlaps with an orthographic projection of one second extending part on the substrate, and an orthographic projection of the second bridge part on the substrate overlaps with an orthographic projection of another second extending part on the substrate; and the first bridge part and the second bridge part are configured to form the second electrode of the second capacitor, and the second extending part is configured to form the first electrode of the second capacitor.

16. The display panel of claim 11, wherein the display panel further comprises:

a third conductive layer located on one side of the second conductive layer facing away from the substrate, wherein the third conductive layer comprises a power connection line segment, the power connection line segment is connected to the power line, and an orthographic projection of the power connection line segment on the substrate extends along the column direction; and a fifth conductive layer located on one side of the third conductive layer facing away from the substrate, and comprising the data line;

wherein an overlapping part of an orthographic projection of the sixth gate part on the substrate and an orthographic projection of the data line on the substrate at least partially overlaps with an orthographic projection of the power connection line segment on the substrate, and/or an overlapping part of the orthographic projection of the first conductive part on the substrate and the orthographic projection of the data line on the substrate at least partially overlaps with the orthographic projection of the power connection line segment on the substrate.

17. The display panel according to claim 2, wherein the display panel further comprises a light-emitting unit, the pixel driving circuit is configured to drive the light-emitting unit to emit light, and the display panel further comprises:

a fifth conductive layer located on one side of the substrate, and comprising the data line;

an electrode layer located on one side of the fifth conductive layer facing away from the substrate, and comprising a plurality of electrode parts, wherein the electrode part is configured to form a first electrode of the light-emitting unit; and a pixel definition layer with a plurality of pixel openings formed on the pixel definition layer, wherein the pixel openings are configured to form the light-emitting unit, an orthographic projection of the pixel opening on the substrate coincides with an orthographic projection of a corresponding electrode part on the substrate;

wherein, the orthographic projection of the electrode part on the substrate is located between orthographic projections of adjacent data lines on the substrate.

18. The display panel of claim 9, wherein the display panel further comprises:

a first conductive line, wherein an orthographic projection of the first conductive line on the substrate extends along the row direction, and the first conductive line connects to the active line through a plurality of via holes distributed in the row direction.

19. The display panel according to claim 11, wherein the compensation circuit further comprises:

a second capacitor comprising a first electrode connected to the power line, and a second electrode connected to the first node;

wherein the display panel further comprises:

a third conductive layer located on one side of the second conductive layer facing away from the substrate, and comprising a seventh conductive part, wherein the seventh conductive part is connected to the first conductive part, and the seventh conductive part is configured to form the second electrode of the second capacitor;

a fourth conductive layer located on one side of the third conductive layer facing away from the substrate, and comprising a second shielding line, wherein the second shielding line is connected to the power line, an orthographic projection of the second shielding line on the substrate at least partially overlaps with an orthographic projection of the seventh conductive part on the substrate, and part of a structure of the second shielding line is configured to form the first electrode of the second capacitor.

\*　　\*　　\*　　\*　　\*